(12) United States Patent
Futase et al.

(10) Patent No.: US 7,700,448 B2
(45) Date of Patent: Apr. 20, 2010

(54) MANUFACTURING METHOD OF SEMICONDUCTOR DEVICE

(75) Inventors: Takuya Futase, Tokyo (JP); Keiichiro Kashihara, Tokyo (JP); Shigenari Okada, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 48 days.

(21) Appl. No.: 12/014,136

(22) Filed: Jan. 15, 2008

(65) Prior Publication Data
US 2008/0242035 A1 Oct. 2, 2008

(30) Foreign Application Priority Data
Mar. 27, 2007 (JP) ............... 2007-081147

(51) Int. Cl.
*H01L 21/00* (2006.01)
(52) U.S. Cl. .................. 438/296; 438/299; 438/199
(58) Field of Classification Search ............. 438/296, 438/299, 199
See application file for complete search history.

(56) References Cited

U.S. PATENT DOCUMENTS

| | | | | |
|---|---|---|---|---|
| 6,100,182 A * | 8/2000 | Lee et al. | .................. | 438/637 |
| 6,107,190 A * | 8/2000 | Taguwa et al. | .................. | 438/637 |
| 6,673,685 B2 * | 1/2004 | Mori et al. | .................. | 438/302 |
| 7,173,312 B2 * | 2/2007 | Cabral et al. | .................. | 257/369 |
| 7,314,789 B2 * | 1/2008 | Cabral et al. | .................. | 438/197 |
| 7,381,602 B2 * | 6/2008 | Hohage et al. | .................. | 438/197 |
| 2002/0111018 A1 * | 8/2002 | Tai | .................. | 438/655 |
| 2005/0067661 A1 | 3/2005 | Choi | | |
| 2006/0076652 A1 * | 4/2006 | Hohage et al. | .................. | 257/629 |
| 2006/0124974 A1 * | 6/2006 | Cabral et al. | .................. | 257/274 |
| 2006/0163671 A1 * | 7/2006 | Gulari et al. | .................. | 257/388 |
| 2006/0278952 A1 * | 12/2006 | Mori et al. | .................. | 257/510 |
| 2007/0111421 A1 * | 5/2007 | Cabral et al. | .................. | 438/199 |
| 2007/0163617 A1 * | 7/2007 | Ozaki et al. | .................. | 134/1.1 |
| 2008/0020535 A1 * | 1/2008 | Gulari et al. | .................. | 438/299 |
| 2008/0242035 A1 * | 10/2008 | Futase et al. | .................. | 438/296 |
| 2008/0293195 A1 * | 11/2008 | Krivokapic | .................. | 438/199 |
| 2009/0011566 A1 * | 1/2009 | Okada et al. | .................. | 438/308 |

FOREIGN PATENT DOCUMENTS

| | | |
|---|---|---|
| JP | 2003-119564 A | 4/2003 |
| JP | 2005-109504 A | 4/2005 |
| JP | 2006-294861 A | 10/2006 |

* cited by examiner

*Primary Examiner*—Laura M Menz
(74) *Attorney, Agent, or Firm*—Miles & Stockbridge P.C.

(57) ABSTRACT

The performance of the semiconductor device which formed the metal silicide layer in the salicide process is improved. An element isolation region is formed in a semiconductor substrate by the STI method, a gate insulating film is formed, a gate electrode is formed, $n^+$ type semiconductor region and $p^+$ type semiconductor region for source/drains are formed, a metallic film is formed on a semiconductor substrate, and a barrier film is formed on a metallic film. And after forming the metal silicide layer to which a metallic film, and a gate electrode, $n^+$ type semiconductor region and $p^+$ type semiconductor region are made to react by performing first heat treatment, a barrier film, and an unreacted metallic film are removed, and the metal silicide layer is left. An element isolation region makes compressive stress act on a semiconductor substrate. A barrier film is a film which makes a semiconductor substrate generate tensile stress, and the metal silicide layer which consists of mono-silicide MSi of metallic element M which forms a metallic film is formed in the first heat treatment.

17 Claims, 27 Drawing Sheets

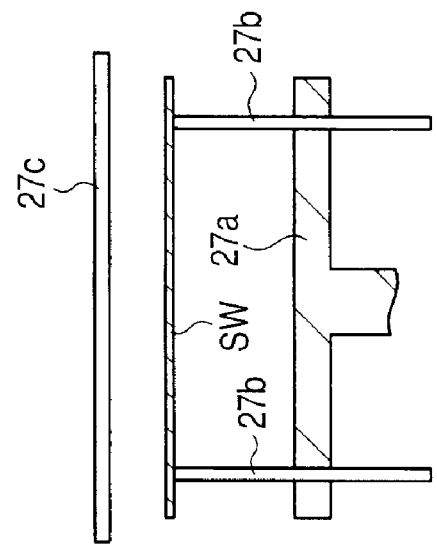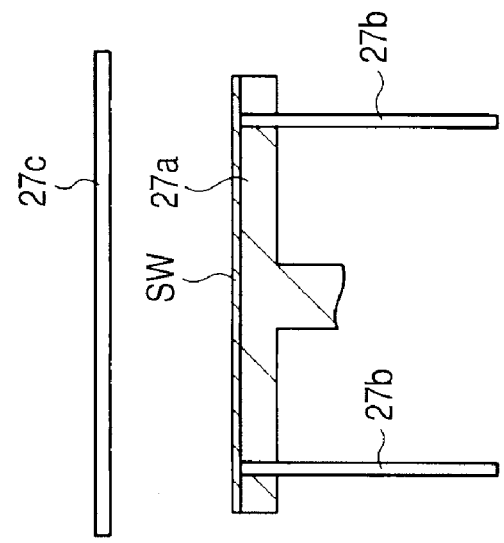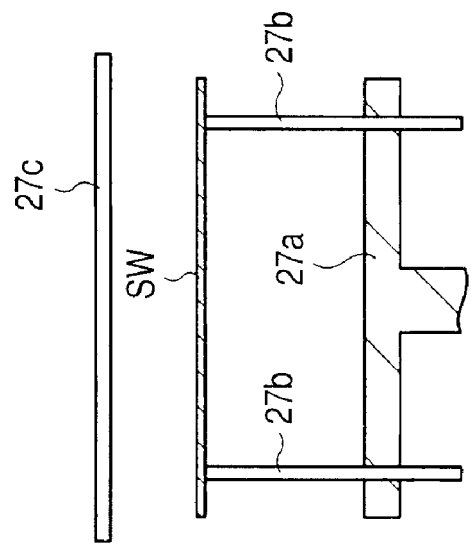

US 7,700,448 B2

MANUFACTURING METHOD OF SEMICONDUCTOR DEVICE

CROSS-REFERENCE TO RELATED APPLICATION

The present application claims priority from Japanese patent application No. 2007-81147 filed on Mar. 27, 2007, the content of which is hereby incorporated by reference into this application.

FIELD OF THE INVENTION

The present invention relates to a manufacturing method of a semiconductor device, and particularly relates to an effective technology in the application to manufacture of the semiconductor element which has a metal silicide layer.

DESCRIPTION OF THE BACKGROUND ART

According to a scaling rule, microfabrication of the field-effect transistor (MISFET:Metal Insulator Semiconductor Field Effect Transistor) is done as high integration of a semiconductor device progresses. However, resistance of a gate or a source/drain increases and the problem that high-speed operation is not obtained even if microfabrication of the field-effect transistor is done happens. Then, the salicide technology which reduces resistance of a gate and a source/drain by forming the metal silicide layer of low resistance, for example a nickel silicide layer or a cobalt silicide layer on the front surface of the electric conduction film which forms a gate, and the semiconductor region which forms a source/drain, by self align is examined.

In Japanese patent laid-open No. 2005-109504 (Patent Reference 1), the technology regarding the manufacturing method of a semiconductor element including the stage which forms a metal layer on a gate electrode and a source/drain region, the stage of performing the surface treatment of the metal layer using Ar plasma, and the stage which does annealing treatment of the silicon substrate in which the metal layer was formed at a predetermined temperature, and forms a silicide thin film is described.

In Japanese patent laid-open No. 2006-294861 (Patent Reference 2), the technology regarding the method of forming a metal inclusion film on Si inclusion part front surface of providing the physical-surface-treatment step which processes the front surface of Si inclusion portion physically by the plasma using high frequency, the chemical cleaning step which processes chemically the front surface of Si inclusion portion where processing by plasma was performed with reactive gas, and the film formation step which forms a metal inclusion film on Si inclusion portion to which chemical cleaning was performed is described.

In Japanese patent laid-open No. 2003-119564 (Patent Reference 3), the technology which forms continuously a film including a high melting point metal on the Si substrate from which the natural-oxidation film was removed within the same chamber that had etching and film formation optimized after removal of the natural-oxidation film which is on the surface of a Si substrate within the chamber of a plasma CVD device without exposing the Si substrate from which this natural-oxidation film was removed to the atmosphere is described.

[Patent Reference 1] Japanese patent laid-open No. 2005-109504

[Patent Reference 2] Japanese patent laid-open No. 2006-294861

[Patent Reference 3] Japanese patent laid-open No. 2003-119564

SUMMARY OF THE INVENTION

According to the analyses of the present inventor, the following thing was understood.

As for the metal silicide layer formed in the front surface of the electric conduction film which forms a gate, and the semiconductor region which forms a source/drain according to a salicide process, consisting of nickel silicide is more preferred than cobalt silicide from the request of the resistance reduction by microfabrication. By making a metal silicide layer into the nickel silicide instead of cobalt silicide, resistance of a metal silicide layer can be made lower and the diffusion resistance of a source/drain, contact resistance, etc. can be reduced more. Since a metal silicide layer can be formed thinly and the junction depth of a source/drain can be made shallow by making a metal silicide layer into the nickel silicide instead of cobalt silicide, it becomes advantageous to the microfabrication of a field-effect transistor.

In the case where the metal silicide layer formed in a salicide process is cobalt silicide, since the side of $CoSi_2$ phase is lower resistance than CoSi phase, it is necessary to form the metal silicide which consists of $CoSi_2$ in the front surface of the electric conduction film which forms a gate, and the semiconductor region which forms a source/drain. To it, in the case where the metal silicide layer formed in a salicide process is nickel silicide, since the side of NiSi phase is lower resistance than $NiSi_2$ phase, it is necessary to form the metal silicide which consists of NiSi in the front surface of the electric conduction film which forms a gate, and the semiconductor region which forms a source/drain.

In cobalt silicide formation, Si (silicon) is a diffusion seed, and cobalt silicide is formed when Si moves in Co film. On the other hand, in nickel silicide formation, Ni (nickel) is a diffusion seed, and nickel silicide is formed when Ni (nickel) moves to the silicon region side. For this reason, unnecessary NiSi2 portion is formed by Ni (nickel) diffusing superfluously in a salicide process, and the electric resistance of a metal silicide layer may vary for every field-effect transistor. For the further improvement in performance of a field-effect transistor, to reduce the variation in the electric resistance of the metal silicide layer for every field-effect transistor, and to prevent change of the characteristics of a field-effect transistor is desired.

A field-effect transistor is formed in the active region specified (surrounded) by the element isolation formed in the main surface of a semiconductor substrate. When element isolation is formed by the LOCOS method, element isolation does not give compressive stress to an active region. However, when element isolation is formed by the STI method, the compressive stress that the side wall of the trench for element isolation formed in the semiconductor substrate pushes the active region side acts. Therefore, it will be in the state where compressive stress is working to the active region of the semiconductor substrate by element isolation. A field-effect transistor tends to be formed in the active region where the compressive stress by element isolation has generated, and a NiSi layer is going to be formed in a salicide process on the semiconductor region which forms the source/drain. Then, analyses of the present inventor showed compressive stress promoting the anomalous diffusion of Ni and becoming easy to generate the abnormal growth of $NiSi_2$ from a NiSi layer to a channel section. The abnormal growth of $NiSi_2$ from this NiSi layer to a channel section is the problem that does not generate when element isolation is formed by the LOCOS method, but is first generated when making compressive stress act on the active region around which element isolation is formed by the STI method. When $NiSi_2$ is doing abnormal growth to the channel section from the NiSi layer, increase of the leakage current between the source/drains of a field-effect transistor will be caused, or increase of the diffusion resistance of a source/drain region will be caused. Therefore, for the further improvement in performance of a field-effect transistor, to prevent such abnormal growth of $NiSi_2$ from a NiSi layer to a channel section is desired.

The purpose of the present invention is to offer the technology which can improve the performance of a semiconductor device.

The above-described and the other purposes and novel features of the present invention will become apparent from the description herein and accompanying drawings.

Of the inventions disclosed in the present application, typical ones will next be summarized briefly.

The present invention forms in a semiconductor substrate the element isolation region which includes an insulator embedded in the trench. A gate insulating film, a gate electrode, and the semiconductor region for a source or drains are formed in the active region specified in the element isolation region. And a metallic film is formed over the semiconductor substrate, and the first barrier film which makes the semiconductor substrate generate tensile stress is formed over the metallic film. And heat-treatment is performed, and the metallic film, and the gate electrode or the semiconductor region is made to react. The metal silicide layer which includes mono-silicide MSi of metallic element M which forms the metallic film is formed. And the first barrier film and the metallic film are removed, and the metal silicide layer is left over the gate electrode or the semiconductor region.

The present invention forms in a semiconductor substrate the element isolation region which includes an insulator embedded in the trench. A gate insulating film, a gate electrode, and the semiconductor region for a source or drains are formed in the active region specified in the element isolation region. And a metallic film is formed over the semiconductor substrate. The first barrier film which makes the semiconductor substrate generate tensile stress is formed over the metallic film. And the metal silicide layer is formed by making to react the metallic film, and the gate electrode or the semiconductor region by performing first heat treatment. And the first barrier film and the metallic film are removed. Over the semiconductor substrate including the metal silicide layer upper part, the second barrier film which makes the semiconductor substrate generate tensile stress is formed. And second heat treatment whose heat treatment temperature is higher than the first heat treatment is performed. The metal silicide layer includes mono-silicide MSi of metallic element M which forms the metallic film in the stage which performed this second heat treatment. Then, the second barrier film is removed.

Advantages achieved by some of the most typical aspects of the invention disclosed in the present application will be briefly described below.

The performance of a semiconductor device can be improved.

BRIEF DESCRIPTION OF THE DRAWINGS

FIGS. 13A to 13C are the outline cross-sectional views of the chamber for explaining the processing step of the semiconductor wafer in the chamber for dry-cleaning processing with which the film formation apparatus of the silicide material by Embodiment 1 of the present invention is equipped, respectively;

DETAILED DESCRIPTION OF THE PREFERRED EMBODIMENTS

Figure 1:
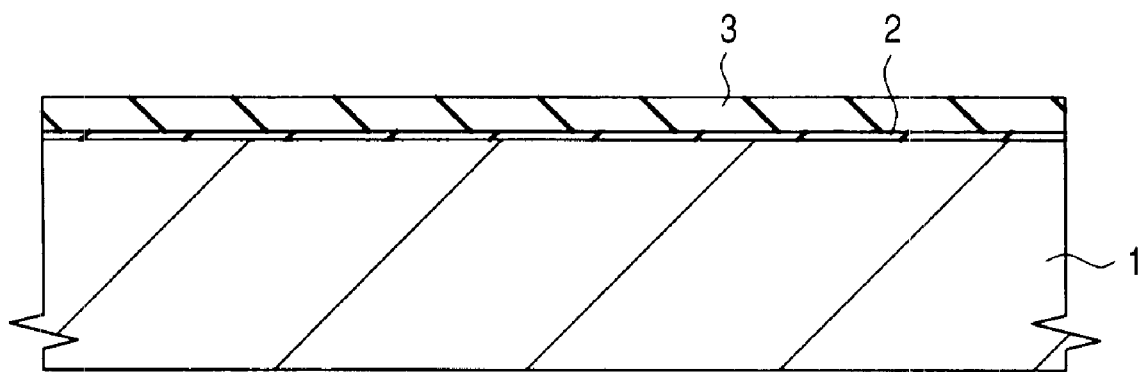
FIG. 1 is a principal part cross-sectional view in the manufacturing process of the semiconductor device which is the 1 embodiment of the present invention.

In the below-described embodiments, a description will be made after divided into plural sections or in plural embodiments if necessary for convenience sake. These plural sections or embodiments are not independent each other, but in relation such that one is a modification example, details or complementary description of a part or whole of the other one unless otherwise specifically indicated. And, in the below-described embodiments, when a reference is made to the number of elements (including the number, value, amount and range), the number is not limited to a specific number but may be equal to or greater than or less than the specific number, unless otherwise specifically indicated or principally apparent that the number is limited to the specific number. Further, in the below-described embodiments, it is needless to say that the constituting elements (including element steps) are not always essential unless otherwise specifically indicated or principally apparent that they are essential. Similarly, in the below-described embodiments, when a reference is made to the shape or positional relationship of the constituting elements, that substantially analogous or similar to it is also embraced unless otherwise specifically indicated or principally apparent that it is not. This also applies to the above-described value and range.

Hereafter, embodiments of the invention are explained in detail based on drawings. In all the drawings for describing the embodiments, members of a like function will be identified by like reference numerals and overlapping descriptions will be omitted. In the following embodiments, except the time when especially required, explanation of identical or similar part is not repeated in principle.

In the drawing used by an embodiment, even if it is a cross-sectional view, in order to make a drawing legible, hatching may be omitted. Hatching may be attached in order to make a drawing legible, even if it is a plan view.

Embodiment 1

The manufacturing process of the semiconductor device of this embodiment is explained with reference to drawings. FIG. 1-FIG. 8 are the principal part cross-sectional views in the manufacturing process of the semiconductor device which is the 1 embodiment of the present invention. For example, they are principal part cross-sectional views in the manufacturing process of the semiconductor device which has CMISFET (Complementary Metal Insulator Semiconductor Field Effect Transistor).

Figure 2:
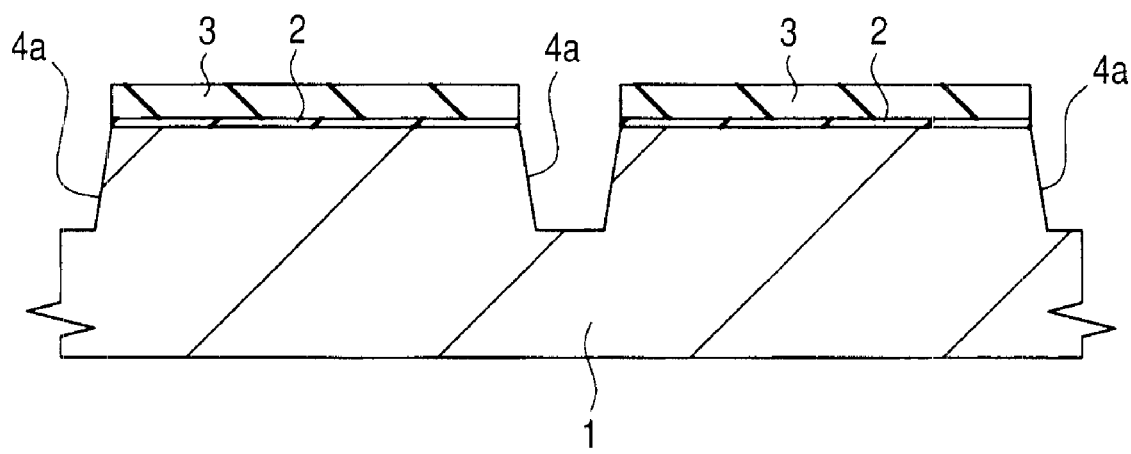
FIG. 2 is a principal part cross-sectional view in the manufacturing process of the semiconductor device following FIG. 1.

First, as shown in FIG. 1, semiconductor substrate (semiconductor wafer) 1 which consists of p type single crystal silicon which has the specific resistance of about 1~10Ω cm is prepared. Next, this semiconductor substrate 1 is oxidized thermally and insulation film 2 of about 10 nm thick is formed in the front surface. Then, insulation film 3 of about 100 nm thick is deposited on the upper layer by the CVD (Chemical Vapor Deposition) method etc., for example. Insulation film 2 consists of silicon oxide etc., and insulation film 3 consists of a silicon nitride film etc. And as shown in FIG. 2, dry etching of insulation film 3, insulation film 2, and the semiconductor substrate 1 is done one by one by using a photoresist pattern (not shown) as an etching mask. Thereby, trench (trench for element isolation) 4a about 300 nm deep is formed in semiconductor substrate 1 of an element isolation formation schedule region. Trench 4a is a trench for element isolation, namely, is a trench for element isolation region 4 formation mentioned later.

Figure 3:
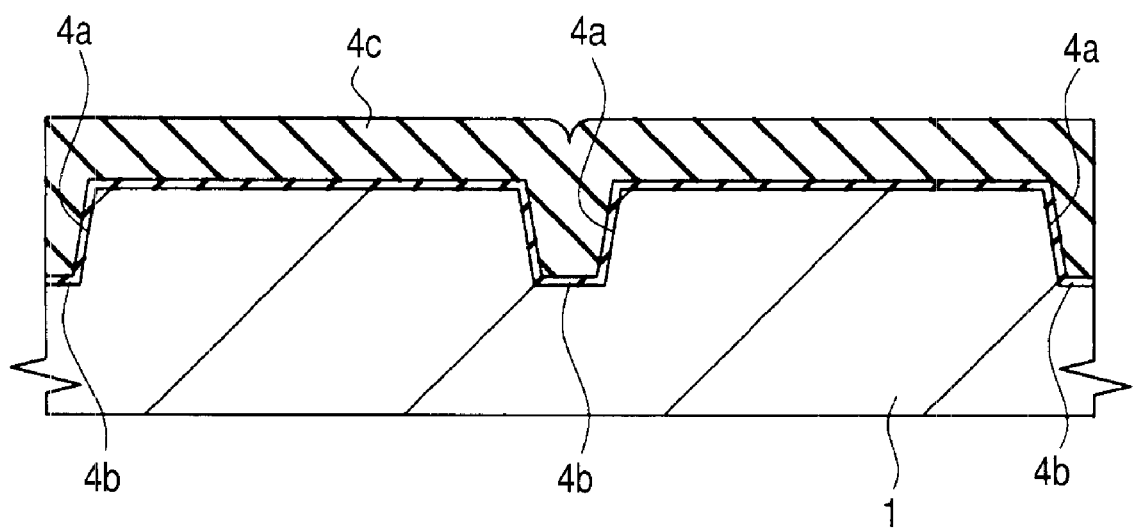
FIG. 3 is a principal part cross-sectional view in the manufacturing process of the semiconductor device following FIG. 2.

Next, as shown in FIG. 3, the wet etching using heat phosphoric acid etc. removes insulation film 3. Then, insulation film 4b about 10 nm thick is formed on the main surface of semiconductor substrate 1 comprising the inside of trench 4a (a side wall and a bottom). And on the main surface of semiconductor substrate 1 (namely, on insulation film 4b), insulation film 4c is formed (deposited) with a CVD method etc. so that the inside of trench 4a may be filled.

Insulation film 4b consists of a silicon oxide film or a silicon oxynitride film. When insulation film 4b is the silicon oxynitride film, the cubical expansion by the side wall of trench 4a oxidizing by heat treatment after an insulation film 4b forming step can be prevented, and it is effective in the ability to reduce the compressive stress acted to semiconductor substrate 1.

Insulation film 4c is the silicon oxide film formed by the HDP-CVD (High Density Plasma CVD: high-density-plasma CVD) method, or an $O_3$-TEOS oxide film. An $O_3$-TEOS oxide film is a silicon oxide film formed by the thermal CVD method using $O_3$ (ozone) and TEOS (Tetraethoxysilane: it also being called Tetra Ethyl Ortho Silicate) as source gas. When insulation film 4c is a silicon oxide film formed by the HDP-CVD method, there is an effect of the damage prevention to semiconductor substrate 1 at the time of depositing insulation film 4c in insulation film 4b.

Figure 4:
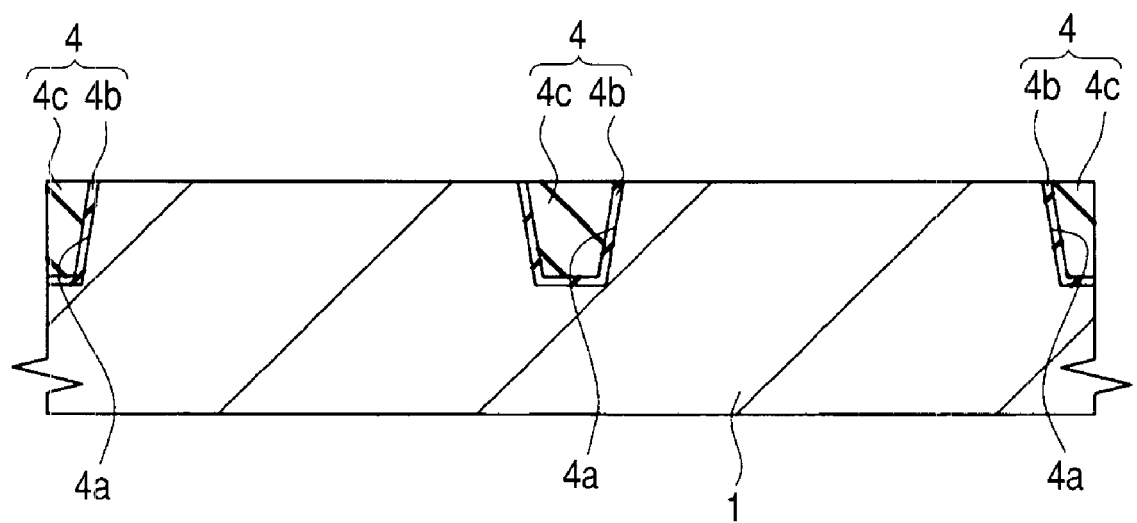
FIG. 4 is a principal part cross-sectional view in the manufacturing process of the semiconductor device following FIG. 3.

Next, as shown in FIG. 4, insulation film 4c is polished by the CMP (Chemical Mechanical Polishing) method, insulation film 4c of the outside of trench 4a is removed, and insulation films 4b and 4c are left to the inside of trench 4a. This forms element isolation (element isolation region) 4.

And insulation film 4c embedded in trench 4a is thermally tightened by heat-treating semiconductor substrate 1 for example, by about 1000° C. In the state before thermally tightening, the silicon oxide film formed by the HDP-CVD method is finer than an $O_3$-TEOS oxide film. For this reason, when insulation film 4c is an $O_3$-TEOS oxide film, it is effective in the ability to reduce the compressive stress acted to semiconductor substrate 1 by contraction of insulation film 4c by thermally tightening. On the other hand, when insulation film 4c is a silicon oxide film formed by the HDP-CVD method, compared with the case where insulation film 4c is an $O_3$-TEOS oxide film, there is little contraction of insulation film 4c at the time of thermally tightening, and the compressive stress acted to semiconductor substrate 1 by element isolation region 4 becomes large.

Thus, element isolation region 4 which consists of insulation films 4b and 4c embedded in trench 4a is formed. In this embodiment, element isolation region 4 is formed not by the LOCOS (Local Oxidization of Silicon) method but by the STI (Shallow Trench Isolation) method. That is, element isolation region 4 of this embodiment consists of an insulator (here insulation films 4b and 4c) embedded in trench 4a for the element isolation formed in semiconductor substrate 1. N channel type MISFET Qn (namely, gate insulating film 7, gate electrode 8a, and $n^-$ type semiconductor region 9a and $n^+$ type semiconductor region 9b for source/drains which form n channel type MISFET Qn) mentioned later is formed in the active region specified (surrounded) in element isolation region 4. P channel type MISFET Qp (namely, gate insulating film 7, gate electrode 8b, and $p^-$ type semiconductor region 10a and $p^+$ type semiconductor region 10b for source/drains which form p channel type MISFET Qp) mentioned later is formed in the active region specified (surrounded) in element isolation region 4.

Figure 5:
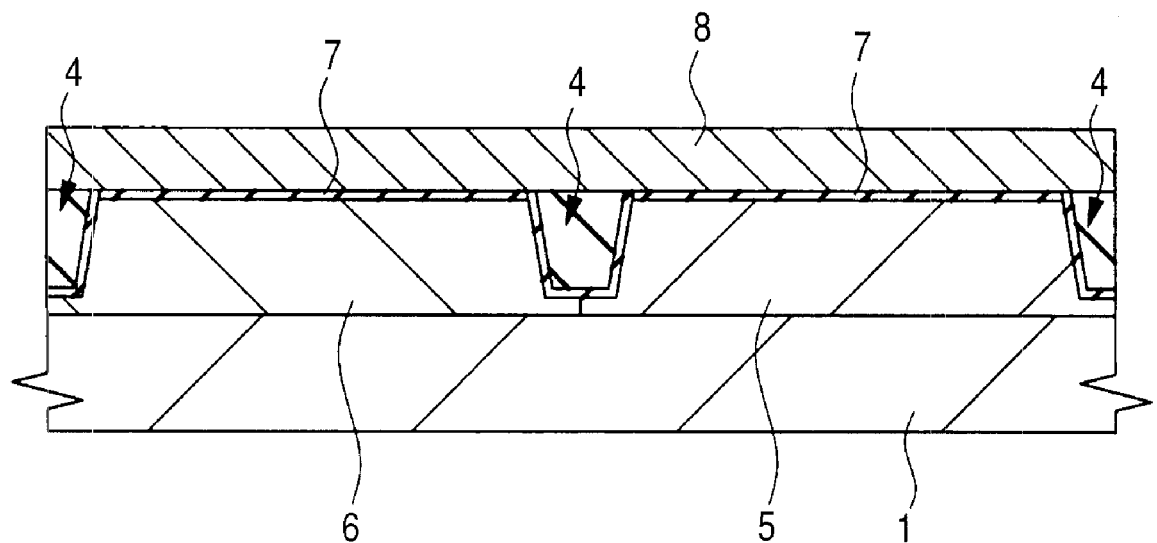
FIG. 5 is a principal part cross-sectional view in the manufacturing process of the semiconductor device following FIG. 4.

Next, as shown in FIG. 5, p type well 5 and n type well 6 are formed over the predetermined depth from the main surface of semiconductor substrate 1. The photoresist film (not shown) which covers a p channel type MISFET formation schedule region is used as an ion implantation prevention mask, and p type well 5 can be formed by doing the ion implantation of the p type impurities, such as boron (B), to semiconductor substrate 1 of an n channel type MISFET formation schedule region etc. Other photoresist film (not shown) which covers an n channel type MISFET formation schedule region is used as an ion implantation prevention mask, and n type well 6 can be formed by doing the ion implantation of the impurity of n types, such as phosphorus (P) or arsenic (As), to semiconductor substrate 1 of a p channel type MISFET formation schedule region etc.

Next, the front surface of semiconductor substrate 1 is cleaned with the wet etching using fluoric acid (HF) solution etc., for example. Then, gate insulating film 7 is formed on the front surface (namely, front surface of p type well 5 and n type well 6) of semiconductor substrate 1. Gate insulating film 7 consists of a thin silicon oxide film etc., for example, and can be formed, for example by a thermal oxidation method etc.

Next, silicon film 8 like a polycrystalline silicon film is formed as a conductor film for gate electrode formation on semiconductor substrate 1 (namely, on gate insulating film 7 of p type well 5 and n type well 6). By doing the ion implantation of the impurity of n types, such as phosphorus (P) or arsenic (As), using a photoresist film (not shown) as a mask etc., the n channel type MISFET formation schedule region of the silicon films 8 (region used as gate electrode 8a mentioned later) is set as the n-type semiconductor film (doped polysilicon film) of low resistance. By doing the ion implantation of the p type impurities, such as boron (B), using other photoresist film (not shown) as a mask etc., the p channel type MISFET formation schedule region of the silicon films 8 (region used as gate electrode 8b mentioned later) is set as the p type semiconductor film (doped polysilicon film) of low resistance. Conductor film 8 can also change into a polycrystalline silicon film what was an amorphous silicon film at the time of film formation by heat treatment after film formation (after ion implantation).

Figure 6:
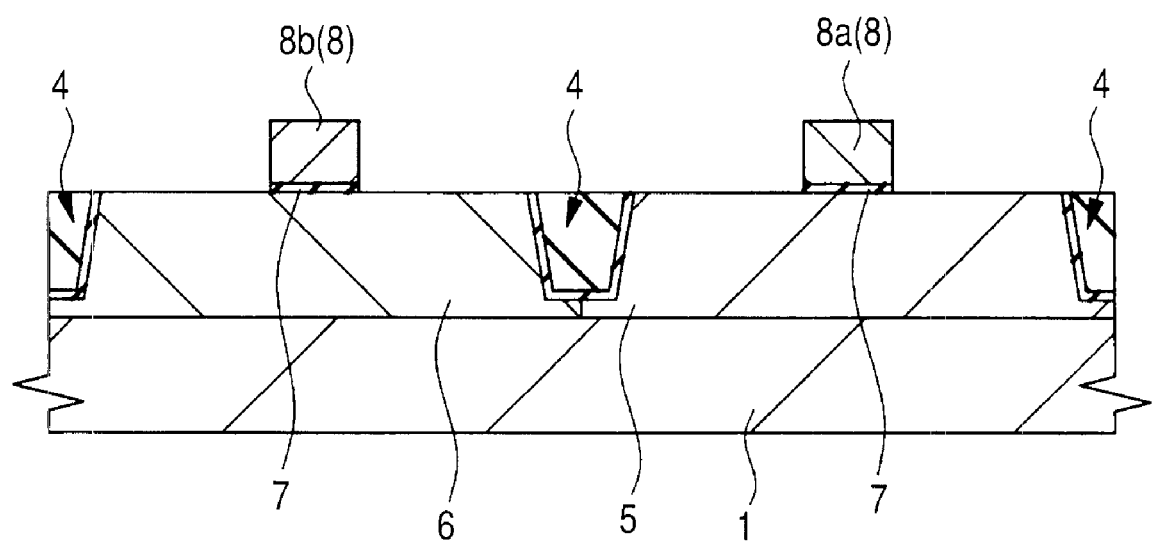
FIG. 6 is a principal part cross-sectional view in the manufacturing process of the semiconductor device following FIG. 5.

Next, as shown in FIG. 6, gate electrodes 8a and 8b are formed by patterning silicon film 8 using the photolithography method and the dry etching method.

Gate electrode 8a used as the gate electrode of n channel type MISFET consists of polycrystalline silicon (an n-type semiconductor film, a doped polysilicon film) in which the n type impurity was introduced, and is formed via gate insulating film 7 on p type well 5. That is, gate electrode 8a is formed on gate insulating film 7 of p type well 5. Gate electrode 8b used as the gate electrode of p channel type MISFET consists of polycrystalline silicon (a p type semiconductor film, a doped polysilicon film) with which the p type impurity was introduced, and is formed via gate insulating film 7 on n type well 6. That is, gate electrode 8b is formed on gate insulating film 7 of n type well 6. Although the gate length of gate electrodes 8a and 8b can change according to need, it is about 50 nm, for example.

Figure 7:
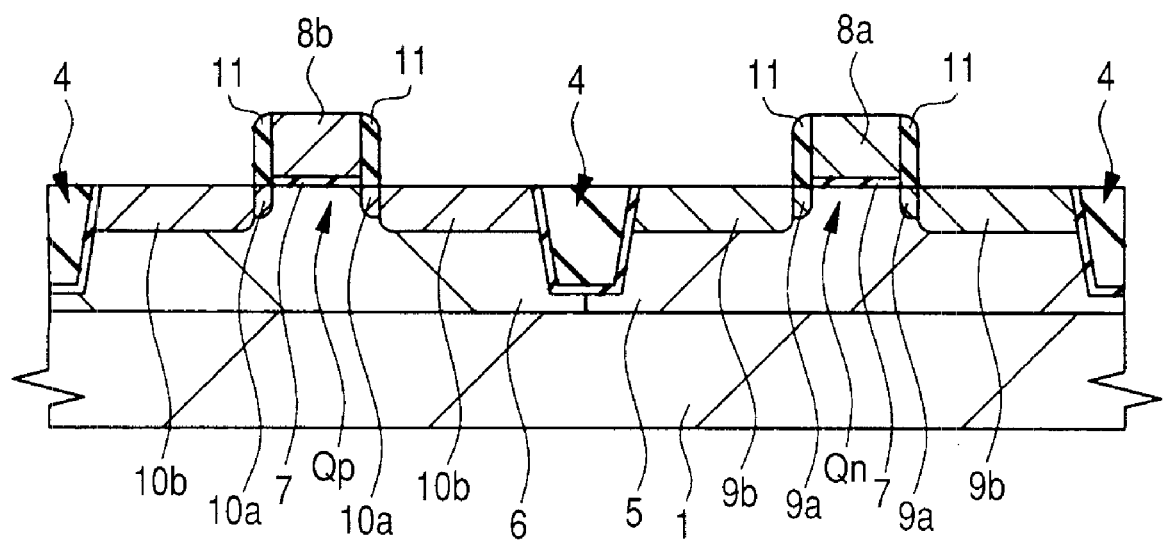
FIG. 7 is a principal part cross-sectional view in the manufacturing process of the semiconductor device following FIG. 6.

Next, as shown in FIG. 7, (a pair of $n^-$ type semiconductor region 9a is formed in the region of the both sides of gate electrode 8a of p type well 5 by doing the ion implantation of the impurity of n types, such as phosphorus (P) or arsenic (As). By doing the ion implantation of the p type impurities, such as boron (B), (a pair of) $p^-$ type semiconductor region 10a is formed in the region of the both sides of gate electrode 8b of n type well 6. The depth (junction depth) of $n^-$ type semiconductor region 9a and $p^-$ type semiconductor region 10a can be about 30 nm, for example.

Next, the side wall spacer or sidewall (side wall insulation film) 11 which consists of silicon oxide, a silicon nitride, a laminated film of these insulation films, etc., for example is formed as an insulation film on the side wall of gate electrodes 8a and 8b. Sidewall 11 can be formed by depositing a silicon oxide film, a silicon nitride film, or those laminated films on semiconductor substrate 1 and doing anisotropic etching of this silicon oxide film, a silicon nitride film, or the those laminated films by the RIE (Reactive Ion Etching) method etc., for example.

(A pair of) $n^+$ type semiconductor region 9b (a source, a drain) is formed after formation of sidewall 11 by doing the ion implantation of the impurity of n types, such as phosphorus (P) or arsenic (As), to the region of the both sides of gate electrode 8a of p type well 5, and sidewall 11, for example. (A pair of) $p^+$ type semiconductor region 10b (a source, a drain) is formed by doing the ion implantation of the p type impurities, such as boron (B), to the region of the both sides of gate electrode 8b of n type well 6, and sidewall 11, for example. $N^+$ type semiconductor region 9b may be formed first, or $p^+$ type semiconductor region 10b may be formed first. Annealing treatment for activation of the introduced impurity can also be performed after ion implantation. The depth (junction depth) of $n^+$ type semiconductor region 9b and $p^+$ type semiconductor region 10b can be about 80 nm, for example.

$N^+$ type semiconductor region 9b has impurity concentration higher than n type semiconductor region 9a. $P^+$ type semiconductor region 10b has impurity concentration higher than $p^-$ type semiconductor region 10a. Hereby, the semiconductor region (impurity diffused layer) of n type which functions as the source or drain of n channel type MISFET is formed of $n^+$ type semiconductor region (impurity diffused layer) 9b and $n^-$ type semiconductor region 9a. The semiconductor region (impurity diffused layer) of the p type which functions as the source or drain of p channel type MISFET is formed of p⁺ type semiconductor region (impurity diffused layer) 10b and p⁻ type semiconductor region 10a. Therefore, the source/drain region of n channel type MISFET and p channel type MISFET has LDD (Lightly doped Drain) structure. N⁻ type semiconductor region 9a is formed in self align to gate electrode 8a, and n⁺ type semiconductor region 9b is formed in self align to sidewall 11 formed on the side wall of gate electrode 8a. P⁻ type semiconductor region 10a is formed in self align to gate electrode 8b, and p⁺ type semiconductor region 10b is formed in self align to sidewall 11 formed on the side wall of gate electrode 8b. Thus, n channel type MISFET (Metal Insulator Semiconductor Field Effect Transistor) Qn is formed in p type well 5. P channel type MISFET (Metal Insulator Semiconductor Field Effect Transistor) Qp is formed in n type well 6, and the structure of FIG. 7 is acquired. It can be considered that n⁺ type semiconductor region 9b is a semiconductor region for the sources or drains of n channel type MISFET Qn. It can be considered that p⁺ type semiconductor region 10b is a semiconductor region for the sources or drains of p channel type MISFET Qp.

Next, with salicide (Salicide:Self Aligned Silicide) technology, the metal silicide layer (it corresponds to the below-mentioned metal silicide layer 41) of low resistance is formed in the front surface of gate electrode 8b and the source/drain region (here p⁺ type semiconductor region 10b) of p channel type MISFET Qp, and the front surface of gate electrode 8a and the source/drain region (here n⁺ type semiconductor region 9b) of n channel type MISFET Qn. Below, the forming step of this metal silicide layer is explained.

Figure 8:
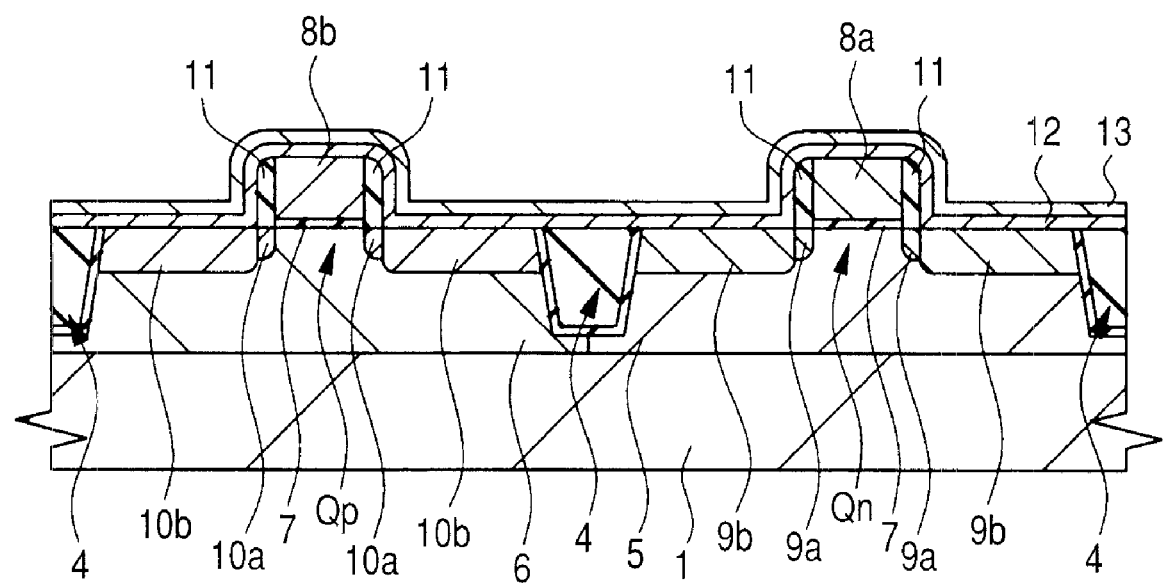
FIG. 8 is a principal part cross-sectional view in the manufacturing process of the semiconductor device following FIG. 7.
Figure 9:
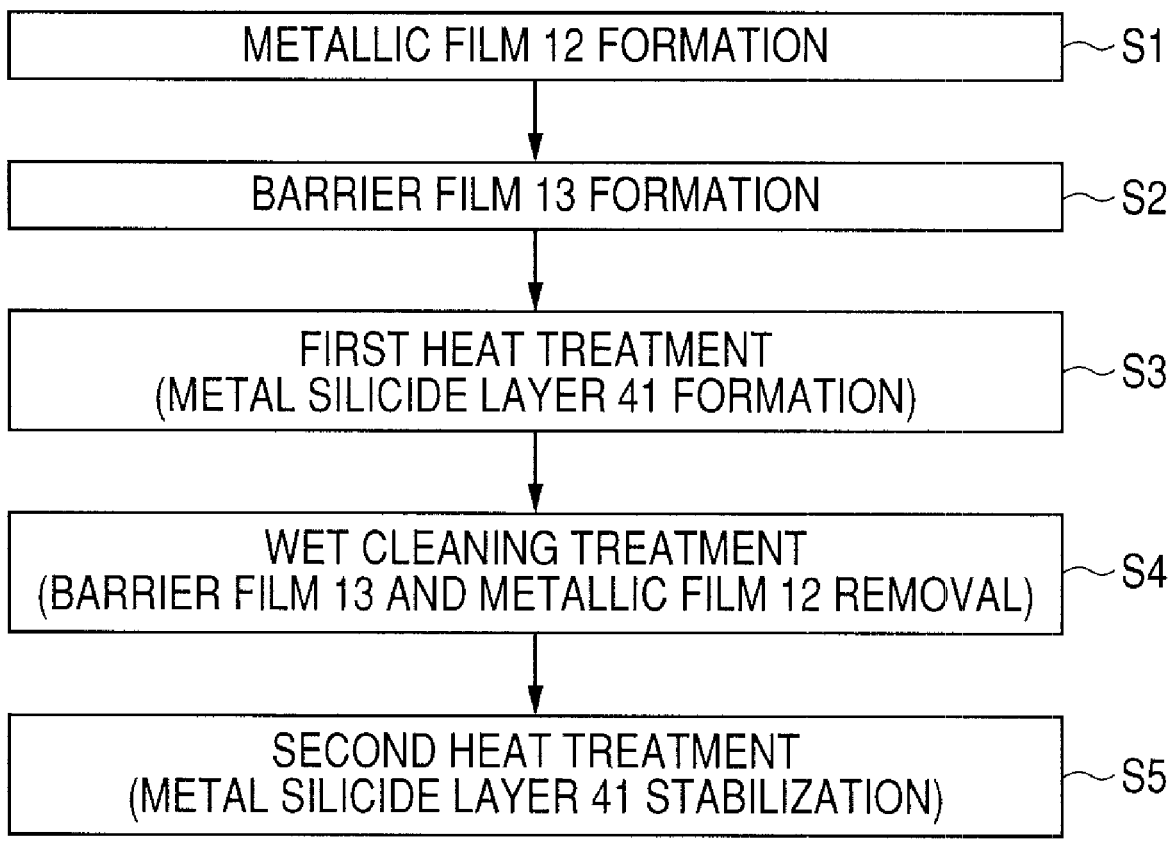
FIG. 9 is a manufacture process-flow chart showing a part of manufacturing process of the semiconductor device which is the 1 embodiment of the present invention.
Figure 10:
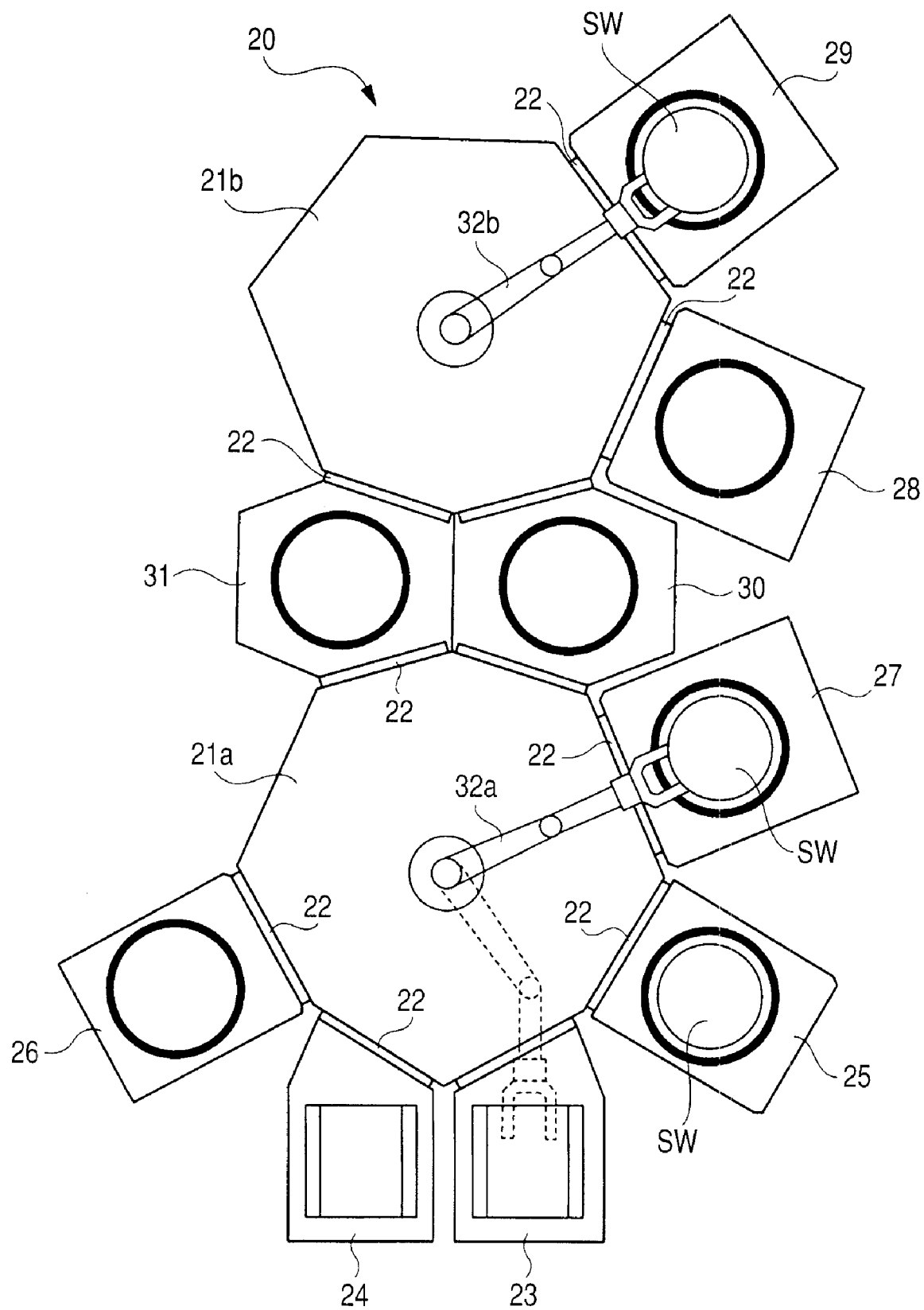
FIG. 10 is an outline plan view of the film formation apparatus of the silicide material by the 1 embodiment of the present invention.
Figure 11:
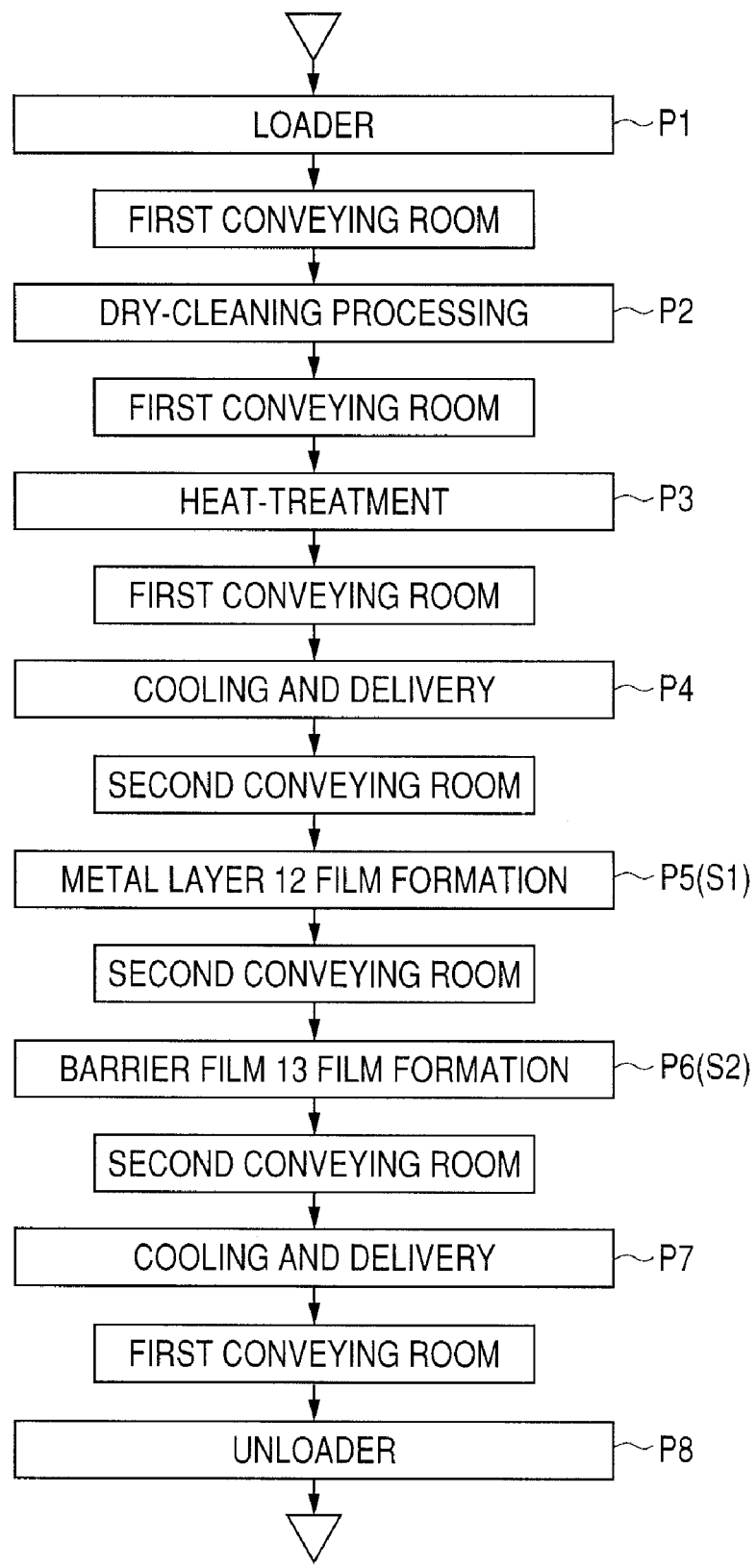
FIG. 11 is a film formation process chart of the silicide material by the 1 embodiment of the present invention.
Figure 12:
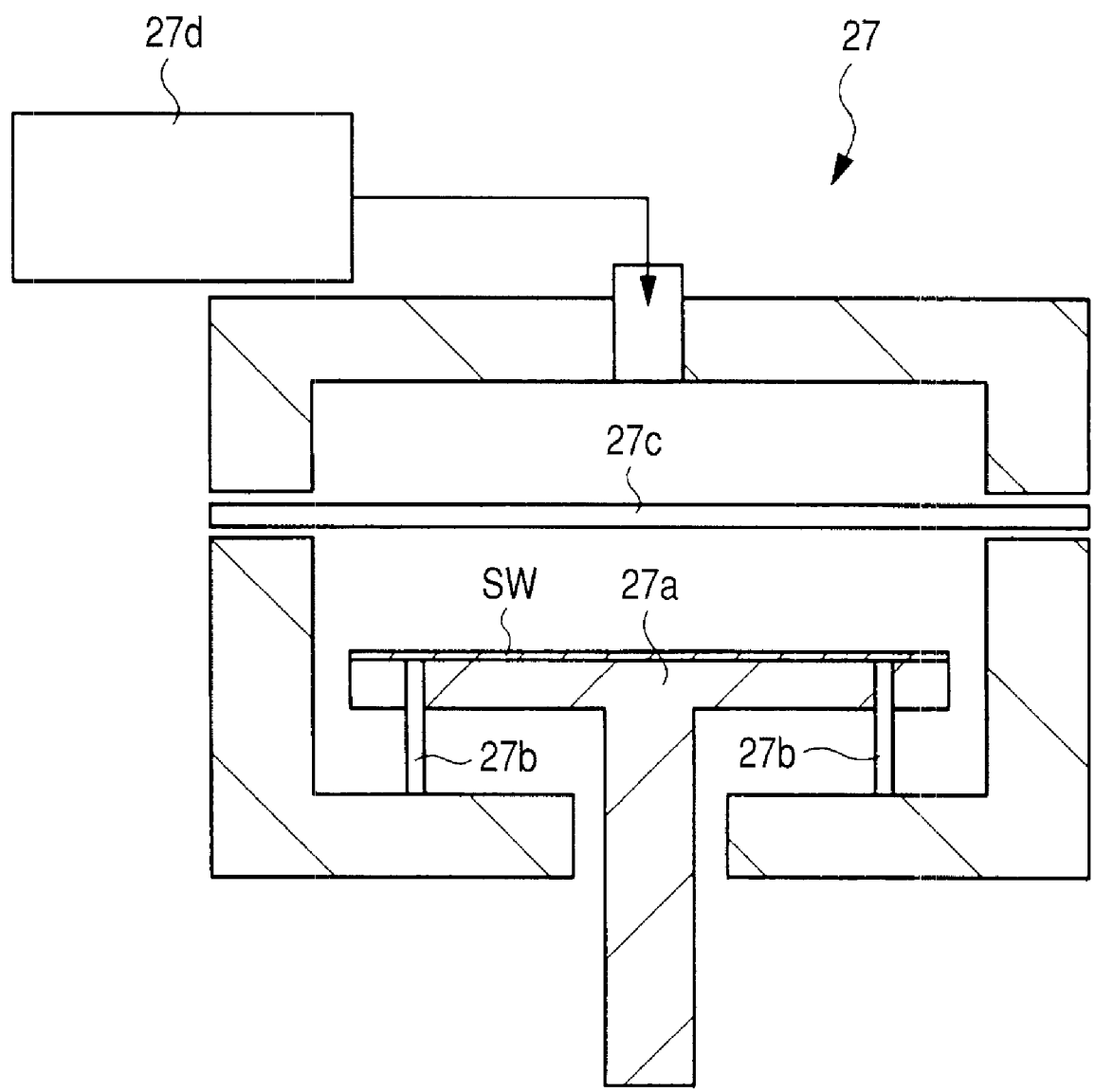
FIG. 12 is an outline cross-sectional view of the chamber for dry-cleaning processing with which the film formation apparatus of the silicide material by the 1 embodiment of the present invention is equipped.

FIG. 9 is a manufacture process-flow chart showing a part of manufacturing process of the semiconductor device of this embodiment. The manufacture process flow of the step which forms a metal silicide layer (metal and semiconductor reaction layer) in the front surface of gate electrodes 8a and 8b, n⁺ type semiconductor region 9b and p⁺ type semiconductor region 10b with a salicide (Salicide:Self Aligned Silicide) process after the structure of FIG. 7 is acquired is shown. FIG. 10 is an outline plan view of the film formation apparatus of silicide material (it is a material film for metal silicide layer 41 formation, and corresponds to metallic film 12 and barrier film 13 here). FIG. 11 is a film formation process chart of silicide material, and FIG. 12 is an outline cross-sectional view of the chamber for dry-cleaning processing with which the film formation apparatus of silicide material is equipped. FIGS. 13A to 13C are outline cross-sectional views of the chamber for explaining the processing step of the semiconductor wafer in the chamber for dry-cleaning processing with which the film formation apparatus of silicide material is equipped. FIG. 14-FIG. 17 are the principal part cross-sectional views in the manufacturing process of the semiconductor device following FIG. 8. FIG. 9 corresponds to the manufacture process flow of the step of FIG. 8 and FIG. 14, and FIG. 11 corresponds to the manufacture process flow of the step of FIG. 8.

As shown in FIG. 8, after the structure of FIG. 7 is acquired as mentioned above, metallic film 12 is formed (deposited), for example using the sputtering method on the (whole surface of the) main surface of semiconductor substrate 1 comprising gate electrodes 8a and 8b, n⁺ type semiconductor region 9b, and p⁺ type semiconductor region 10b upper part after the front surface of gate electrodes 8a and 8b, n⁺ type semiconductor region 9b, and p⁺ type semiconductor region 10b is exposed (Step S1 of FIG. 9). And barrier film (a first barrier film, a stress control film, an antioxidant film, a cap film) 13 is formed (deposited) on metallic film 12 (Step S2 of FIG. 9). Metallic film 12 consists of a nickel (Ni) film, for example, and can set the thickness (deposited film thickness) to about 9 nm, for example. Besides Ni (nickel) film, a nickel alloy film like, for example a nickel-Pt alloy film (alloy film of Ni and Pt), a nickel-Pd alloy film (alloy film of Ni and Pd), a nickel-Yb alloy film (alloy film of Ni and Yb), or a nickel-Er alloy film (alloy film of Ni and Er) etc. can be used as metallic film 12. Barrier film 13 consists of a titanium nitride (TiN) film or a titanium (Ti) film, for example, and can set the thickness (deposited film thickness) to about 15 nm, for example. Although mentioned later for details, barrier film 13 is formed on metallic film 12 for control of the stress acted to semiconductor substrate 1, the anti-oxidation of metallic film 12, etc. Below, an example of the desirable formation method of metallic film 12 and barrier film 13 is explained.

Film formation apparatus 20 of silicide material shown in FIG. 10 is used for film formation of metallic film 12 and barrier film 13.

As shown in FIG. 10, film formation apparatus 20 is the multi-chamber type with which two conveying rooms, first conveying room 21a and second conveying room 21b, are arranged, loader 23, unloader 24, and three chambers 25, 26, and 27 are equipped in the circumference of first conveying room 21a via gate valve 22 which is an opening and closing means, and two chambers 28 and 29 are equipped in the circumference of second conveying room 21b via gate valve 22 which is an opening and closing means. Between first conveying room 21a and second conveying room 21b, two chambers 30 and 31 for transportation are equipped. First conveying room 21a is held by the exhaust mechanism etc. at a predetermined degree of vacuum, and robot 32a for transportation of poly-joint arm structure for transporting semiconductor wafer SW is formed in the central part. Similarly, second conveying room 21b is held by the exhaust mechanism etc. at a predetermined degree of vacuum, and robot 32b for transportation of poly-joint arm structure for transporting semiconductor wafer SW is formed in the central part.

Chambers 25 and 26 with which first conveying room 21a is equipped are chambers for heat-treatment which perform heat-treatment of relatively high temperature, and chamber 27 is a chamber for dry-cleaning disposal. Chamber 28 with which second conveying room 21b is equipped is a chamber for film formation which forms metallic film 12 (for example, nickel film) by a sputtering method. Chamber 29 is a chamber for film formation which forms barrier film 13 (for example, titanium nitride film) by a sputtering method. When forming barrier film 13 with plasma CVD method, chamber 29 turns into a chamber for film formation which forms barrier film 13 (for example, titanium film) with plasma CVD method.

Chambers 30 and 31 equipped between first conveying room 21a and second conveying room 21b are chambers for delivery which deliver semiconductor wafer SW between first conveying room 21a and second conveying room 21b, and are chambers for cooling used also for cooling of semiconductor wafer SW. In film formation apparatus 20, it was set as three chambers with which only first conveying room 21a is equipped, and was set as two chambers with which only second conveying room 21b is equipped. However, it is not limited to this, but it is also possible to add the chamber of the same use or the chamber of other uses.

First, the FOUP (Front Open Unified Pod) carrying a plurality of semiconductor wafers SW is mounted on loader 23 (step P1 of FIG. 11). Then, with robot 32a for transportation, semiconductor wafer SW (it corresponds to the above-mentioned semiconductor substrate 1) of one sheet is picked out from a FOUP, and vacuum carrying in is done to first conveying room 21a. A FOUP is a sealing storing container for batch transportation of semiconductor wafer SW, and usually stores semiconductor wafer SW in batch units, such as 25 sheets, 12 sheets, and six etc. sheets. The container outer wall of a FOUP has sealed structure except for the fine ventilation filter part, and dust is eliminated nearly thoroughly. Therefore, even if it transports in the atmosphere of class 1000, the inside can maintain the cleanliness factor of class 1. By drawing the door of a FOUP in the inside of film formation apparatus 20, docking to film formation apparatus 20 is performed, where cleanliness is held.

Next, vacuum transportation of the semiconductor wafer SW is done from first conveying room 21a to chamber 27 for dry-cleaning processing with robot 32a for transportation (step P2 of FIG. 11). The outline cross-sectional view of chamber 27 is shown in FIG. 12. As shown in FIG. 12, chamber 27 is mainly formed by wafer stage 27a, wafer lift pin 27b, shower head 27c, and remote plasma generators 27d. Wafer stage 27a and wafer lift pin 27b have the independent rising and falling mechanism. The distance of shower head 27c and semiconductor wafer SW and the distance of semiconductor wafer SW and wafer stage 27a are arbitrarily controllable. Shower head 27c installed above wafer stage 27a is always maintained by constant temperature, and the temperature is 180° C., for example.

When carrying in semiconductor wafer SW to chamber 27, as shown in FIG. 13A, wafer stage 27a is descended, wafer lift pin 27b is raised, and semiconductor wafer SW is mounted on wafer lift pin 27b. The distance of shower head 27c and semiconductor wafer SW is set, for example as 16.5±12.7 mm, and the distance of semiconductor wafer SW and wafer stage 27a is set, for example as 25.4±17.8 mm.

Then, when doing dry-cleaning processing of main surface upper part of semiconductor wafer SW, as shown in FIG. 13B, wafer stage 27a is raised, wafer lift pin 27b is descended, and semiconductor wafer SW is mounted on wafer stage 27a. The distance of shower head 27c and semiconductor wafer SW is set, for example as 17.8±5.1 mm.

At the time of dry-cleaning processing, in remote plasma generator 27d, reducing gas, for example, Ar gas which added NF$_3$ gas and NH$_3$ gas, is excited, plasma is generated, and this plasma is introduced into chamber 27. The plasma introduced in chamber 27 is supplied on the main surface of semiconductor wafer SW via shower head 27c. By this, a natural-oxidation film is removed by the reduction reaction shown in a formula (1) which occurs between plasma, and the natural-oxidation film formed on the surface of silicon (polycrystalline silicon which forms gate electrodes 8a and 8b, and single crystal silicon which forms semiconductor substrate 1 in which n$^+$ type semiconductor region 9b and p$^+$ type semiconductor region 10b were formed), for example. The process conditions at the time of dry-cleaning processing are showerhead temperature 180° C., NF$_3$ quantity-of-gas-flow 14 sccm, NH$_3$ quantity-of-gas-flow 70 sccm, the pressure of 400 Pa, and plasma power 30 W, for example.

$$SiO_2+NF_3+NH_3 \rightarrow (NH_4)_2SiF_6+O_2 \qquad \text{Formula (1)}$$

At this time, the product ((NH$_4$)$_2$SiF$_6$) generated by the reduction reaction remains on the main surface of semiconductor wafer SW. Further, semiconductor wafer SW is only mounted on wafer stage 27a, and the above-mentioned product remains to a side surface, and some on the back of semiconductor wafer SW. The product which remains to a side surface, and some on the back of semiconductor wafer SW separates, when transporting semiconductor wafer SW to other chambers, and it causes contamination and dust generation. Then, it heat-treats to semiconductor wafer SW in chamber 27 following dry-cleaning disposal. This removes the product which remains on the main surface of semiconductor wafer SW, simultaneously the product which remains to a side surface, and some on the back of semiconductor wafer SW is removed.

Then, when heat-treating semiconductor wafer SW, as shown in FIG. 13C, wafer stage 27a is descended, wafer lift pin 27b is raised, and semiconductor wafer SW is brought close to shower head 27c set as temperature 180° C. The distance of shower head 27c and semiconductor wafer SW is set, for example as 3.8±2.6 mm, and the distance of semiconductor wafer SW and wafer stage 27a is set, for example as 5.9 mm or more.

At the time of heat treatment, semiconductor wafer SW is heated using the heating temperature (180° C.) of shower head 27c. The temperature of semiconductor wafer SW becomes 100-150° C. The product ((NH$_4$)$_2$SiF$_6$) formed on the main surface of semiconductor wafer SW at the time of the above-mentioned dry-cleaning disposal sublimates, and is removed by the reaction shown in a formula (2), for example. The side surface and back surface of semiconductor wafer SW are also heated by this heat treatment, and the product which remained at a part of side surface and the back surface is also removed.

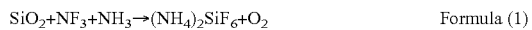

$$(NH_4)_2SiF_6 \rightarrow SiF_4+2NH_3+2HF \qquad \text{Formula (2)}$$

However, when composition of the product formed in semiconductor wafer SW at the time of the above-mentioned dry-cleaning processing has shifted slightly from (NH$_4$)$_2$SiF$_6$, in heat treatment of temperature 100 to 150° C., the reaction of a formula (2) will not occur easily. It becomes impossible to remove a product thoroughly and a very small product remains on the main surface of semiconductor wafer SW. As mentioned above, when the very small product remains on the main surface of semiconductor wafer SW, variation will occur in the electric resistance of the metal silicide layer (for example, nickel silicide layer) formed on the main surface of semiconductor wafer SW after that. Then, in a next step, heat-treatment of higher temperature than 150° C. is performed to semiconductor wafer SW, and the very small product which remained on the main surface of semiconductor wafer SW is removed.

Next, vacuum transportation of the semiconductor wafer SW is done from chamber 27 for dry-cleaning processing via first conveying room 21a to chamber 25 (or chamber 26) for heat-treatment with robot 32a for transportation. Semiconductor wafer SW is mounted on the stage with which chamber 25 (or chamber 26) is equipped (step P3 of FIG. 11). By mounting semiconductor wafer SW on the stage of chamber 25 (or chamber 26), semiconductor wafer SW is heated at a predetermined temperature. The product which remained on the main surface of semiconductor wafer SW without sublimating at the temperature of 100 to 150° C. is made to sublimate, and removed. As for the temperature on the main surface of semiconductor wafer SW, 150 to 400° C. is considered to be a suitable range, for example (naturally depending on other conditions, not limited to this range). 165 to 350° C. can be considered as a range suitable for mass production. It is thought that ranges which make 200° C. a central value, such as 180 to 220° C., are still more preferred.

Next, vacuum transportation of the semiconductor wafer SW is done from chamber 25 (or chamber 26) for heat-treatment via first conveying room 21a to chamber 30 (or chamber 31) for cooling/delivery with robot 32a for transportation. Semiconductor wafer SW is mounted on the stage with which chamber 30 (or chamber 31) is equipped (step P4 of FIG. 11). Semiconductor wafer SW is cooled by mounting semiconductor wafer SW on the stage of chamber 30 (or chamber 31).

Next, vacuum transportation of the semiconductor wafer SW is done from chamber 30 (or chamber 31) for cooling/delivery via second conveying room 21b to chamber 28 for metallic film 12 film formation with robot 32b for transportation (step P5 of FIG. 11). After making the inside of chamber 28 into a predetermined degree of vacuum, for example, about $1.33 \times 10^{-6}$ Pa, by an exhaust mechanism, semiconductor wafer SW is heated to a predetermined temperature. Ar gas is introduced with a predetermined flow rate into chamber 28, and metallic film 12 (for example, nickel film) is deposited on up to the main surface of semiconductor wafer SW by a sputtering method. The deposition step of this metallic film 12 corresponds to the above-mentioned step S1 (Step S1 of FIG. 9). The thickness of metallic film 12 is 9 nm, for example, and the sputtering conditions at the time of film formation are forming temperature 40° C. and Ar gas flow rate 13 sccm, for example.

Next, vacuum transportation of the semiconductor wafer SW is done from chamber 28 for metallic film 12 film formation via second conveying room 21b to chamber 29 for barrier film 13 film formation with robot 32b for transportation (step P6 of FIG. 11). After making the inside of chamber 29 into a predetermined degree of vacuum by an exhaust mechanism, semiconductor wafer SW is heated to a predetermined temperature. Ar gas and $N_2$ gas are introduced with a predetermined flow rate into chamber 29, and barrier film 13 which consists of a titanium nitride film etc. is deposited to up to the main surface of semiconductor wafer SW by a sputtering method. The deposition step of this barrier film 13 corresponds to the above-mentioned step S2 (Step S2 of FIG. 9). The thickness of barrier film 13 is 15 nm, for example, and the sputtering conditions at the time of film formation are forming temperature 40° C., Ar gas flow rate 28 sccm, and nitrogen gas flow rate 80 sccm, for example.

Next, vacuum transportation of the semiconductor wafer SW is done from chamber 29 for barrier film 13 film formation via second conveying room 21b to chamber 30 (or chamber 31) for cooling/delivery with robot 32b for transportation (step P7 of FIG. 11).

Next, vacuum taking out of the semiconductor wafer SW is done from chamber 30 (or chamber 31) for cooling/delivery to unloader 24 with robot 32a for transportation (step P8 of FIG. 11), and the semiconductor wafer SW is mounted on the FOUP put on unloader 24 (step P8 of FIG. 11).

Ar gas which added reducing gas, for example, $NF_3$ gas and $NH_3$ gas, in remote plasma generator 27d in the above-mentioned dry-cleaning processing (although Ar gas is used abundantly as gas for plasma excitation, other rare gas or those mixed gas is also OK) was made to excite and plasma was generated. And this plasma was introduced into chamber 27 and the reduction reaction removed the natural-oxidation film. As other forms, without using plasma, reducing gas, such as HF gas and $NH_3$ gas, or $NF_3$ gas and $NH_3$ gas, may be introduced into chamber 27, and a reduction reaction may remove a natural-oxidation film.

It is not limited to a remote plasma apparatus. When there is no problem in other characteristics, it will be satisfactory even if it uses the usual plasma apparatus. Remote plasma has an advantage which does not do damage to a substrate.

When processing using plasma, it does not restrict to the combination of the above-mentioned gas. When generating each radical or reacting species of nitrogen, hydrogen, and fluorine (these compound radicals are included), as long as it is not harmful to especially this process, the combination of other gas is sufficient. Namely, what is necessary is just to use suitably mixed gas atmosphere, such as nitrogen, hydrogen, and fluorine radical production gas (including mixed gas), plasma excitation gas, and other addition gas.

Reactive gas, such as reducing gas, is not restricted to the above-mentioned gas. What is necessary is just to generate the reacting species which react at low temperature comparatively with the oxide film of a silicon surface, and are evaporated.

Thus, after forming metallic film 12 and barrier film 13, first heat treatment (annealing treatment) is performed to semiconductor substrate 1 (Step S3 of FIG. 9). It is preferred to perform first heat treatment of Step S3 in inert gas or nitrogen gas atmosphere. When metallic film 12 is a nickel (Ni) film, it is preferred to perform first heat treatment of Step S3 by 400-500° C. For example, the RTA (Rapid Thermal Anneal) method is used for semiconductor substrate 1 in inert gas or nitrogen gas atmosphere, and heat-treatment of the temperature of about 410° C. is performed for about 30 seconds. Hereby, first heat treatment of Step S3 can be performed.

Figure 14:
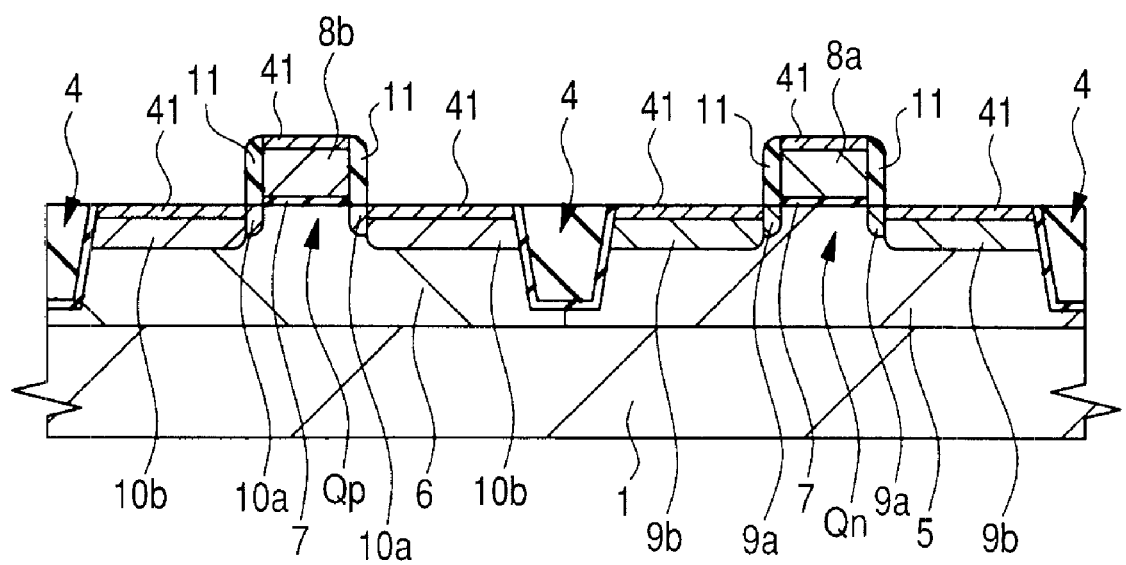
FIG. 14 is a principal part cross-sectional view in the manufacturing process of the semiconductor device following FIG. 8.

The polycrystalline silicon film which forms gate electrodes 8a and 8b, and metallic film 12 are made to react selectively by first heat treatment of Step S3, as shown in FIG. 14. The single crystal silicon which forms $n^+$ type semiconductor region 9b and $p^+$ type semiconductor region 10b, and metallic film 12 are made to react selectively, and metal silicide layer 41 which is a metal and semiconductor reaction layer is formed. In this embodiment, metal silicide layer 41 which consists of mono-silicide (namely, MSi) of metallic element M which forms metallic film 12 is formed by the first heat treatment of Step S3.

That is, metallic element M which forms metallic film 12 and Si (silicon) of polycrystalline silicon which forms gate electrodes 8a and 8b are made to react by first heat treatment of Step S3 (M+Si→MSi). Metal silicide layer 41 which consists of MSi is formed on the front surface of gate electrodes 8a and 8b (upper layer portion of gate electrodes 8a and 8b). Metallic element M which forms metallic film 12 and Si (silicon) of $n^+$ type semiconductor region 9b are made to react by first heat treatment of Step S3 (M+Si→MSi). Metal silicide layer 41 which consists of MSi is formed on the front surface of $n^+$ type semiconductor region 9b (upper layer portion of $n^+$ type semiconductor region 9b). Metallic element M which forms metallic film 12 and Si (silicon) of $p^+$ type semiconductor region 10b are made to react by first heat treatment of Step S3 (M+Si→MSi). Metal silicide layer 41 which consists of MSi is formed on the front surface of $p^+$ type semiconductor region 10b (upper layer portion of $p^+$ type semiconductor region 10b).

Thus, by the first heat treatment of Step S3, (silicon which constitutes) gate electrodes 8a and 8b, $n^+$ type semiconductor region 9b and $p^+$ type semiconductor region 10b, and metallic film 12 are made to react selectively, and metal silicide layer 41 is formed. However, at the stage which performed first heat treatment of Step S3, metal silicide layer 41 is made MSi (metal mono-silicide) phase, but neither $M_2Si$ (di-metal silicide) phase nor $MSi_2$ (metal di-silicide) phase is done. MSi (metal mono-silicide) is mono-silicide of metallic element M which forms metallic film 12 here, and $MSi_2$ (metal di-silicide) is di-silicide of metallic element M which forms metallic film 12. For example, when metallic film 12 is a nickel (Ni) film, in the stage which performed first heat treatment of Step S3, metal silicide layer 41 is made into a NiSi (nickel mono-silicide) phase, and neither a $Ni_2Si$ (di-nickel silicide) phase nor $NiSi_2$ (nickel di-silicide) phase is done.

With the chemical formula, the metallic element which forms metallic film 12 is written as M in this embodiment, and the following embodiments. For example, when metallic film 12 is a nickel (Ni) film, above M (metallic element M which forms metallic film 12) is Ni. Above MSi (metal mono-silicide) is NiSi (nickel mono-silicide). The above-mentioned $M_2Si$ (di-metal silicide) is $Ni_2Si$ (di-nickel silicide). The above-mentioned $MSi_2$ (metal di-silicide) is $NiSi_2$ (nickel di-silicide). Moreover, for example, when metallic film 12 is Ni—Pt alloy film of 99 atom % of Ni (nickel) and one atom % of Pt (platinum), above M (metallic element M which forms metallic film 12) is Ni and Pt (however when the composition ratio of Ni and Pt is taken into consideration, above M is $Ni_{0.99}Pt_{0.01}$). Above MSi is $Ni_{0.99}Pt_{0.01}Si$. The above-mentioned $M_2Si$ is $(Ni_{0.99}Pt_{0.01})_2Si$. The above-mentioned $MSi_2$ is $Ni_{0.99}Pt_{0.01}Si_2$. Moreover, for example, when metallic film 12 is a nickel-Pd alloy film of 98 atom % of Ni (nickel) and two atom % of Pd (palladium), above M (metallic element M which forms metallic film 12) is Ni and Pd (however when the composition ratio of Ni and Pd is taken into consideration, above M is $Ni_{0.98}Pd_{0.02}$). Above MSi is $Ni_{0.98}Pd_{0.02}Si$. The above-mentioned $M_2Si$ is $(Ni_{0.98}Pd_{0.02})_2Si$. The above-mentioned $MSi_2$ is $Ni_{0.98}Pd_{0.02}Si_2$. When metallic film 12 is an alloy film of other composition, it can think the same way.

Next, barrier film 13 and unreacted metallic film 12 (namely, metallic film 12 which did not react with gate electrodes 8a and 8b, $n^+$ type semiconductor region 9b, or $p^+$ type semiconductor region 10b) are removed by performing a wet cleaning treatment (Step S4 of FIG. 9). On this occasion, metal silicide layer 41 is made to remain on the front surface of gate electrodes 8a and 8b, $n^+$ type semiconductor region 9b, and $p^+$ type semiconductor region 10b. Wet cleaning using sulfuric acid or wet cleaning using sulfuric acid and a hydrogen peroxide solution can perform the wet cleaning treatment of Step S4.

Next, second heat treatment (annealing treatment) is performed to semiconductor substrate 1 (Step S5 of FIG. 9). It is preferred to perform second heat treatment of Step S5 in inert gas or nitrogen gas atmosphere. Second heat treatment of Step S5 is performed with heat treatment temperature higher than the heat treatment temperature of the first heat treatment of the above-mentioned step S3. When metallic film 12 is a nickel (Ni) film, second heat treatment of Step S5 can be made into about 550° C., for example. For example, by using the RTA method for semiconductor substrate 1 in inert gas or nitrogen gas atmosphere, and heat-treating at about temperature 550° C. for about 30 seconds, second heat treatment of Step S5 can be performed. Second heat treatment of Step S5 is performed for stabilization of metal silicide layer 41.

As mentioned above, metal silicide layer 41 of a MSi phase is formed by the first heat treatment of Step S3. Even if it performs second heat treatment of Step S5, this metal silicide layer 41 does not change, but is still a MSi phase. By performing second heat treatment of Step S5, the composition in metal silicide layer 41 is equalized more, and composition ratio with metallic elements M and Si in metal silicide layer 41 becomes near by the stoichiometry of 1:1, and can stabilize metal silicide layer 41. A MSi phase is low resistivity than a $M_2Si$ phase and a $MSi_2$ phase. Even after Step S5 (till the termination of manufacture of a semiconductor device), metal silicide layer 41 is maintained with the MSi phase of low resistance. In the manufactured semiconductor device (even the state where semiconductor substrate 1 is individually separated and it became a semiconductor chip for example), metal silicide layer 41 constitutes the MSi phase of low resistance.

Thus, metal silicide layer 41 which consists of MSi (metal mono-silicide) is formed in the front surface of gate electrode 8a and the source/drain region ($n^+$ type semiconductor region 9b) of n channel type MISFET Qn (upper layer portion), and in the front surface (upper layer portion) of gate electrode 8b and the source/drain region ($p^+$ type semiconductor region 10b) of p channel type MISFET Qp. Although based on the thickness of metallic film 12, when the thickness of metallic film 12 is about 9 nm, the thickness of metal silicide layer 41 is about 19 nm, for example.

Figure 15:
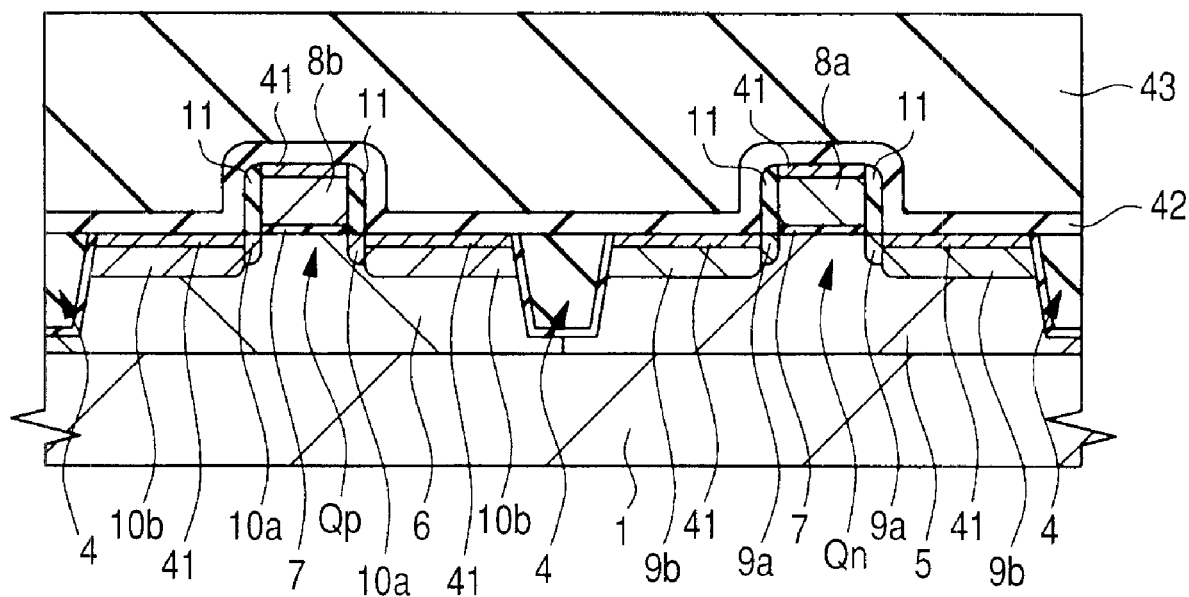
FIG. 15 is a principal part cross-sectional view in the manufacturing process of the semiconductor device following FIG. 14.

Next, as shown in FIG. 15, insulation film 42 is formed on the main surface of semiconductor substrate 1. That is, insulation film 42 is formed on semiconductor substrate 1 comprising metal silicide layer 41 upper part so that gate electrodes 8a and 8b may be covered. Insulation film 42 consists of a silicon nitride film, and can be formed with a CVD method etc. And insulation film 43 thicker than insulation film 42 is formed on insulation film 42. Insulation film 43 consists of a silicon oxide film like an $O_3$-TEOS oxide film etc., for example. Hereby, the interlayer insulation film which consists of insulation films 42 and 43 is formed. Then, the front surface of insulation film 43 is polished by the CMP method, and planarizing of the upper surface of insulation film 43 is done. Even if it originates in a ground level difference and the concave-convex form is formed in the front surface of insulation film 42, the interlayer insulation film with which planarizing of the front surface was done can be obtained by polishing the front surface of insulation film 43 by the CMP method.

Figure 16:
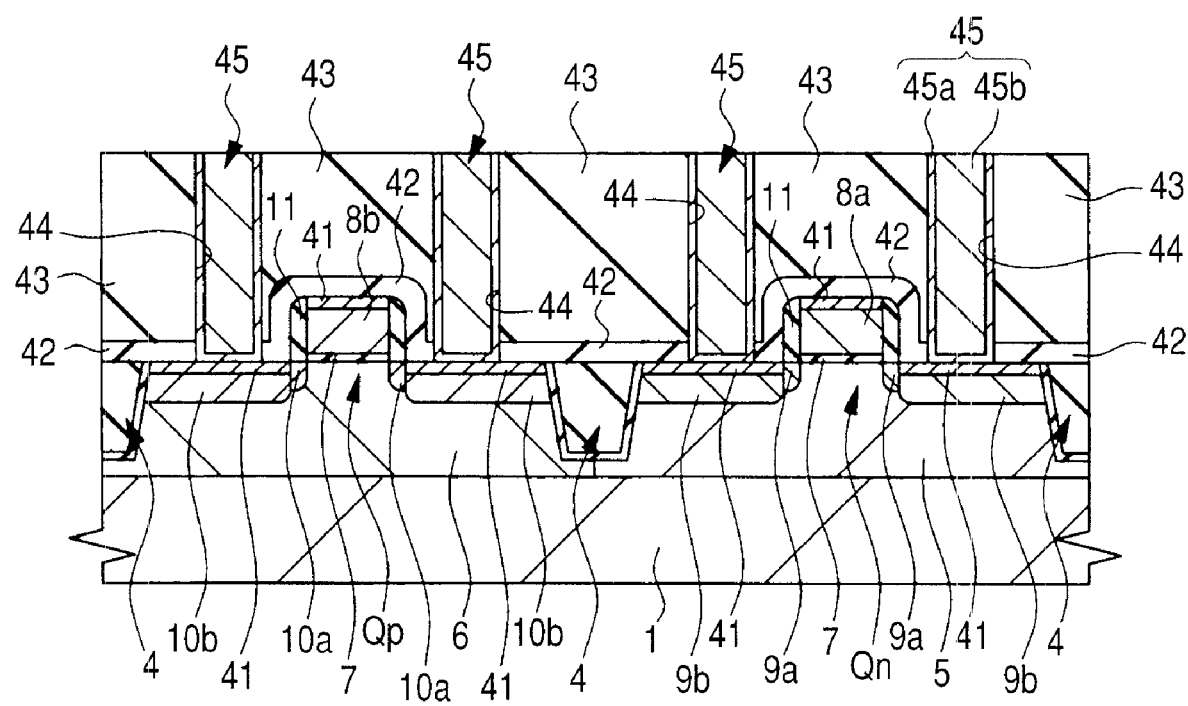
FIG. 16 is a principal part cross-sectional view in the manufacturing process of the semiconductor device following FIG. 15.

Next, as shown in FIG. 16, dry etching of the insulation films 43 and 42 is done, using the photoresist pattern (not shown) formed on insulation film 43 as an etching mask. This forms contact hole (a through hole, a hole) 44 in insulation films 42 and 43. On this occasion, dry etching of insulation film 43 is performed on the conditions into which insulation film 43 is easy to etch first as compared with insulation film 42, and insulation film 42 is operated as an etching stopper film. Hereby, after forming contact hole 44 in insulation film 43, on the conditions into which insulation film 42 is easy to etch as compared with insulation film 43, dry etching of the insulation film 42 of the bottom of contact hole 44 is done, and it is removed. At the bottom of contact hole 44, a part of main surface of semiconductor substrate 1, for example, a part of metal silicide layer 41 on the front surface of $n^+$ type semiconductor region 9b and $p^+$ type semiconductor region 10b, the part of metal silicide layer 41 on the front surface of gate electrodes 8a and 8b, etc., is exposed.

Next, plug (conductor part for connection) 45 which consists of tungsten (W) etc. is formed in contact hole 44. In order to form plug 45, barrier conductor film 45a (for example, a titanium nitride film, or the laminated film of a titanium film and a titanium nitride film) is formed on insulation film 43 comprising the inside of contact hole 44 (on a bottom and a side wall), for example. And with a CVD method etc., on barrier conductor film 45a, main conductor film 45b which consists of a tungsten film etc. is formed so that contact hole 44 may be filled. Plug 45 can be formed by removing unnecessary main conductor film 45b and unnecessary barrier conductor film 45a on insulation film 43 by the CMP method or the etch back method. Plug 45 formed on gate electrodes 8a and 8b, $n^+$ type semiconductor region 9b, or $p^+$ type semiconductor region 10b touches and electrically connects metal silicide layer 41 on the front surface of gate electrodes 8a and 8b, $n^+$ type semiconductor region 9b, or $p^+$ type semiconductor region 10b at the bottom.

Figure 17:
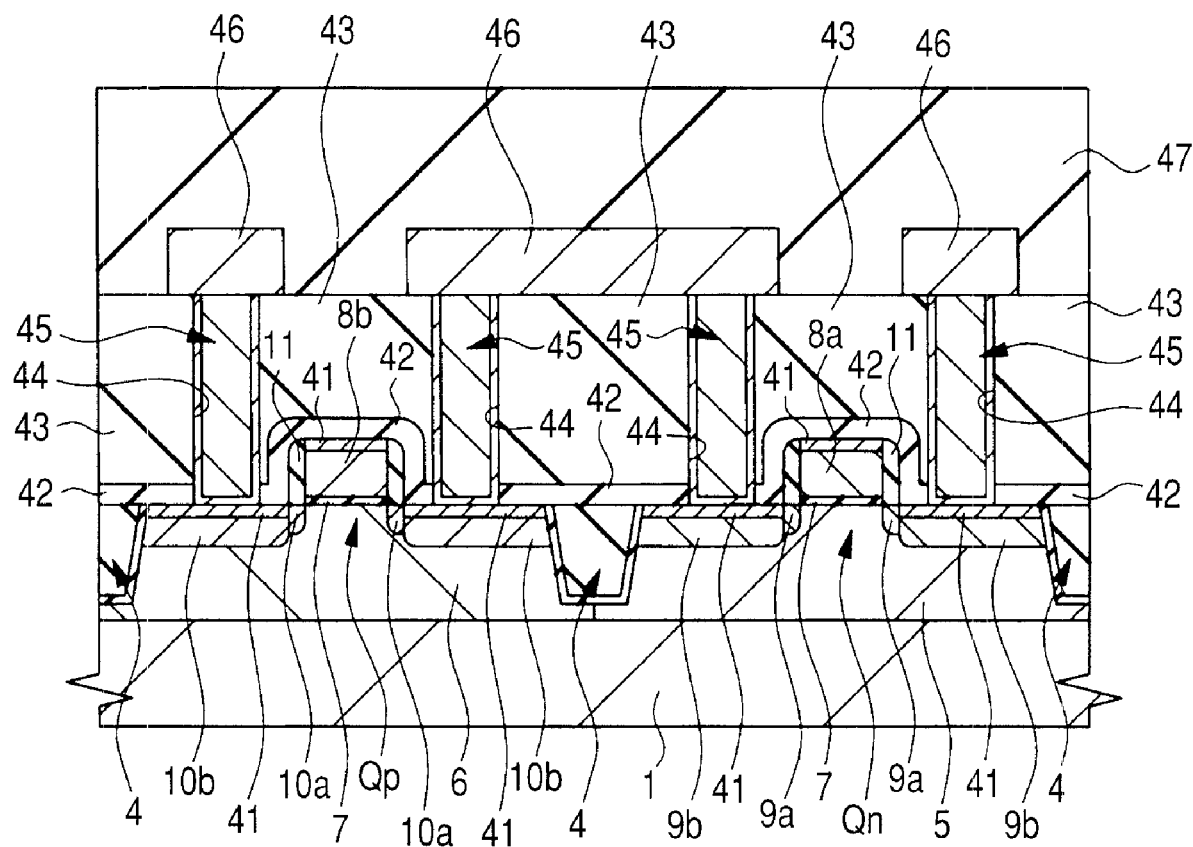
FIG. 17 is a principal part cross-sectional view in the manufacturing process of the semiconductor device following FIG. 16.

Next, as shown in FIG. 17, wiring 46 which consists of tungsten etc. is formed as first layer wiring on insulation film 43 where plug 45 was embedded. Wiring 46 can be formed by forming conductor films, such as a tungsten film, on insulation film 43, and patternizing this conductor film by the photolithography method and the dry etching method. Wiring 46 is electrically connected with n⁺ type semiconductor region 9b and p⁺ type semiconductor region 10b for a source or drains, and gate electrodes 8a and 8b of n channel type MISFET Qn and p channel type MISFET Qp via plug 45. Wiring 46 is not limited to tungsten but can be changed variously. For example, it may form with single body films, such as aluminum (Al) or an aluminum alloy, or the laminated metal film which formed metallic films, such as titanium (Ti) and titanium nitride (TiN), at least in one side of the up-and-down layer of these single body films. Wiring 46 can also be made into the embedded wiring (for example, embedded copper wiring) formed by the damascene method.

Next, on insulation film 43, insulation film 47 is formed so that wiring 46 may be covered. Then, the via or through hole which exposes a part of wiring 46 is formed in insulation film 47 like contact hole 44. The plug which fills a through hole, and the second layer wiring electrically connected to wiring 46 via a plug are formed like plug 45 or wiring 46. However, illustration and its explanation are omitted here. It can also be made into the embedded wiring (for example, embedded copper wiring) formed by the damascene method after second layer wiring.

Figure 18:
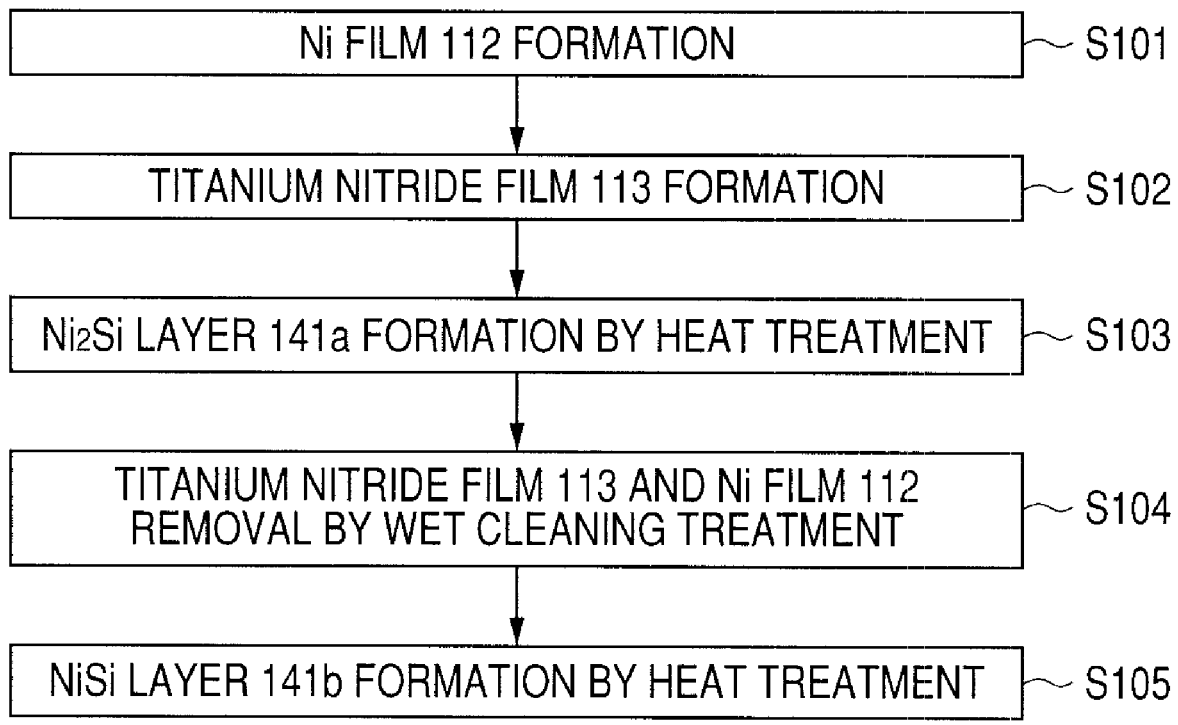
FIG. 18 is a process-flow chart showing the forming step of the NiSi layer in the semiconductor device of a comparative example.
Figure 19:
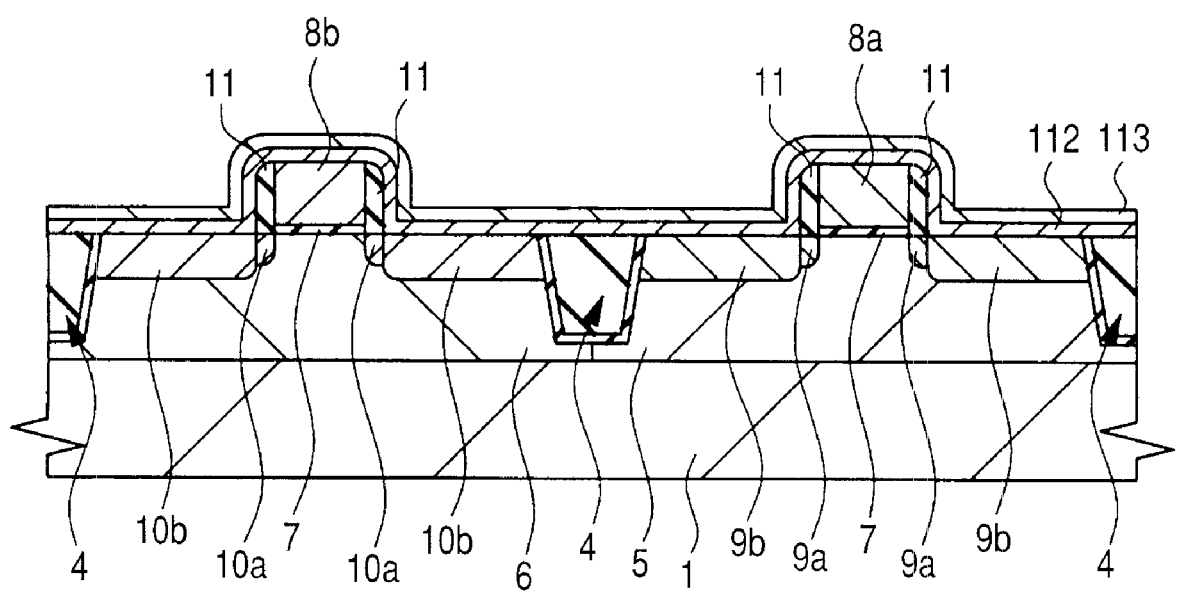
FIG. 19 is a principal part cross-sectional view in the manufacturing process of the semiconductor device of a comparative example.
Figure 20:
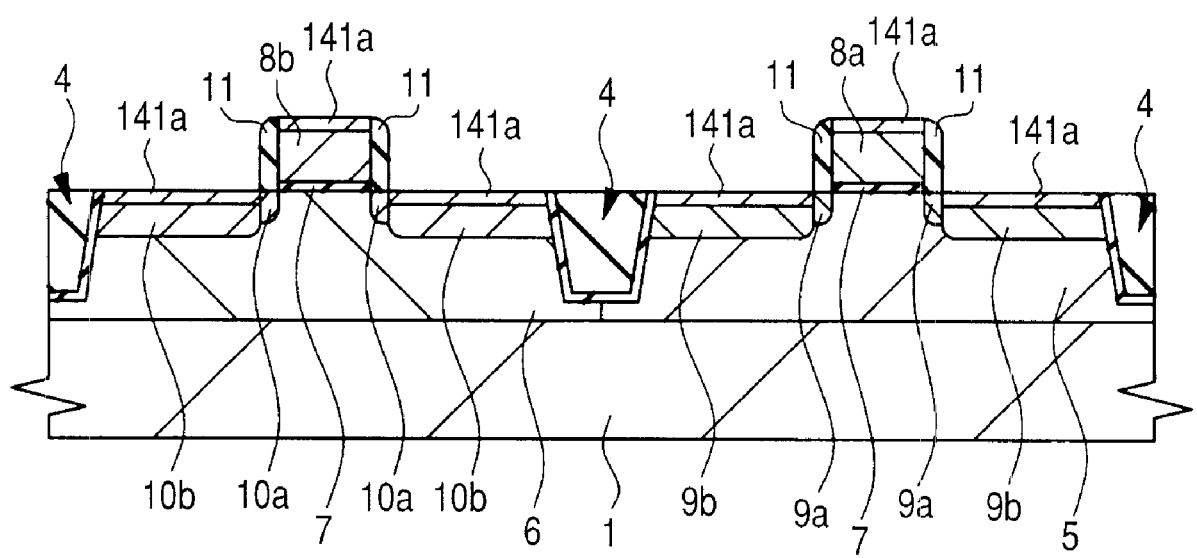
FIG. 20 is a principal part cross-sectional view in the manufacturing process of the semiconductor device of the comparative example following FIG. 19.
Figure 21:
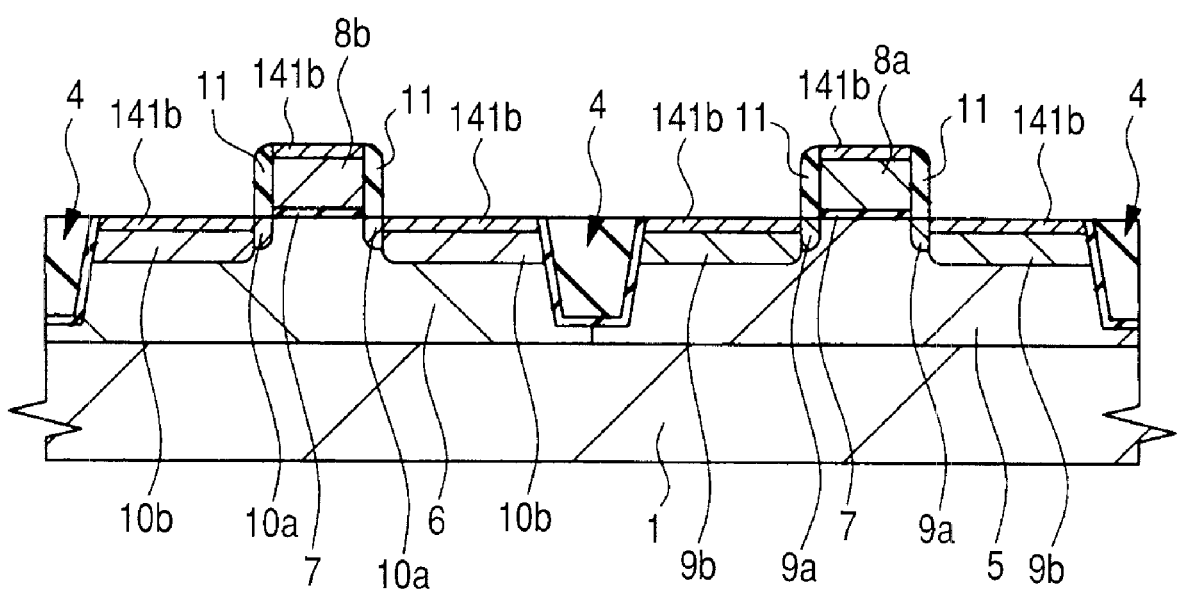
FIG. 21 is a principal part cross-sectional view in the manufacturing process of the semiconductor device of the comparative example following FIG. 20.
Figure 22:
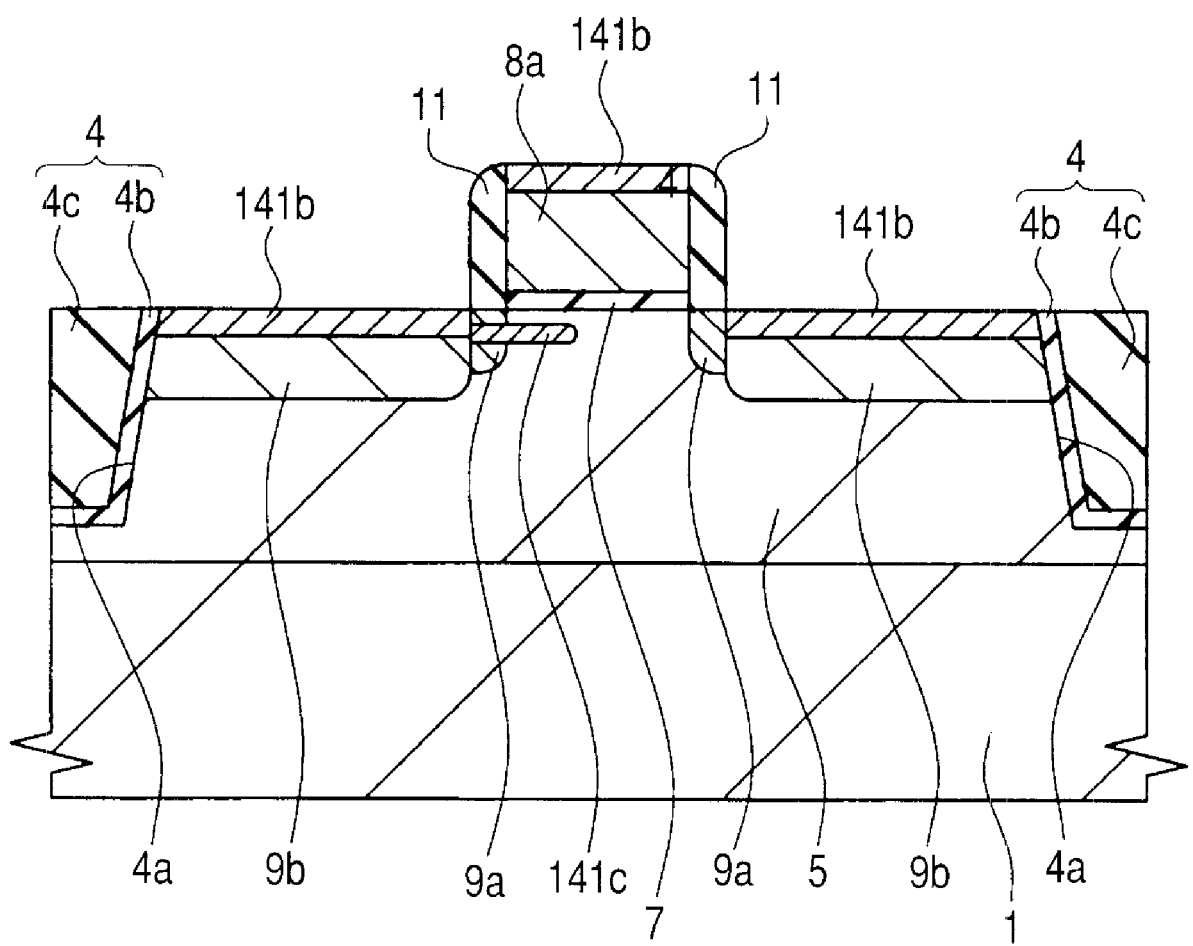
FIG. 22 is a principal part cross-sectional view in the manufacturing process of the semiconductor device of a comparative example.

Next, the effect of this embodiment is explained more to a detail. FIG. 18 is a process-flow chart showing the forming step of NiSi layer 141b in the semiconductor device of a comparative example, and corresponds to the FIG. 9 of this embodiment. FIG. 19-FIG. 21 are the principal part cross-sectional views in the manufacturing process of the semiconductor device of a comparative example. FIG. 22 is a principal part cross-sectional view in the manufacturing process of the semiconductor device of a comparative example, and the region in which n channel type MISFET of the process step corresponding to FIG. 21 was formed is shown.

The semiconductor device of the comparative example of FIG. 18-FIG. 22 is manufactured like the semiconductor device of this embodiment, except that NiSi layer 141b corresponding to metal silicide layer 41 of this embodiment is formed at a different step from this embodiment.

As shown in FIG. 19, in order to manufacture the semiconductor device of the comparative example, after the structure corresponding to the above-mentioned FIG. 7 of this embodiment is acquired, Ni film 112 (thing corresponding to metallic film 12 of this embodiment) is made to deposit (Step S101 of FIG. 18) on the main surface of semiconductor substrate 1 comprising gate electrodes 8a and 8b, n⁺ type semiconductor region 9b, and p⁺ type semiconductor region 10b upper part. And titanium nitride film 113 (thing corresponding to barrier film 13 of this embodiment) is made to deposit on Ni film 112 (Step S102 of FIG. 18). Then, (silicon which constitutes) gate electrodes 8a and 8b, n⁺ type semiconductor region 9b and p⁺ type semiconductor region 10b, and Ni film 112 are made to react selectively by heat-treating at about 320° C. for about 30 seconds by the RTA method, as shown in FIG. 20. And Ni2Si (di-nickel silicide) layer 141a is formed on the front surface of gate electrodes 8a and 8b, n⁺ type semiconductor region 9b, and p⁺ type semiconductor region 10b (Step S103 of FIG. 18).

Next, after removing titanium nitride film 113 and unreacted Ni film 112 by performing a wet cleaning treatment (Step S104 of FIG. 18), heat-treatment is done at about 550° C. and for about 30 seconds by the RTA method (Step S105 of FIG. 18). Ni₂Si layer 141a, and the silicon (Si) of gate electrodes 8a and 8b, n⁺ type semiconductor region 9b, and p⁺ type semiconductor region 10b are made to react further by heat treatment of Step S105 (the reaction of Ni₂Si+Si→2NiSi is done). And as shown in FIG. 21, NiSi layer 141b which consists of a NiSi phase of low resistivity which is more stable than a Ni₂Si phase is formed on the front surface of gate electrodes 8a and 8b, n⁺ type semiconductor region 9b, and p⁺ type semiconductor region 10b. That is, a Ni₂Si phase (Ni₂Si layer 141a) is once formed by heat treatment of previous Step S103. This is made to change to a NiSi phase (NiSi layer 141b) by heat treatment of subsequent Step S105. Then, although insulation films 42 and 43, contact hole 44, plug 45, wiring 46, and insulation film 47 are formed with the semiconductor device of a comparative example as well as this embodiment, the illustration and explanation are omitted here. Thus, the semiconductor device of a comparative example is manufactured.

In cobalt silicide formation, Si (silicon) is a diffusion seed, and cobalt silicide is formed when Si moves in Co film. On the other hand, in nickel silicide formation, Ni (nickel) is a diffusion seed, and nickel silicide is formed when Ni (nickel) moves to the silicon region side.

When the present inventor examined carefully the semiconductor device of the comparative example manufactured as mentioned above, it turned out that it is easy to do abnormal growth of NiSi₂ (nickel di-silicide) to a channel section from NiSi layer 141b. FIG. 22 has shown schematically the region in which NiSi₂ tends to do abnormal growth as NiSi₂ abnormal-growth region 141c. The generation of such a NiSi₂ abnormal-growth region 141c was confirmed by the experiments (cross-section observation of a semiconductor device, composition analysis of a section, etc.) of the present inventor. And it also turned out that increase of the leakage current between the source/drains of MISFET will be caused, and increase of the diffusion resistance of a source/drain region will be caused, when NiSi₂ is doing abnormal growth to the channel section from NiSi layer 141b.

Then, when the cause in which NiSi₂ does abnormal growth to a channel section from NiSi layer 141b was examined, it turned out that it mainly originates in the following two. The first cause is that compressive stress is working to the silicon region (silicon region which Ni may diffuse) at the time of NiSi layer 141b formation. The second cause is that oxygen (O) exists in a front surface (front surface of Ni₂Si layer 141a or NiSi layer 141b) at the time of NiSi layer 141b formation. By the first cause and the second cause, influence of the first cause is larger.

MISFET is formed in the active region of semiconductor substrate 1 specified in element isolation region 4. When heat treatment accompanied by the reaction in which Ni (nickel) diffuses (moves) is performed like the first cause in the state where compressive stress has occurred in the active region which forms MISFET, compressive stress will promote the anomalous diffusion of Ni. And it becomes easy to generate the abnormal growth of NiSi₂ from NiSi layer 141b to a channel section. This is considered to be because for the lattice spacing of Si which forms semiconductor substrate 1 (active region) to become small, it to be approaching the lattice spacing of NiSi₂ whose lattice spacing is smaller than Si, and it to become easy to generate the substitution between the lattices of Ni and Si, when compressive stress works to semiconductor substrate 1. When oxygen exists like the second cause, the defect resulting from oxygen will increase and the abnormal growth of NiSi₂ will be promoted. This is considered to be to become easy to diffuse Ni through the generated defect.

Like this embodiment, and the case of the comparative example of FIG. 18-FIG. 22, when element isolation region 4 is formed by embedding the inside of trench 4a formed in semiconductor substrate 1 with an insulation material (insulation films 4b and 4c), that is, when element isolation region 4 is formed by the STI method, compared with the case where element isolation is formed by the LOCOS method, the compressive stress which acts on the active region between element isolation regions 4 becomes large. This is for the compressive stress that the side wall of trench 4a formed in semiconductor substrate 1 pushes the active region side to act on the active region between element isolation regions 4. When the insulation material for element isolation region 4 (here insulation film 4c) which fills the inside of trench 4a especially is the insulation film (for example, silicon oxide film) formed by plasma CVD method (especially HDP-CVD method), since there is little contraction at the time of thermally tightening compared with the case of an $O_3$-TEOS oxide film (insulation film formed by the thermal CVD method) etc., the compressive stress acted by element isolation region 4 to the active region which forms MISFET becomes large.

Therefore, in the comparative example of FIG. 18-FIG. 22, heat-treatment of Step S105 is done in the state where the compressive stress resulting from element isolation region 4 is working to the active region specified in element isolation region 4, and the reaction of $Ni_2Si+Si\rightarrow 2NiSi$ is produced. Therefore, it becomes easy to generate the abnormal growth of $NiSi_2$ according to the 1st cause of the above. Moreover, since heat-treatment of Step S105 is done in the comparative example of FIG. 18-FIG. 22 where the front surface of $Ni_2Si$ layer 141a has been exposed, and the reaction of $Ni_2Si+Si\rightarrow 2NiSi$ is produced, it becomes easy to generate the abnormal growth of $NiSi_2$ according to the above second cause.

To it, in this embodiment, as mentioned above, metallic film 12 is deposited on the main surface of semiconductor substrate 1 which includes gate electrodes 8a and 8b, $n^+$ type semiconductor region 9b, and $p^+$ type semiconductor region 10b upper part as Step S1. And barrier film 13 is made to deposit on metallic film 12 as Step S2, and first heat treatment is performed as Step S3. In this embodiment, by first heat treatment of Step S3, (silicon which constitutes) gate electrodes 8a and 8b, $n^+$ type semiconductor region 9b and $p^+$ type semiconductor region 10b, and metallic film 12 are made to react selectively, and metal silicide layer 41 is formed. Let metal silicide layer 41 be a MSi (metal mono-silicide) phase instead of a $M_2Si$ (di-metal silicide) phase or $MSi_2$ (metal di-silicide) phase in the stage which performed first heat treatment of this step S3. For example, when metallic film 12 is a nickel (Ni) film, let metal silicide layer 41 be a NiSi (nickel mono-silicide) phase instead of a $Ni_2Si$ (di-nickel silicide) phase or a $NiSi_2$ (nickel di-silicide) phase in the stage which performed first heat treatment of Step S3. For this reason, at this embodiment, first heat treatment of Step S3 is performed with heat treatment temperature higher than heat treatment of Step S103 of the above-mentioned comparative example. When metallic film 12 is a nickel (Ni) film, as for the heat treatment temperature of the first heat treatment of Step S3, it is preferred that it is within the limits of 400-500° C., for example, it can make it 410° C.

Figure 23:
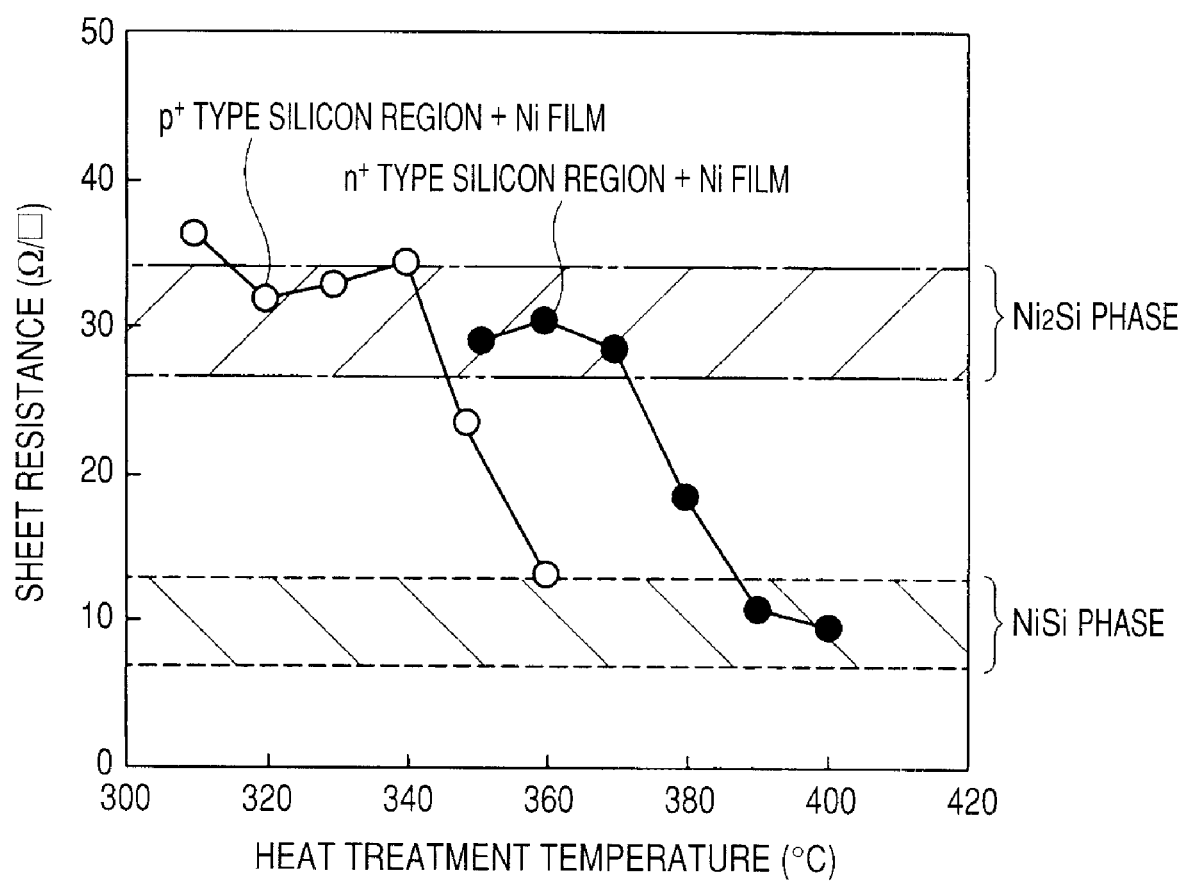
FIG. 23 is graph which shows the heat-treatment-temperature dependency of the sheet resistance of a nickel silicide layer.

FIG. 23 is the graph which shows the heat-treatment-temperature dependency of the sheet resistance of the nickel silicide layer when $p^+$ type silicon region and $n^+$ type silicon region are formed in a semiconductor substrate, Ni film, and $p^+$ type silicon region and $n^+$ type silicon region were made to react by heat treatment, the nickel silicide layer was formed, and an unreacted Ni film and a TiN film are removed after forming about 10 nm of Ni films on it and forming about 15 nm of TiN (titanium nitride) films. The horizontal axis of the graph of FIG. 23 corresponds to the heat treatment temperature for making Ni film, and $p^+$ type silicon region and $n^+$ type silicon region react by heat treatment. The vertical axis of the graph of FIG. 23 corresponds to the sheet resistance value of the nickel silicide layer formed by the heat treatment. The heat treatment which was performed in the case of FIG. 23 is about 30 seconds in RTA. A white circle ($p^+$ type silicon region +Ni film) shows the sheet resistance value of the nickel silicide layer which was made by the reaction of Ni film and $p^+$ type silicon region by heat treatment in the graph of FIG. 23. The black dot ($n^+$ type silicon region +Ni film) has shown the sheet resistance value of the nickel silicide layer which was made by the reaction of Ni film and $n^+$ type silicon region by heat treatment.

As shown in the graph of FIG. 23, as for a nickel silicide layer, the sheet resistance of a NiSi (nickel mono-silicide) phase is lower than a $Ni_2Si$ (di-nickel silicide) phase (it is about 30Ω/□ in case of a $Ni_2Si$ phase, and is about 10Ω/□ in case of a NiSi phase). As shown in the graph of FIG. 23, when heat treatment temperature is low, the nickel silicide layer formed is the $Ni_2Si$ phase of high resistance. When heat treatment temperature is made high, the nickel silicide layer formed will constitute the NiSi phase of low resistance. As compared with the nickel silicide layer (it corresponds to what was shown in the black dot of the graph of FIG. 23) in which Ni film and $n^+$ type silicon region reacted by heat treatment, and which was formed, the temperature which changes from a $Ni_2Si$ phase to a NiSi phase of the side of the nickel silicide layer (it corresponds to what was shown in the white circle of the graph of FIG. 23) in which Ni film and $p^+$ type silicon region reacted by heat treatment, and which was formed is low (that is, a NiSi phase can be formed with lower heat treatment temperature). When heat treatment temperature is more than 400° C., even if it is any of $p^+$ type silicon region and $n^+$ type silicon region, the nickel silicide layer of a NiSi phase can be formed.

In the above-mentioned comparative example, in order to form $Ni_2Si$ layer 141a by heat treatment of Step S103, a temperature lower than the temperature in which a NiSi phase is formed, for example, about 320° C., performs heat treatment of Step S103. By this embodiment, metal silicide layer 41 of the MSi phase is formed instead of a $M_2Si$ phase by first heat treatment of Step S3 to it. And, first heat treatment of Step S3 is performed with the heat treatment temperature which can form a MSi phase (temperature higher than the minimum heat treatment temperature which can form a MSi phase). For example, when metallic film 12 is a nickel (Ni) film, as shown in FIG. 23, as for the first heat treatment of Step S3, it is preferred to carry out at the temperature more than 400° C., for example, preferably it performs it by about 410° C. Hereby, metal silicide layer 41 can be made into the MSi (metal mono-silicide) phase instead of a $M_2Si$ (di-metal silicide phase) in the stage which performed first heat treatment of Step S3.

However, in the first heat treatment of Step S3, the reaction of M+Si→MSi accompanied by movement of metallic element M is produced. Since it is in the state where metallic element M tends to move, when heat treatment temperature is too high, even if barrier film 13 exists, metallic element M will be diffused (moved) superfluously. $MSi_2$ (metal di-silicide) may be formed partially. When the heat treatment temperature of the first heat treatment of Step S3 is higher than the temperature which changes from a MSi phase to $MSi_2$ phase, the metal silicide layer 41 whole will become $MSi_2$ phase. For this reason, when metallic film 12 is a nickel (Ni) film, for example, below 500° C. makes desirable heat treatment temperature of the first heat treatment of Step S3, and below 450° C. makes it more desirable. By it, it can be prevented that $MSi_2$ is formed at the time of the metal silicide layer 41 formation which consists of MSi. Therefore, as for the heat treatment temperature of the first heat treatment of Step S3, when metallic film 12 is a nickel (Ni) film, it is preferred that it is within the limits of 400-500° C.

In this embodiment, barrier film 13 is a film which makes semiconductor substrate 1 generate tensile stress. Namely, as for barrier film 13, compressive stress (in the case of the titanium nitride film formed by the sputtering method, it is the compressive stress for example, about 2 GPa (giga Pascal)) acts as film stress (a film's own stress). Semiconductor substrate 1 (active region which forms MISFET) is made to generate tensile stress by an action and reaction. In this embodiment, in order to offset the compressive stress which element isolation region 4 is making the active region of semiconductor substrate 1 generate, barrier film 13 which makes semiconductor substrate 1 generate tensile stress is formed. Therefore, it can also be considered that barrier film 13 is a stress control film (film which controls the stress of the active region of semiconductor substrate 1). A titanium nitride (TiN) film or a titanium (Ti) film is preferred as a film (here barrier film 13) which makes such a semiconductor substrate 1 generate a tensile stress.

It depends not only on a film material but on the film formation method for the direction and size of stress which barrier film 13 makes semiconductor substrate 1 generate. When barrier film 13 is a titanium nitride (TiN) film and the film is formed with plasma CVD method, barrier film 13 may turn into a film which makes semiconductor substrate 1 generate compressive stress. However, barrier film 13 can be used as the film which makes semiconductor substrate 1 generate tensile stress by forming a film by a sputtering method (PVD: Physical Vapor Deposition). On the other hand, when barrier film 13 is a titanium (Ti) film and the film is formed by a sputtering method, barrier film 13 may turn into a film which makes semiconductor substrate 1 generate compressive stress. However, barrier film 13 can be used as the film which makes semiconductor substrate 1 generate tensile stress by forming a film with plasma CVD method. For this reason, when barrier film 13 is a titanium nitride (TiN) film, forming by a sputtering method (PVD) is preferred. When barrier film 13 is a titanium (Ti) film, forming with plasma CVD method is preferred.

It depends also on film formation temperature for the direction and size of stress which barrier film 13 makes semiconductor substrate 1 generate. When barrier film 13 is a titanium nitride (TiN) film using a sputtering method (PVD), the tensile stress which barrier film 13 may make semiconductor substrate 1 generate becomes large as film formation temperature becomes low. Conversely, when film formation temperature becomes high too much, barrier film 13 may turn into a film which makes semiconductor substrate 1 generate compressive stress. For this reason, as for the film formation temperature (substrate temperature) of barrier film 13, when barrier film 13 is a titanium nitride (TiN) film using a sputtering method (PVD), it is preferred that it is less than 300° C. Hereby, barrier film 13 can be used as the film which makes semiconductor substrate 1 generate tensile stress exactly. It is also possible to make film formation temperature (substrate temperature) below room temperature by forming a cooling mechanism in a film formation apparatus.

On the other hand, the tensile stress which barrier film 13 may make semiconductor substrate 1 generate becomes large as film formation temperature becomes low, also when barrier film 13 is a titanium (Ti) film using plasma CVD method. Conversely, when film formation temperature becomes high too much, barrier film 13 may turn into a film which makes semiconductor substrate 1 generate compressive stress. When film formation temperature is too high, metallic film 12, and (silicon which constitutes) gate electrodes 8a and 8b, $n^+$ type semiconductor region 9b and $p^+$ type semiconductor region 10b may react superfluously at the time of barrier film 13 film formation. For this reason, as for the film formation temperature (substrate temperature) of barrier film 13, when barrier film 13 is a titanium (Ti) film using plasma CVD method, it is preferred that it is less than 450° C. Hereby, barrier film 13 can be used as the film which makes semiconductor substrate 1 generate tensile stress exactly. It can be suppressed or prevented that metallic film 12, and (silicon which constitutes) gate electrodes 8a and 8b, $n^+$ type semiconductor region 9b, and $p^+$ type semiconductor region 10b react superfluously at the time of barrier film 13 film formation.

Since a tantalum nitride (TaN) film or a tantalum (Ta) film can also be used as the film which makes semiconductor substrate 1 generate tensile stress, using as barrier film 13 is possible. However, when a tantalum nitride (TaN) film or a tantalum (Ta) film is used, it will be necessary to use fluoric acid (HF) in the case of the wet cleaning treatment of Step S4. It may etch to portions other than barrier film 13 and metallic film 12 at the time of wet cleaning. For this reason, as barrier film 13, it is more preferred than a tantalum nitride (TaN) film and a tantalum (Ta) film to use a titanium nitride (TiN) film or a titanium (Ti) film with easy removal by the wet cleaning treatment of Step S4.

According to the measurement which used the CBED (convergent beam electron diffraction) method, the compressive stress which element isolation region 4 formed by the STI method makes act on semiconductor substrate 1 (region near element isolation region 4 of the active regions) was about −0.035 GPa. For this reason, when the tensile stress which barrier film 13 makes semiconductor substrate 1 generate is more than 0.035 GPa (giga Pascal), it is more preferred. Hereby, the influences of the compressive stress which originated in element isolation region 4 on the occasion of the first heat treatment of Step S3 (abnormal growth of $MSi_2$ etc.) can be prevented exactly. When the tensile stress which barrier film 13 makes semiconductor substrate 1 generate is less than 2.5 GPa (giga Pascal), it will be still more desirable and film formation of barrier film 13 will become easy. Therefore, when the tensile stress which barrier film 13 makes semiconductor substrate 1 generate is about 0.035-2.5 GPa (giga Pascal), it is more preferred. However, the above-mentioned numerical value of the tensile stress which barrier film 13 makes semiconductor substrate 1 generate (the above-mentioned 0.035 GPa-2.5 GPa) is the value calculated from the amount of warp (the amount of warp in room temperature) of whole semiconductor substrate 1 and whole barrier film 13 when forming a barrier film 13 on one whole main surface of semiconductor substrate 1 single body (semiconductor substrate in the state where a structure like a gate electrode or an impurity diffused layer is not formed). Where the barrier film 13 film-formation surface side is turned upwards, when semiconductor substrate 1 warps in a convex type, tensile stress has occurred in semiconductor substrate 1.

When first heat treatment of Step S3 is performed without forming barrier film 13 on metallic film 12 unlike this embodiment, it will originate in the compressive stress by element isolation region 4 like the 1st cause of the above, and the abnormal growth of $MSi_2$ will arise from metal silicide layer 41 to a channel section at the time of the first heat treatment of Step S3. To it, where barrier film 13 which is a film which makes semiconductor substrate 1 generate tensile stress is formed on metallic film 12, first heat treatment of Step S3 is performed at this embodiment, metallic film 12 and a silicon region (gate electrodes 8a and 8b, $n^+$ type semiconductor region 9b, and $p^+$ type semiconductor region 10b) are made to react, and metal silicide layer 41 of a MSi phase is formed. Barrier film 13 which makes semiconductor substrate 1 generate tensile stress acts so that the compressive stress (compressive stress which element isolation region 4 is making act on the active region which forms MISFET) resulting from element isolation region 4 may be offset, the above first cause is suppressed or prevented. It can be suppressed or prevented that the abnormal growth of $MSi_2$ generates from metal silicide layer 41 to a channel section at the time of the first heat treatment of Step S3.

When heat treatment accompanied by the reaction which metallic element M diffuses (moves) is performed in the state where compressive stress has generated like the above first cause in the active region which forms MISFET, compressive stress will promote the anomalous diffusion of metallic element M, and it will become easy to generate the abnormal growth of $MSi_2$ to a channel section. However, in the state where tensile stress has generated in the active region which forms MISFET, even if it performs heat treatment accompanied by the reaction in which metallic element M diffuses (moves), the anomalous diffusion of metallic element M is not promoted and the abnormal growth of $MSi_2$ to a channel section is not generated. For this reason, the tensile stress which barrier film 13 makes act becomes large rather than the compressive stress resulting from element isolation region 4. Even if it performs heat treatment accompanied by the reaction in which metallic element M diffuses (moves) in the state where tensile stress is acting on the active region which forms MISFET substantially, the bad influence by tensile stress is not generated. The anomalous diffusion of metallic element M is not promoted and the abnormal growth of $MSi_2$ to a channel section is not generated. For this reason, in order to offset the compressive stress which element isolation region 4 is making the active region of semiconductor substrate 1 generate, barrier film 13 which makes semiconductor substrate 1 generate tensile stress is formed. However, the tensile stress which barrier film 13 makes act may become large rather than the compressive stress resulting from element isolation region 4, and it may be in the state where tensile stress is acting on the active region of semiconductor substrate 1 substantially.

In this embodiment, barrier film 13 is a film (it is hard to penetrate) which does not penetrate oxygen (O). That is, barrier film 13 is a film without oxygen permeability. Since barrier film 13 prevents the penetration of oxygen (O), when forming metal silicide layer 41 which consists of MSi by first heat treatment of Step S3, it can be prevented that oxygen (O) is supplied to metal silicide layer 41. The above 2nd cause can be suppressed or prevented, and it can be suppressed or prevented that the abnormal growth of $MSi_2$ from metal silicide layer 41 to a channel section generates at the time of the first heat treatment of Step S3. As barrier film 13 which does not penetrate such oxygen (O), a titanium nitride (TiN) film and a titanium (Ti) film are preferred.

Barrier film 13 is a film which cannot react easily with metallic film 12, and is a film which does not react with metallic film 12 even if it performs first heat treatment of Step S3. When barrier film 13 reacts with metallic film 12 by the first heat treatment of Step S3, formation of metal silicide layer 41 may be hampered, or composition of metal silicide layer 41 may be changed. At this embodiment, it can be prevented that metallic film 12 and barrier film 13 react by the first heat treatment of Step S3 by using barrier film 13 as the film which cannot react easily with metallic film 12. Metal silicide layer 41 can be exactly formed now by the first heat treatment of Step S3. As such a barrier film 13 that cannot react easily with metallic film 12, a titanium nitride (TiN) film and a titanium (Ti) film are preferred.

In this embodiment, as mentioned above, first heat treatment of Step S3 is performed, and metal silicide layer 41 of a MSi phase is formed. Then, barrier film 13 and unreacted metallic film 12 are removed by performing a wet cleaning treatment as Step S4. And second heat treatment is performed as Step S5. At this embodiment, metal silicide layer 41 already constitutes a MSi phase in the stage which performed first heat treatment of Step S3. Even if it performs second heat treatment of Step S5, metal silicide layer 41 is still a MSi phase. Before and after the second heat treatment of Step S5, the phase (MSi phase) of metal silicide layer 41 does not change. Unlike heat treatment of Step S105 of a comparative example, the second heat treatment of Step S5 of this embodiment is not carried out for the phase change (phase change from an $M_2Si$ phase to a MSi phase) of metal silicide layer 41, but is stabilization annealing performed for stabilization of metal silicide layer 41. Semiconductor substrate 1 is kept from becoming a temperature higher (for example, until it cutting semiconductor substrate 1 and individually separating to a semiconductor chip) than the heat treatment temperature of the second heat treatment of Step S5 till the termination of manufacture of a semiconductor device after the second heat treatment of Step S5. That is, the temperature of semiconductor substrate 1 is kept from turning into a temperature higher than the heat treatment temperature of the second heat treatment of Step S5 by the various heating steps after the second heat treatment of Step S5 (for example, step accompanied by heating of semiconductor substrate 1 like the film formation step of various insulation films and conductor films). Hereby, metallic element M which forms metal silicide layer 41 (MSi phase) can be prevented from diffusing in semiconductor substrate 1 (gate electrodes 8a and 8b, $n^+$ type semiconductor region 9b, and $p^+$ type semiconductor region 10b), and causing the characteristic fluctuation of MISFET by the heat application (for example, film formation step of various insulation films and conductor films) at the step after Step S5.

By first heat treatment of Step S3, metal silicide layer 41 already constitutes a MSi phase, and maintains metal silicide layer 41 to a MSi phase till the termination of manufacture of a semiconductor device, without making it change to other phases. Therefore, although it is also possible to omit the second heat treatment of Step S5, it is more desirable to perform second heat treatment of Step S5, since there are the stabilization effect and characteristic fluctuation preventive effect of metal silicide layer 41.

By the above-mentioned comparative example unlike this embodiment, $Ni_2Si$ layer 141a which was formed by heat treatment of Step S103 and the silicon (Si) of gate electrodes 8a and 8b, $n^+$ type semiconductor region 9b, and $p^+$ type semiconductor region 10b is made to react further by heat treatment of Step S105 (namely, doing the reaction of $Ni_2Si+Si \rightarrow 2NiSi$), and NiSi layer 141b is formed. For this reason, in the above-mentioned comparative example, heat-treatment of Step S105 is done in the state where the compressive stress resulting from element isolation region 4 is working to the active region specified in element isolation region 4, and the reaction of $Ni_2Si+Si \rightarrow 2NiSi$ accompanied by diffusion (movement) of Ni is produced. Therefore, it becomes easy to generate the abnormal growth of $NiSi_2$ according to the 1st cause of the above.

To it, in this embodiment, where the compressive stress resulting from element isolation region 4 is offset with barrier film 13, first heat treatment of Step S3 is performed, the reaction of $M+Si \rightarrow MSi$ accompanied by diffusion (movement) of metallic element M is produced, and metal silicide layer 41 which consists of a MSi phase instead of an $M_2Si$ phase is formed. It is not necessary to produce the reaction of $M_2Si+Si \rightarrow MSi$ in the second heat treatment of Step S5 performed after that. In heat treatment of Step S105 of the above-mentioned comparative example, since the reaction of $Ni_2Si+Si \rightarrow 2NiSi$ generates, Ni is greatly diffused (moved) in a silicon region. Compared with it, such a reaction ($M_2Si+Si \rightarrow 2MSi$) does not happen in the second heat treatment of Step S5 of this embodiment. Therefore, metallic element M in metal silicide layer 41 is hardly diffused (moved) in a silicon region (gate electrodes 8a and 8b, n⁺ type semiconductor region 9b, and p⁺ type semiconductor region 10b). In heat treatment with little diffusion (movement) of metallic element M, it is hard to generate the abnormal growth of $MSi_2$. Therefore, even if it performs second heat treatment of Step S5 in the state where there is no barrier film 13 and the compressive stress resulting from element isolation region 4 is working to the active region in this embodiment, it can be suppressed or prevented that the abnormal growth of $MSi_2$ from metal silicide layer 41 to a channel section generates.

Thus, at this embodiment, where the compressive stress resulting from element isolation region 4 is offset with barrier film 13, first heat treatment of Step S3 is performed. Thereby, metallic film 12, and (silicon which constitutes) gate electrodes 8a and 8b, n⁺ type semiconductor region 9b and p⁺ type semiconductor region 10b are made to react, and metal silicide layer 41 of a MSi (metal mono-silicide) phase is formed. Metal silicide layer 41 is still a MSi phase after Step S3. For this reason, first heat treatment of Step S3 with much diffusion (movement) of metallic element M is performed where the compressive stress resulting from element isolation region 4 is offset with barrier film 13. Hereby, it can be prevented that the abnormal growth of $MSi_2$ from metal silicide layer 41 to a channel section generates by first heat treatment of Step S3. And it can be prevented that the abnormal growth of $MSi_2$ from metal silicide layer 41 to a channel section generates by heat treatment after Step S3 by setting metal silicide layer 41 as MSi phase after Step S3. Therefore, in this embodiment, the abnormal growth of $MSi_2$ like $NiSi_2$ abnormal-growth region 141c shown in the above-mentioned FIG. 22 can be suppressed or prevented. This was confirmed by the experiments (cross-section observation of a semiconductor device, composition analysis of a section, etc.) of the present inventor. The increase of the leakage current between the source/drains of MISFET and the increase of the diffusion resistance of a source/drain region resulting from the abnormal growth of $MSi_2$ can be suppressed or prevented. Therefore, the performance of a semiconductor device can be improved.

Figure 24:
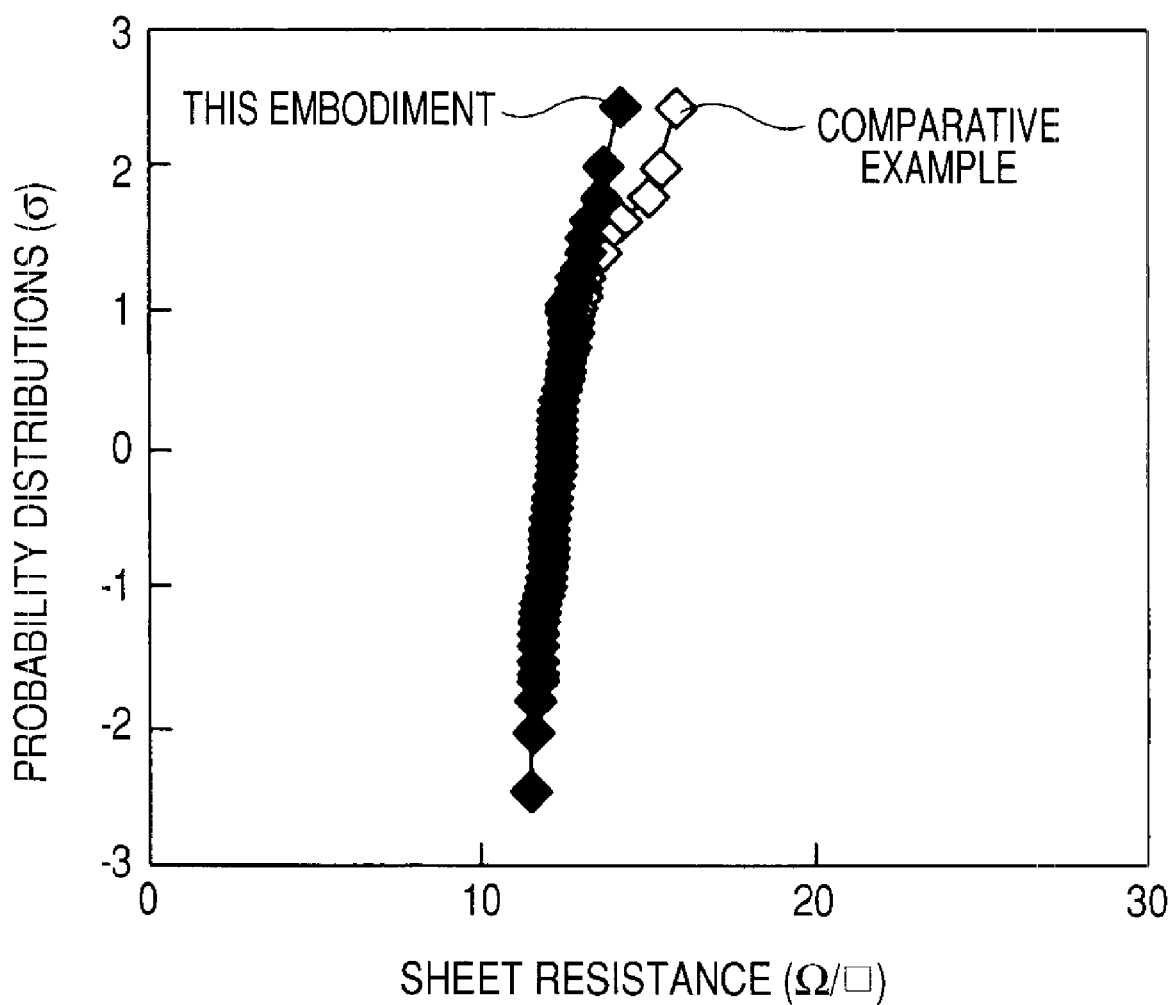
FIG. 24 is graph which shows distribution of the sheet resistance of a nickel silicide layer.

FIG. 24 is the graph which shows distribution (variation) of the sheet resistance of the nickel silicide layer (shown by the graph of FIG. 24 as "this embodiment") formed according to Steps S1-S5 of this embodiment and the nickel silicide layer (shown by the graph of FIG. 24 as a "comparative example") formed according to Steps S101-S105 of the above-mentioned comparative example. The graph of FIG. 24 is a case where Ni film is formed on p⁺ type silicon region, and a nickel silicide layer is formed. The horizontal axis of the graph of FIG. 24 corresponds to a sheet resistance value, and the vertical axis of the graph of FIG. 24 is equivalent to probability distributions.

As shown in the graph of FIG. 24, compared with the nickel silicide layer (shown by the graph of FIG. 24 as a "comparative example") formed according to Steps S101-S105 of the above-mentioned comparative example, the nickel silicide layer (shown by the graph of FIG. 24 as "this embodiment") formed according to Steps S1-S5 of this embodiment is smaller about the variation in the sheet resistance value of a nickel silicide layer. That is, compared with the nickel silicide layer formed according to Steps S101-S105 of the above-mentioned comparative example, the side of the nickel silicide layer formed according to Steps S1-S5 of this embodiment has a low ratio which becomes high resistance (high sheet resistance). A possibility that $NiSi_2$ portion of high resistance will generate in a nickel silicide layer (thing corresponding to NiSi layer 141b) in the stage in which heat-treatment of Step S105 is done, and sheet resistance will become high is high in the above-mentioned comparative example. It thinks because it is suppressed or prevented in this embodiment that $NiSi_2$ portion of high resistance generates in a nickel silicide layer (thing corresponding to metal silicide layer 41) even if it performs second heat treatment of Step S5 to it.

Thus, in this embodiment, it can be suppressed or prevented that MSi2 portion generates in metal silicide layer 41. For this reason, it not only can make resistance of metal silicide layer 41 into the resistance of the MSi phase of low resistance, but it can reduce the variation in resistance of each metal silicide layer 41. Therefore, when a plurality of MISFET is formed in semiconductor substrate 1 and metal silicide layer 41 is formed in each MISFET, resistance of metal silicide layer 41 of each MISFET can be made uniform, and change of the characteristics of MISFET can be prevented. Therefore, the performance of a semiconductor device can be improved.

When the thickness of formed metal silicide layer 41 is too thick, the increase in leakage current may be caused and it will become disadvantageous also for the microfabrication of MISFET. For this reason, in this embodiment, it is preferred to make thickness of metallic film 12 thin compared with the above-mentioned comparative example. That is, as for the thickness (deposited film thickness, thickness of a direction vertical to the main surface of semiconductor substrate 1) of metallic film 12 formed at Step S1, in this embodiment, it is preferred that it is 10 nm or less. When metallic film 12 is too thin, the thickness of metal silicide layer 41 will become thin too much, and diffusion resistance will increase. For this reason, when the thickness (deposited film thickness, thickness of a direction vertical to the main surface of semiconductor substrate 1) of metallic film 12 formed at Step S1 is 3-10 nm, it is more preferred. When it is 7-9 nm, it is still more desirable, for example, is 9 nm.

When metallic film 12 is formed in semiconductor substrate 1 front surface (front surface of gate electrodes 8a and 8b, n⁺ type semiconductor region 9b, and p⁺ type semiconductor region 10b) in the state where there is a natural-oxidation film, this natural-oxidation film acts so that it may hamper the reaction of metallic film 12 and silicon (silicon of gate electrodes 8a and 8b, n⁺ type semiconductor region 9b, and p⁺ type semiconductor region 10b). For this reason, when forming metallic film 12 in semiconductor substrate 1 front surface in the state where there is a natural-oxidation film, metallic film 12 is formed thickly and it is necessary to make metallic element M of metallic film 12 easy to diffuse in a silicon region (gate electrodes 8a and 8b, n⁺ type semiconductor region 9b, and p⁺ type semiconductor region 10b). However, in this embodiment, it is good not to make metallic film 12 much thickly as mentioned above. Therefore, in this embodiment, it is preferred to form metallic film 12 in semiconductor substrate 1 front surface (front surface of gate electrodes 8a and 8b, n⁺ type semiconductor region 9b, and p⁺ type semiconductor region 10b) in the state where there is no natural-oxidation film. For this reason, the step (it corresponds to step P2 of the above-mentioned FIG. 11) which does dry cleaning of the front surface of gate electrodes 8a and 8b of the main surface of semiconductor substrate 1, n⁺ type semiconductor region 9b, and/or p⁺ type semiconductor region 10b is performed. Then, it is preferred to perform Step S1 (deposition step of metallic film 12) and Step S2 (deposition step of barrier film 13), without exposing semiconductor substrate 1 in the atmosphere (inside of oxygen inclusion atmosphere). Hereby, metallic film 12 can be formed in the state where there is no natural-oxidation film. Even if metallic film 12 is not thick, metal silicide layer 41 which consists of MSi can be formed exactly. Therefore, it can be prevented that the thickness of metal silicide layer 41 becomes thick too much, and leakage current increases. It becomes advantageous also to the microfabrication of MISFET.

At this embodiment, as mentioned above, between the step (step P2 of the above-mentioned FIG. 11) of dry-cleaning processing, and the step (step S1 of FIG. 9, i.e., the step P2 of FIG. 11) which deposits metallic film 12 on the main surface of semiconductor substrate 1, heat treatment of 150-400° C. aiming at removing the product generated at the time of dry-cleaning disposal is performed to semiconductor substrate 1 (step P3 of FIG. 11). For this reason, the self-align reaction (reaction of M+Si→MSi by the first heat treatment of Step S3) of metallic film 12 deposited on the main surface of semiconductor substrate 1 is not prevented with the above-mentioned product and happens uniformly on the front surface of gate electrodes 8a and 8b, n⁺ type semiconductor region 9b, and p⁺ type semiconductor region 10b. Metal silicide layer 41 with small variation in electric resistance can be obtained.

Heat treatment aiming at removing the product generated at the time of dry-cleaning disposal is performed between the dry-cleaning processing step (step P2 of the above-mentioned FIG. 11), and metallic film 12 deposition step (Step S1 of FIG. 9, step P5 of FIG. 11) (step P3 of FIG. 11). Therefore, the self-align reaction of metallic film 12 is not hampered with the above-mentioned product. Even if metallic film 12 is not thick, metal silicide layer 41 which consists of MSi can be formed exactly. Therefore, it can be prevented that the thickness of metal silicide layer 41 becomes thick too much, and leakage current increases. It becomes advantageous also to the microfabrication of MISFET.

In the step which forms metal silicide layer 41 in the front surface of gate electrodes 8a and 8b, n⁺ type semiconductor region 9b, and p⁺ type semiconductor region 10b in this embodiment, the product which remains on the main surface of semiconductor substrate 1 by dry-cleaning disposal is removed by heat treatment of a temperature higher than 150° C. For this reason, the self-align reaction of the silicon (n type polycrystalline silicon which forms gate electrode 8a, p type polycrystalline silicon which forms gate electrode 8b, the single crystal silicon which forms semiconductor substrate 1 in which n⁺ type semiconductor region 9b and p⁺ type semiconductor region 10b were formed) and metallic film 12 occurs uniformly, without being prevented with a product. Metal silicide layer 41 with small variation in electric resistance can be obtained.

In this embodiment, metal silicide layer 41 is still a MSi (metal mono-silicide) phase till the termination of manufacture of a semiconductor device (for example, stage which individually separated semiconductor substrate 1 by dicing etc., and formed the semiconductor chip). This is because metal silicide layer 41 can be made into low resistance, contact resistance and the diffusion resistance of a source/drain can be reduced and the performance of a semiconductor device in which MISFET was formed can be improved by making metal silicide layer 41 into the MSi phase of low resistivity rather than a MSi₂ phase and an M₂Si phase in the manufactured semiconductor device. For this reason, in this embodiment, as first conditions, an effect is large, when applying and forming metal silicide layer 41 using metal silicide whose MSi (metal mono-silicide) phase is low resistivity than a MSi₂ (metal di-silicide) phase and an M₂Si (di-metal silicide) phase.

This embodiment can form metal silicide layer 41 of a MSi phase, suppressing or preventing the abnormal growth of MSi₂. Therefore, an effect is large, when forming metal silicide layer 41 and applying as second conditions by the silicide in which a MSi₂ (metal di-silicide) phase can exist.

This embodiment can form metal silicide layer 41 of a MSi phase, preventing unnecessary (excess) diffusion (movement) of metallic element M, and suppressing or preventing the abnormal growth of MSi₂. Therefore, an effect is large, when not Si (silicon) but metallic element M constitutes a diffusion seed at the time of metal silicide formation and this embodiment is applied as third conditions.

When these the first-3rd condition is taken into consideration, an effect is large, when metallic film 12 is a Ni (nickel) film, a nickel-Pt (nickel platinum) alloy film, a nickel-Pd (nickel palladium) alloy film, a nickel-Yb (nickel ytterbium) alloy film, or a nickel-Er (nickel erbium) alloy film and this embodiment is applied. When metallic film 12 is Ni film, Ni—Pt alloy film, a nickel-Pd alloy film, a nickel-Yb alloy film, or a nickel-Er alloy film, not Si (silicon) but metallic element M will constitute a diffusion seed at the time of metal silicide formation, a MSi₂ phase exists and the MSi phase constitutes low resistivity rather than a MSi₂ phase and an M₂Si phase. However, the problem of the abnormal growth of MSi₂ from a metal silicide layer to a channel section and the problem of resistance variation increase by formation of MSi₂ portion in a metal silicide layer generate, also when metallic films 12 are any of Ni film, Ni—Pt alloy film, a nickel-Pd alloy film, a nickel-Yb alloy film, or a nickel-Er alloy film, but when especially metallic film 12 is a Ni (nickel) film, it appears most notably. For this reason, an effect is the largest, when metallic film 12 is a Ni (nickel) film and this embodiment is applied. This is the same also about following Embodiment 2 and 3.

NiSi₂ (nickel di-silicide) abnormal-growth region 141c from NiSi layer 141b to a channel section as shown in the above-mentioned FIG. 22 is easier to be formed by n channel type MISFET than p channel type MISFET. As shown in the above-mentioned FIG. 23, in the p type silicon region, the reaction of Ni and Si is progressing at a lower temperature rather than n type silicon region. The p type silicon region is considered to be easy to diffuse Ni rather than n type silicon region. For this reason, it is easy to generate NiSi₂ abnormal-growth region 141c in p type well 5 in which Ni tends to diffuse than n type well 6. For this reason, the effect that the abnormal growth of MSi₂ from metal silicide layer 41 to a channel section when applying this embodiment can be prevented becomes larger in n channel type MISFETQn rather than p channel type MISFETQp. This is the same also about following Embodiment 2 and 3.

That the sheet resistance of a nickel silicide layer varies easily as explained in relation to the above-mentioned FIG. 24 is a case where a nickel silicide layer is formed by forming a film and heat-treating Ni film on a p type silicon region rather than the case where a nickel silicide layer is formed by forming a film and heat-treating Ni film on n type silicon region. Since p type region tends to diffuse Ni and the reaction of Ni and Si progresses easier than n type region, this is also considered to be easy to generate NiSi₂ portion of high resistance in the nickel silicide layer of the formed NiSi phase. For this reason, the effect that the variation in resistance of metal silicide layer 41 when applying this embodiment can be reduced becomes larger in p channel type MISFETQp rather than n channel type MISFETQn. This is the same also about following Embodiment 2 and 3.

This embodiment can prevent that it has a bad influence (for example, abnormal growth of $MSi_2$) at the time of metal silicide layer 41 formation, even if element isolation region 4 makes compressive stress act on semiconductor substrate 1. For this reason, an effect is large, when element isolation region 4 acts so that semiconductor substrate 1 (being the active region specified in element isolation region 4, and active region in which MISFET is formed) may be made to generate compressive stress and this embodiment is applied. This is the same also about following Embodiment 2 and 3.

When the insulator embedded in trench 4a for element isolation is formed mainly with plasma CVD method (especially HDP-CVD method), a fine film is formed in the stage where the film is formed (namely, when insulation film 4c is formed with plasma CVD method (especially HDP-CVD method)). There is little contraction at the time of the thermally tightening after film formation. For this reason, the compressive stress which element isolation region 4 makes act on semiconductor substrate 1 (active region specified in element isolation region 4) becomes large, and this compressive stress becomes easy to have influence at the time of metal silicide layer formation. This embodiment can prevent that it has a bad influence (for example, abnormal growth of $MSi_2$) at the time of metal silicide layer 41 formation, even if the compressive stress which element isolation region 4 makes act on semiconductor substrate 1 is large. For this reason, when applying to the case where the insulator (the insulator from which element isolation region 4 is formed, here insulation films 4b and 4c) embedded in trench 4a for element isolation consists of an insulation film (here insulation film 4c) formed mainly with plasma CVD method (especially HDP-CVD method), the effect of this embodiment is very large. This is the same also about following Embodiment 2 and 3.

The case where metal silicide layer 41 was formed by reacting both the semiconductor region for a source or drains ($n^+$ type semiconductor region 9b, $p^+$ type semiconductor region 10b) and a gate electrode (gate electrodes 8a and 8b), and metallic film 12 by first heat treatment of Step S3 as the best form in this embodiment was explained. However, it is effective even when, forming metal silicide layer 41 to the one side of the semiconductor region for a source or drains, and a gate electrode. Although metal silicide layer 41 is not formed for example, on a gate electrode (here gate electrodes 8a and 8b), when metal silicide layer 41 is formed on the semiconductor region for a source or drains (here $n^+$ type semiconductor region 9b, $p^+$ type semiconductor region 10b), the reduction effect of the variation in resistance of metal silicide layer 41 formed on the semiconductor region for a source or drains and the preventive effect of the abnormal growth of $MSi_2$ to a channel region can be acquired. Moreover, in the case where metal silicide layer 41 is not formed on the semiconductor region for a source or drains (here $n^+$ type semiconductor region 9b, $p^+$ type semiconductor region 10b) although metal silicide layer 41 is formed on a gate electrode (here gate electrodes 8a and 8b), the reduction effect of the variation in resistance of metal silicide layer 41 formed on the gate electrode can be acquired. That is, this embodiment can be applied when forming metal silicide layer 41 by reacting the semiconductor region for a source or drains (here $n^+$ type semiconductor region 9b, $p^+$ type semiconductor region 10b) or a gate electrode (here gate electrodes 8a and 8b), and metallic film 12 by first heat treatment of Step S3. However, when it is a case where metal silicide layer 41 is formed by reacting the semiconductor region ($n^+$ type semiconductor region 9b, $p^+$ type semiconductor region 10b) for a source or drains and metallic film 12 by first heat treatment of Step S3 at least among the semiconductor region for a source or drains, and a gate electrode, since the abnormal growth preventive effect of $MSi_2$ to a channel region can be acquired in addition to the variation reduction effect of resistance of metal silicide layer 41, an effect is larger. This is the same also about following Embodiment 2 and 3.

In this embodiment, metallic element M (for example, Ni) which forms metallic film 12 diffuses in the semiconductor region for a source or drains (here $n^+$ type semiconductor region 9b, $p^+$ type semiconductor region 10b), and metal silicide layer 41 which consists of MSi is formed. For this reason, as for semiconductor substrate 1, it is preferred to be formed with silicon (Si) inclusion material. For example, single crystal silicon, the silicon which doped the impurity, polycrystalline silicon, amorphous silicon, silicon germanium (it is $Si_xGe_{1-x}$, $0<x<1$ here), or SiC (silicon carbide) can form semiconductor substrate 1. However, it is the most desirable when it is single crystal silicon. Like an SOI (Silicon On Insulator) substrate, the thing in which the silicon (Si) inclusion material layer was formed on the insulating substrate can also be used for semiconductor substrate 1. This is the same also about following Embodiment 2 and 3.

Embodiment 2

Figure 25:
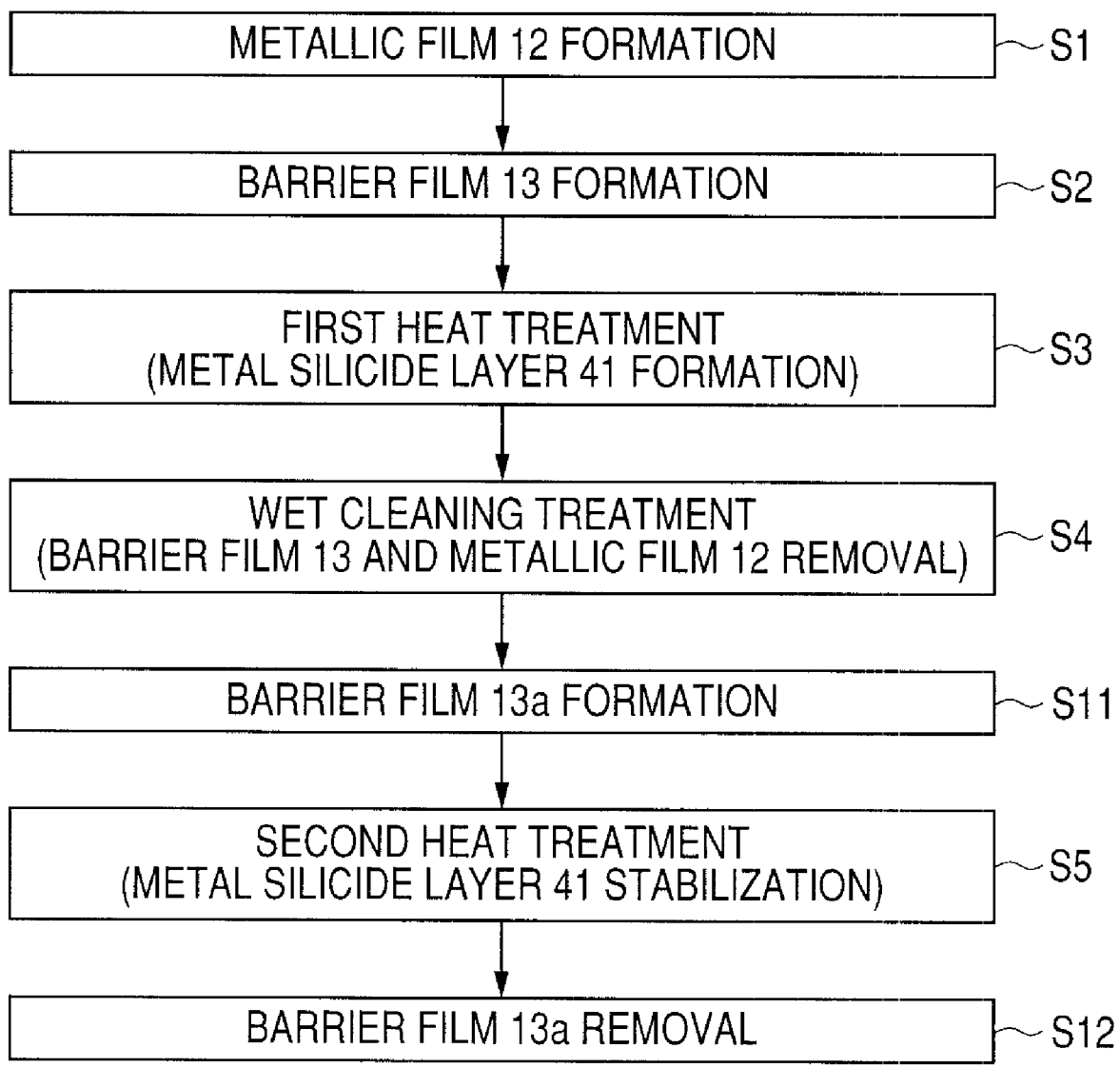
FIG. 25 is a manufacture process-flow chart showing a part of manufacturing process of the semiconductor device of other embodiments of the present invention.

FIG. 25 is a manufacture process-flow chart showing a part of manufacturing process of the semiconductor device of this embodiment, and corresponds to the FIG. 9 of above-mentioned Embodiment 1. After the structure of the above-mentioned FIG. 7 is acquired, the manufacture process flow of the step which forms a metal silicide layer (metal and semiconductor reaction layer) in the front surface of gate electrodes 8a and 8b, $n^+$ type semiconductor region 9b, and $p^+$ type semiconductor region 10b according to a salicide process is shown in FIG. 25. FIG. 26-FIG. 29 are the principal part cross-sectional views in the manufacturing process of the semiconductor device of this embodiment.

Until the step which removes barrier film 13 and unreacted metallic film 12 by performing a wet cleaning treatment at the above-mentioned step S4, the step of the manufacturing process of the semiconductor device of this embodiment is the same as that of above-mentioned Embodiment 1. Therefore, the explanation is omitted here and the step following the above-mentioned step S4 is explained.

Figure 26:
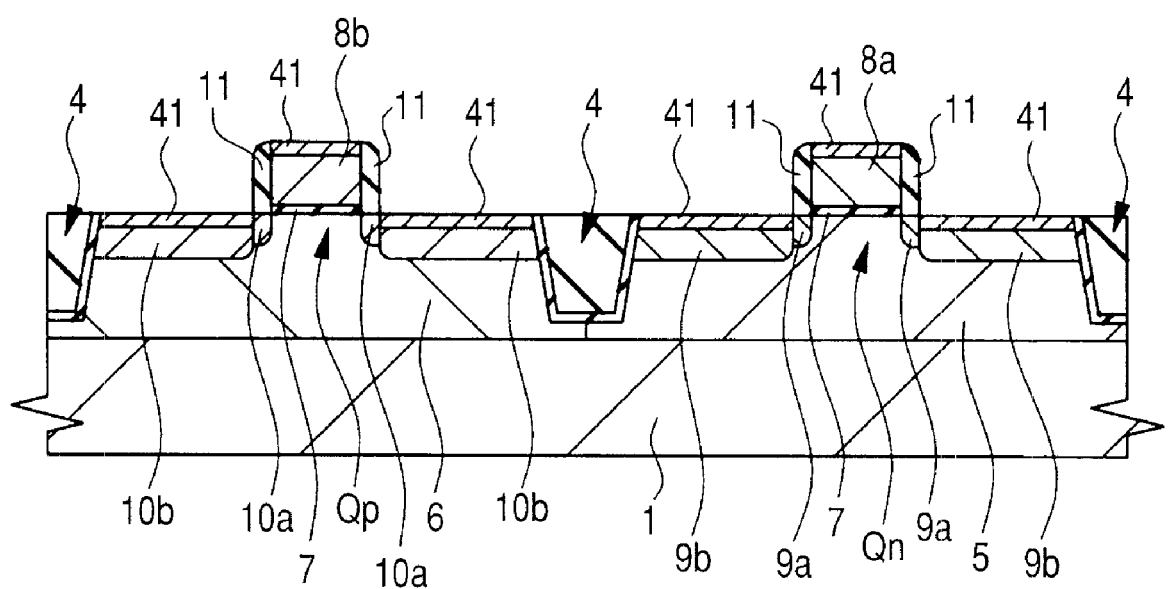
FIG. 26 is a principal part cross-sectional view in the manufacturing process of the semiconductor device of other embodiments of the present invention.
Figure 27:
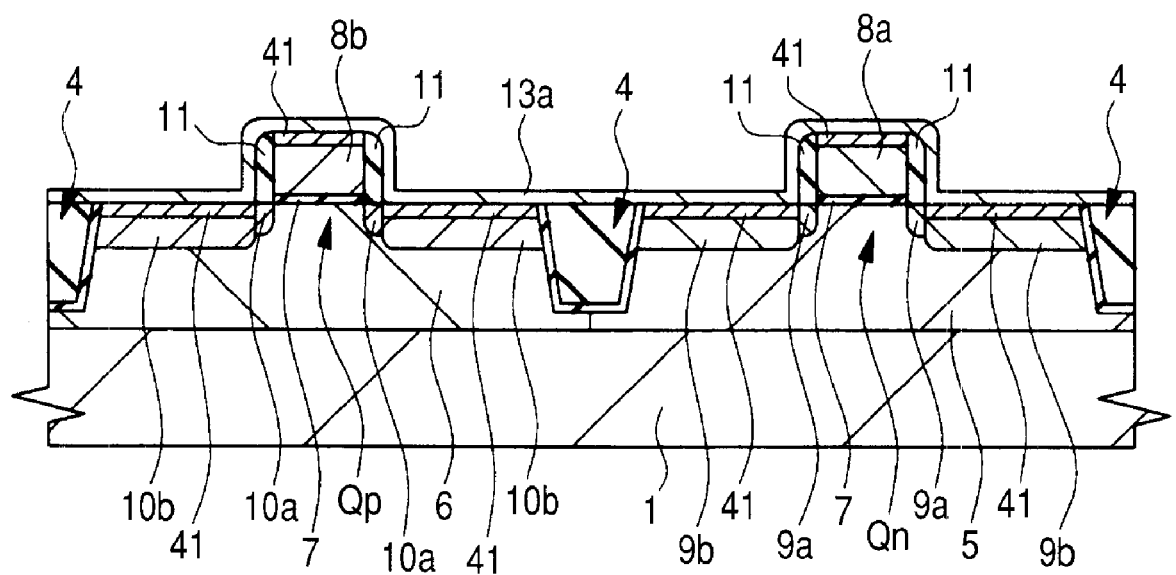
FIG. 27 is a principal part cross-sectional view in the manufacturing process of the semiconductor device following FIG. 26.

The step to the above-mentioned step S4 is performed like the above-mentioned embodiment, and the structure of the FIG. 26 which is mostly equivalent to the above-mentioned FIG. 14 is acquired. Then, as shown in FIG. 27, barrier film (a second barrier film, stress control film, a cap film) 13a is formed (deposited) on the (whole surface of the) main surface of semiconductor substrate 1 comprising metal silicide layer 41 upper part (Step S11 of FIG. 25).

Next, the same, second heat treatment of Step S5 as above-mentioned Embodiment 1 is performed. At this embodiment, second heat treatment of Step S5 is performed in the state where barrier film 13a is formed. However, about the conditions and role of the second heat treatment of Step S5, it is the same as that of above-mentioned Embodiment 1.

Therefore, also in this embodiment like above-mentioned Embodiment 1, the second heat treatment of Step S5 is not carried out for the phase change (phase change from an $M_2Si$ phase to a MSi phase) of metal silicide layer 41, but is stabilization annealing performed for stabilization of metal silicide layer 41. This embodiment also performs second heat treatment of Step S5 with heat treatment temperature higher than the heat treatment temperature of the first heat treatment of Step S3. For example, when metallic film 12 is nickel (Ni), it can be set as about 550° C. Also in this embodiment, like above-mentioned Embodiment 1, after the second heat treatment of Step S5, semiconductor substrate 1 is kept from becoming a temperature higher than the heat treatment temperature of the second heat treatment of Step S5 till the termination of manufacture of a semiconductor device (for example, semiconductor substrate 1 being cut and it individually separating to a semiconductor chip).

Figure 28:
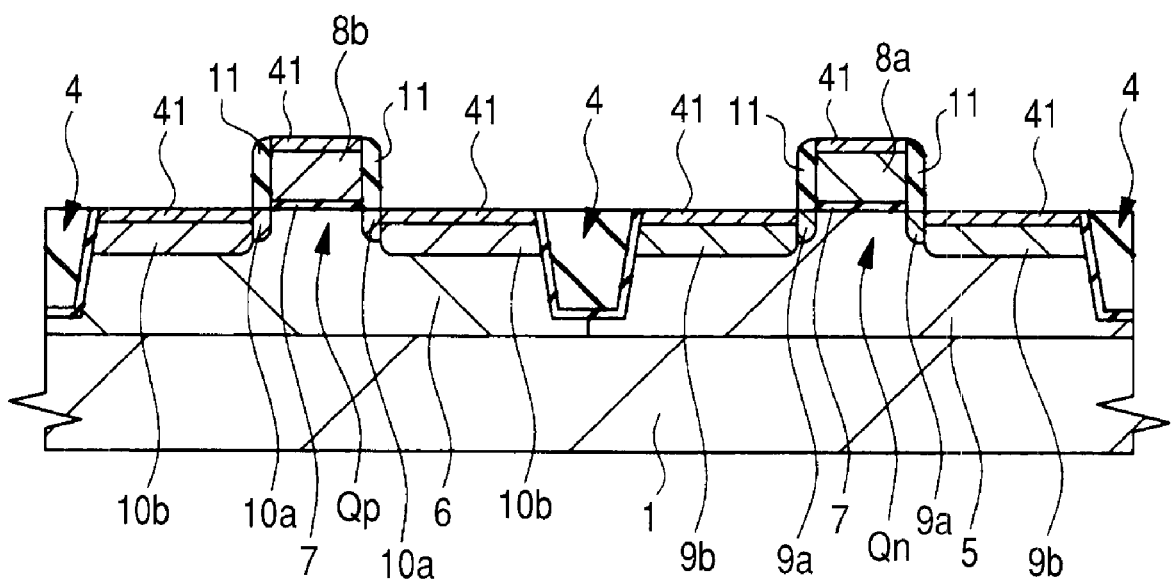
FIG. 28 is a principal part cross-sectional view in the manufacturing process of the semiconductor device following FIG. 27.

After the second heat treatment of Step S5, by performing a wet cleaning treatment etc., as shown in FIG. 28, barrier film 13a is removed (Step S12 of FIG. 25). On this occasion, metal silicide layer 41 is made to remain on the front surface of gate electrodes 8a and 8b, n$^+$ type semiconductor region 9b, and p$^+$ type semiconductor region 10b. Wet cleaning using sulfuric acid or wet cleaning using sulfuric acid and a hydrogen peroxide solution can perform the wet cleaning treatment of Step S12.

Figure 29:
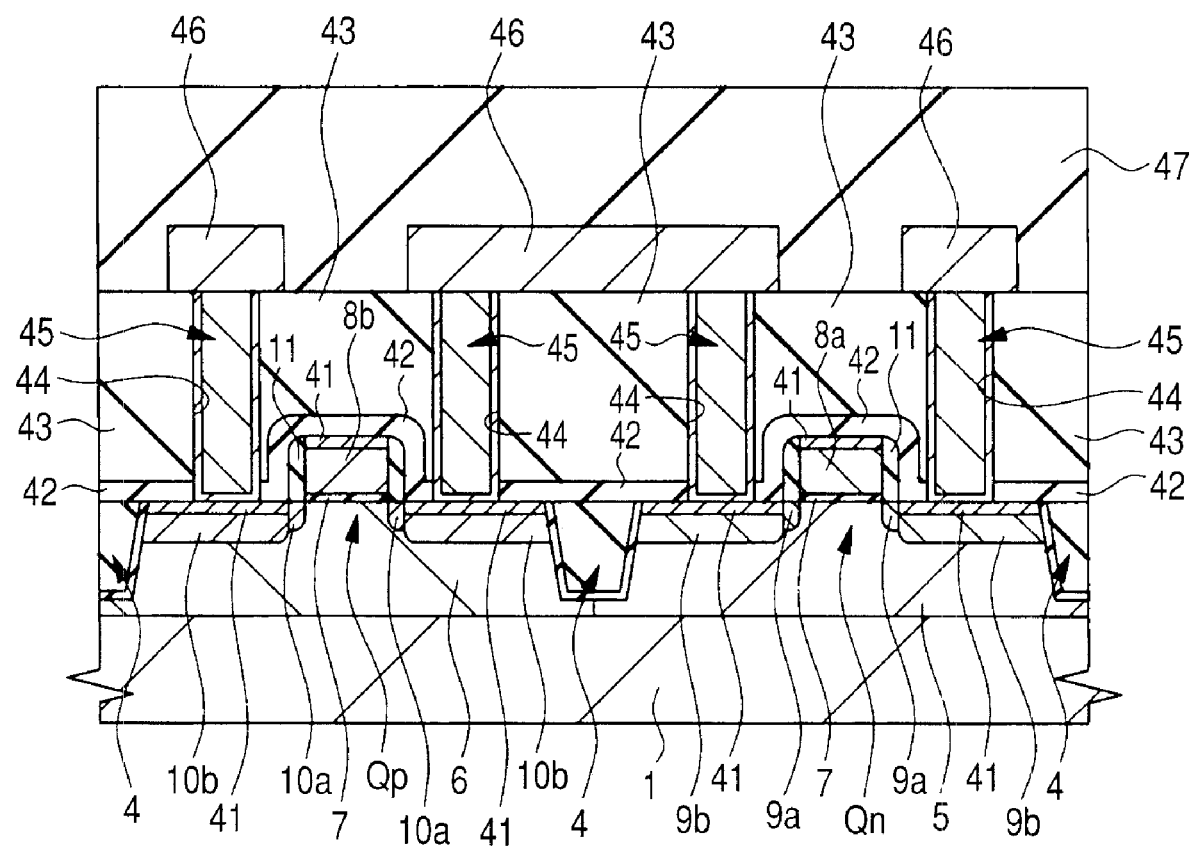
FIG. 29 is a principal part cross-sectional view in the manufacturing process of the semiconductor device following FIG. 28.

The step after it is the same as that of above-mentioned Embodiment 1. That is, like above-mentioned Embodiment 1, as shown in FIG. 29, insulation film 42 and insulation film 43 are formed. Contact hole 44 is formed in insulation films 43 and 42, and plug 45 is formed in contact hole 44. Wiring 46 and insulation film 47 are formed on insulation film 43 where plug 45 was embedded.

Barrier film 13a is a film which makes semiconductor substrate 1 generate tensile stress as well as barrier film 13. For this reason, the same film as barrier film 13 can be used as barrier film 13a. Preferably, a titanium nitride (TiN) film or a titanium (Ti) film can be used. In this embodiment, in order to offset the compressive stress which element isolation region 4 is making the active region of semiconductor substrate 1 generate, barrier film 13a which makes semiconductor substrate 1 generate tensile stress is formed. Therefore, it can also be considered that barrier film 13a is a stress control film (film which controls the stress of the active region of semiconductor substrate 1).

As above-mentioned Embodiment 1 explained barrier film 13, it depends not only on a membranous material but on a film formation method for the direction and size of stress which semiconductor substrate 1 is made to generate. Therefore, it is preferred to form by a sputtering method (PVD) for the same reason as barrier film 13, when barrier film 13a is a titanium nitride (TiN) film. When barrier film 13a is a titanium (Ti) film, forming with plasma CVD method is preferred. As for the film formation temperature (substrate temperature) of barrier film 13a, when barrier film 13a is a titanium nitride (TiN) film using a sputtering method (PVD) by the same reason as barrier film 13, it is preferred that it is less than 300° C. As for the film formation temperature (substrate temperature) of barrier film 13a, when barrier film 13a is a titanium (Ti) film using plasma CVD method, it is preferred that it is less than 450° C.

Since a tantalum nitride (TaN) film or a tantalum (Ta) film is also a film which makes semiconductor substrate 1 generate tensile stress, using as barrier film 13a is possible. However, when a tantalum nitride (TaN) film or a tantalum (Ta) film is used, it will be necessary to use fluoric acid (HF) in the case of the wet cleaning treatment of Step S12. It may etch to portions other than barrier film 13a at the time of wet cleaning. For this reason, as barrier film 13a, it is more preferred than a tantalum nitride (TaN) film and a tantalum (Ta) film to use a titanium nitride (TiN) film or a titanium (Ti) film with easy removal by the wet cleaning treatment of Step S12. The desirable range of the tensile stress of barrier film 13a is the same as that of barrier film 13.

Barrier film 13a is also a film (it is hard to penetrate) which does not penetrate oxygen (O) like barrier film 13. That is, barrier film 13a is a film without oxygen permeability. Since barrier film 13a prevents the penetration of oxygen (O), it can be prevented that oxygen (O) is supplied to metal silicide layer 41 at the time of the second heat treatment of Step S5. The 2nd cause of the above can be suppressed or prevented, and it can be suppressed or prevented still more exactly that the abnormal growth of MSi$_2$ from metal silicide layer 41 to a channel section generates at the time of the second heat treatment of Step S5. As such a barrier film 13a that does not penetrate oxygen (O), a titanium nitride (TiN) film and a titanium (Ti) film are preferred.

Barrier film 13a is a film which cannot react easily with metal silicide layer 41, and is a film which does not react with metal silicide layer 41 even if it performs second heat treatment of Step S5. When barrier film 13a reacts with metal silicide layer 41 by the second heat treatment of Step S5, composition of metal silicide layer 41 may be changed. At this embodiment, it can be prevented that metal silicide layer 41 and barrier film 13a react by the second heat treatment of Step S5 by using barrier film 13a as the film which cannot react easily with metal silicide layer 41. Metal silicide layer 41 can be exactly formed now. As such a barrier film 13a that cannot react easily with metal silicide layer 41, a titanium nitride (TiN) film and a titanium (Ti) film are preferred.

Where the compressive stress resulting from element isolation region 4 is offset with barrier film 13, first heat treatment of Step S3 is performed. The reaction of M+Si→MSi accompanied by diffusion (movement) of metallic element M is produced, and metal silicide layer 41 which consists of a MSi phase instead of an M$_2$Si phase is formed. It is not necessary to produce the reaction of M$_2$Si+Si→2MSi in the second heat treatment of Step S5. For this reason, where the front surface of metal silicide layer 41 is exposed like above-mentioned Embodiment 1, even if it performs second heat treatment of Step S5, such a reaction (reaction of M$_2$Si+Si→2MSi) does not happen in the second heat treatment of Step S5. Therefore, there is little diffusion (movement) to a silicon region (gate electrodes 8a and 8b, n$^+$ type semiconductor region 9b, and p$^+$ type semiconductor region 10b) of metallic element M in metal silicide layer 41. Since it is hard to generate the abnormal growth of MSi$_2$ in heat treatment with little diffusion (movement) of metallic element M, even if it is above-mentioned Embodiment 1 which performs second heat treatment of Step S5 in the state where there is no barrier film 13a and the compressive stress resulting from element isolation region 4 is working to the active region, it can be suppressed or prevented that the abnormal growth of MSi$_2$ from metal silicide layer 41 to a channel section generates.

However, considering the further highly-efficient-izing and the further high-reliability-izing of a semiconductor device, as for the abnormal growth of MSi$_2$ from metal silicide layer 41 to a channel section, lessening as much as possible is desirable. For this reason, in this embodiment, barrier film 13 and metallic film 12 are removed, and the front surface of metal silicide layer 41 is exposed. Then, barrier film 13a is formed on the (whole surface of the) main surface of semiconductor substrate 1 which includes metal silicide layer 41 upper part as Step S11. And where metal silicide layer 41 is covered with barrier film 13a, second heat treatment of Step S5 is performed. This barrier film 13a is a film which makes semiconductor substrate 1 generate tensile stress as well as barrier film 13. The compressive stress resulting from element isolation region 4 can be offset with barrier film 13*a*.

In this embodiment, the compressive stress (compressive stress which element isolation region 4 is making act on the active region which forms MISFET) resulting from element isolation region 4 is offset with barrier film 13*a* which makes semiconductor substrate 1 generate tensile stress. Second heat treatment of Step S5 is performed in the state, and metal silicide layer 41 is stabilized. Hereby, it can be prevented more exactly that compressive stress promotes the abnormal growth of $MSi_2$ from metal silicide layer 41 to a channel section under second heat treatment of Step S5. Therefore, in addition to the ability to acquire the effect of above-mentioned Embodiment 1, in this embodiment, the abnormal growth of $MSi_2$ from metal silicide layer 41 to a channel section under second heat treatment of Step S5 can be prevented still more exactly. Therefore, the performance and reliability of a semiconductor device can be improved further.

Embodiment 3

Figure 30:
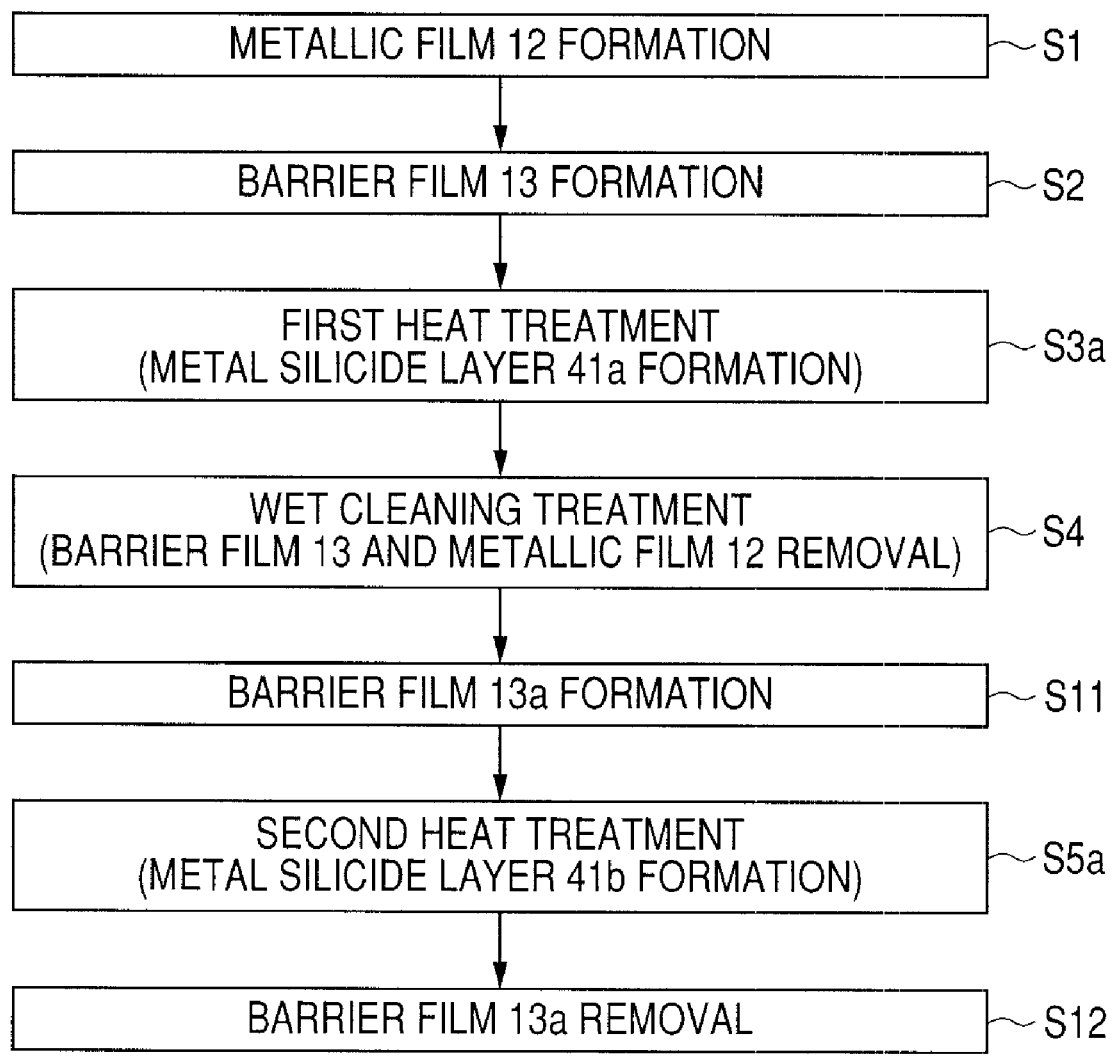
FIG. 30 is a manufacture process-flow chart showing a part of manufacturing process of the semiconductor device of other embodiments of the present invention.

FIG. 30 is a manufacture process-flow chart showing the manufacturing process of the semiconductor device of this embodiment, and corresponds to the FIG. 9 of above-mentioned Embodiment 1, or the FIG. 25 of above-mentioned Embodiment 2. The manufacture process flow of the step which forms a metal silicide layer (metal and semiconductor reaction layer) in the front surface of gate electrodes 8*a* and 8*b*, n$^+$ type semiconductor region 9*b*, and p$^+$ type semiconductor region 10*b* according to a salicide process after the structure of the above-mentioned FIG. 7 is acquired is shown in FIG. 30. FIG. 31-FIG. 34 are the principal part cross-sectional views in the manufacturing process of the semiconductor device of this embodiment.

Until the step which forms barrier film 13 at the above-mentioned step S2, the step of the manufacturing process of the semiconductor device of this embodiment is the same as that of above-mentioned Embodiment 1. Therefore, the explanation is omitted here and the step following the above-mentioned step S2 is explained.

After performing the step to the above-mentioned step S2 like above-mentioned Embodiment 1 and 2 and acquiring the structure of the above-mentioned FIG. 8, first heat treatment (annealing treatment) is performed to semiconductor substrate 1 (step S3*a* of FIG. 30). Here, first heat treatment of step S3*a* of this embodiment is performed at a temperature (for example, about 300~350° C.) lower than the heat treatment temperature of the first heat treatment of Step S3 of above-mentioned Embodiment 1 and 2. About the first heat treatment of step S3*a*, heat treatment conditions other than heat treatment temperature (atmosphere, time, etc.) can be performed like the first heat treatment of Step S3 of above Embodiment 1 and 2.

Figure 31:
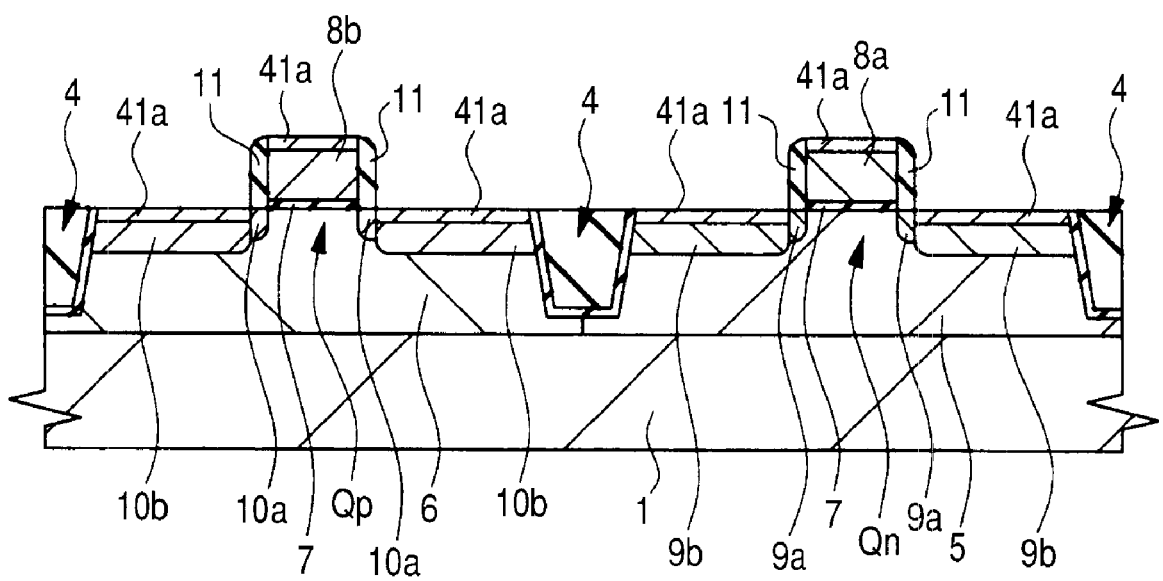
FIG. 31 is a principal part cross-sectional view in the manufacturing process of the semiconductor device of other embodiments of the present invention.

The polycrystalline silicon film which forms gate electrodes 8*a* and 8*b*, and metallic film 12 are made to react selectively by first heat treatment of step S3*a*, as shown in FIG. 31. The single crystal silicon which forms n$^+$ type semiconductor region 9*b* and p$^+$ type semiconductor region 10*b*, and metallic film 12 are made to react selectively. Metal silicide layer 41*a* which are metal and a semiconductor reaction layer is formed. In above Embodiment 1 and 2, metal silicide layer 41 which consists of MSi was formed by the first heat treatment of Step S3. However, in this embodiment, metal silicide layer 41*a* which consists of $M_2Si$ (di-metal silicide) is formed by the first heat treatment of step S3*a*.

Here, it is the same as that of above Embodiment 1 and 2 to have written M as the metallic element which forms metallic film 12.

That is, metal silicide layer 41*a* which consists of $M_2Si$ is formed on the front surface of gate electrodes 8*a* and 8*b* (upper layer portion of gate electrodes 8*a* and 8*b*) by reacting metallic element M which forms metallic film 12 and Si (silicon) of polycrystalline silicon which forms gate electrodes 8*a* and 8*b* by first heat treatment of step S3*a* in this embodiment (2M+Si→$M_2Si$). Metal silicide layer 41*a* which consists of M2Si is formed on the front surface of n$^+$ type semiconductor region 9*b* (upper layer portion of n$^+$ type semiconductor region 9*b*) by reacting metallic element M which forms metallic film 12 and Si (silicon) of n$^+$ type semiconductor region 9*b* by first heat treatment of step S3*a* (2M+Si→$M_2Si$). Metal silicide layer 41*a* which consists of $M_2Si$ is formed on the front surface of p$^+$ type semiconductor region 10*b* (upper layer portion of p$^+$ type semiconductor region 10*b*) by reacting metallic element M which forms metallic film 12 and Si (silicon) of p$^+$ type semiconductor region 10*b* by first heat treatment of step S3*a* (2M+Si→$M_2Si$).

Thus, in above Embodiment 1 and 2, metal silicide layer 41 is made into the MSi (metal mono-silicide) phase in the stage which performed first heat treatment of Step S3. However, let metal silicide layer 41*a* be an $M_2Si$ (di-metal silicide) phase at this embodiment in the stage which performed first heat treatment of step S3*a*. For example, when metallic film 12 is a nickel (Ni) film, in the stage which performed first heat treatment of step S3*a*, let metal silicide layer 41*a* be a $Ni_2Si$ (di-nickel silicide) phase.

Next, by performing the same wet cleaning treatment of Step S4 as above Embodiment 1 and 2, barrier film 13 and unreacted metallic film 12 (namely, metallic film 12 which did not react with gate electrodes 8*a* and 8*b*, n$^+$ type semiconductor region 9*b*, or p$^+$ type semiconductor region 10*b*) are removed.

Figure 32:
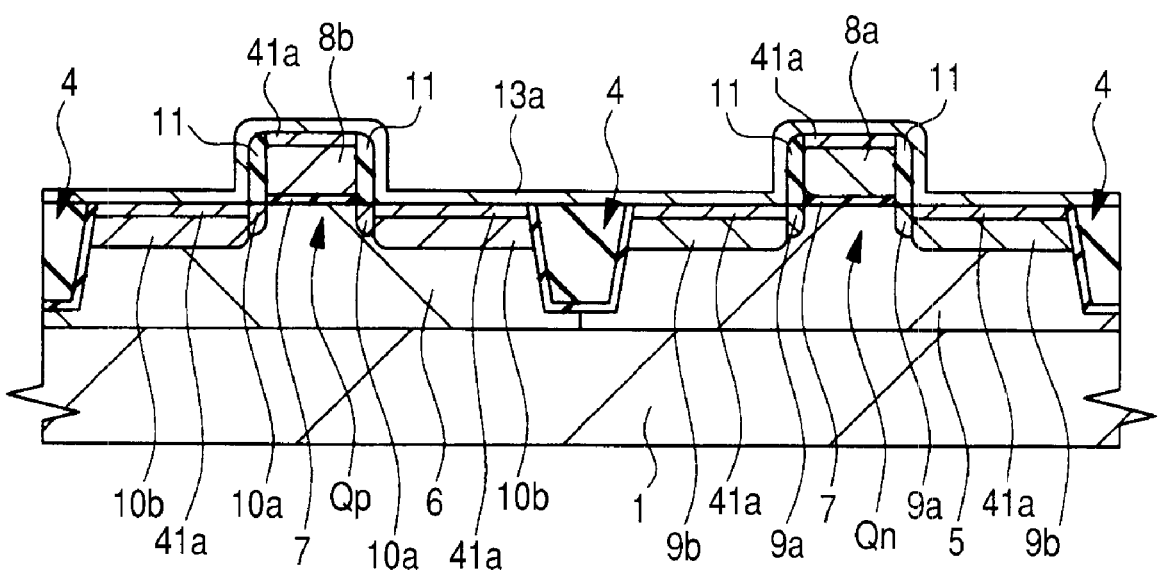
FIG. 32 is a principal part cross-sectional view in the manufacturing process of the semiconductor device following FIG. 31.

Next, like Step S11 of above-mentioned Embodiment 2, as shown in FIG. 32, barrier film 13*a* is formed (deposited) on the (whole surface of the) main surface of semiconductor substrate 1 comprising metal silicide layer 41*a* upper part. Since it is the same as that of above-mentioned Embodiment 2 about a function, material, a film formation method, etc. of barrier film 13*a*, the explanation is omitted here.

Next, second heat treatment (annealing treatment) is performed to semiconductor substrate 1 (step S5*a* of FIG. 30). It is preferred to perform second heat treatment of step S5*a* in inert gas or nitrogen gas atmosphere. Second heat treatment of this step S5*a* is performed with heat treatment temperature higher than the heat treatment temperature of the first heat treatment of the above-mentioned step S3*a*. For example, when metallic film 12 is a nickel (Ni) film, it can be set as about 550° C. For example, second heat treatment of step S5*a* can be performed by heat-treating at the temperature of about 550° C. for about 30 seconds using the RTA method to semiconductor substrate 1 in inert gas or nitrogen gas atmosphere.

Figure 33:
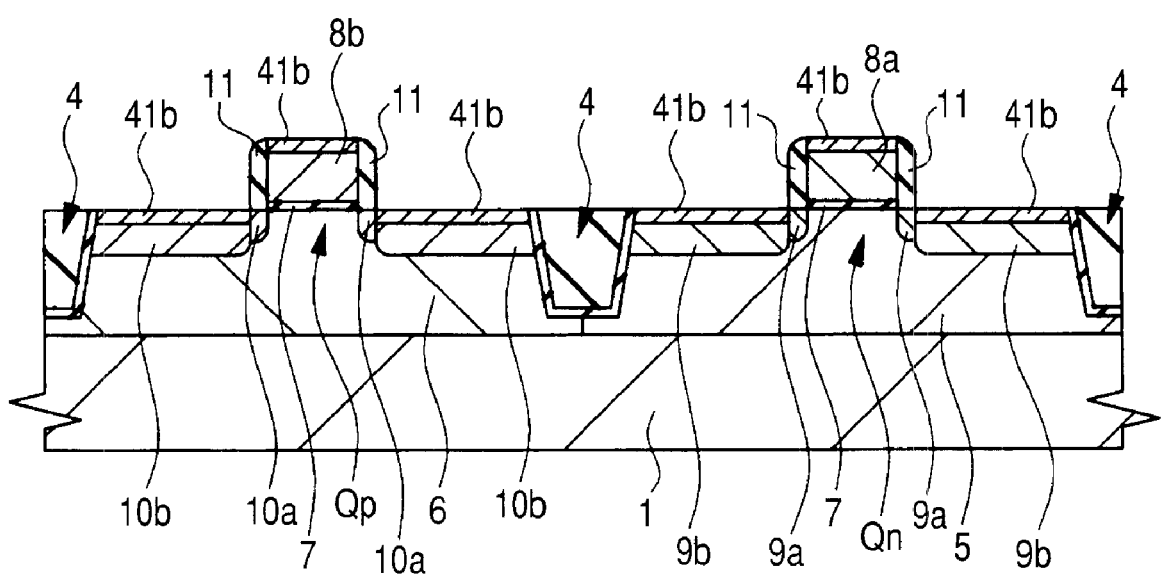
FIG. 33 is a principal part cross-sectional view in the manufacturing process of the semiconductor device following FIG. 32.

In above Embodiment 1 and 2, second heat treatment of Step S5 was performed for stabilization of metal silicide layer 41. Before and behind the second heat treatment of Step S5, metal silicide layer 41 was still a MSi phase. By this embodiment, to it, metal silicide layer 41*a* of the $M_2Si$ phase formed by heat treatment of step S3*a*, and the silicon (Si) of gate electrodes 8*a* and 8*b*, n$^+$ type semiconductor region 9*b*, and p$^+$ type semiconductor region 10*b* are made to react further by the second heat treatment of step S5a (that is, the reaction of M₂Si+Si→2MSi is done). As shown in FIG. 33, metal silicide layer 41b which consists of a MSi phase which is more stable than an M₂Si phase and is low resistivity is formed. That is, a M₂Si phase (metal silicide layer 41a) is once formed by the first heat treatment of previous step S3a. This is changed to a MSi phase (metal silicide layer 41b) by the second heat treatment of subsequent step S5a. A MSi phase is low resistivity from an M₂Si phase and a MSi₂ phase. As for step S5a and subsequent ones, metal silicide layer 41b is maintained with the MSi phase of low resistance (till the termination of manufacture of a semiconductor device, for example until it cuts semiconductor substrate 1, and individually separates to a semiconductor chip). In the manufactured semiconductor device (even the state of the semiconductor chip individually separated), metal silicide layer 41b constitutes a MSi phase of low resistance.

Thus, on the front surface (upper layer portion) of gate electrode 8a and the source/drain region (n⁺ type semiconductor region 9b) of n channel type MISFETQn, and on the front surface (upper layer portion) of gate electrode 8b and the source/drain region (p⁺ type semiconductor region 10b) of p channel type MISFETQp, metal silicide layer 41b which consists of MSi (metal mono-silicide) is formed.

Then, barrier film 13a is removed by performing the wet cleaning treatment of Step S12 etc. like above-mentioned Embodiment 2. On this occasion, metal silicide layer 41b is made to remain on the front surface of gate electrodes 8a and 8b, n⁺ type semiconductor region 9b, and p⁺ type semiconductor region 10b.

Figure 34:
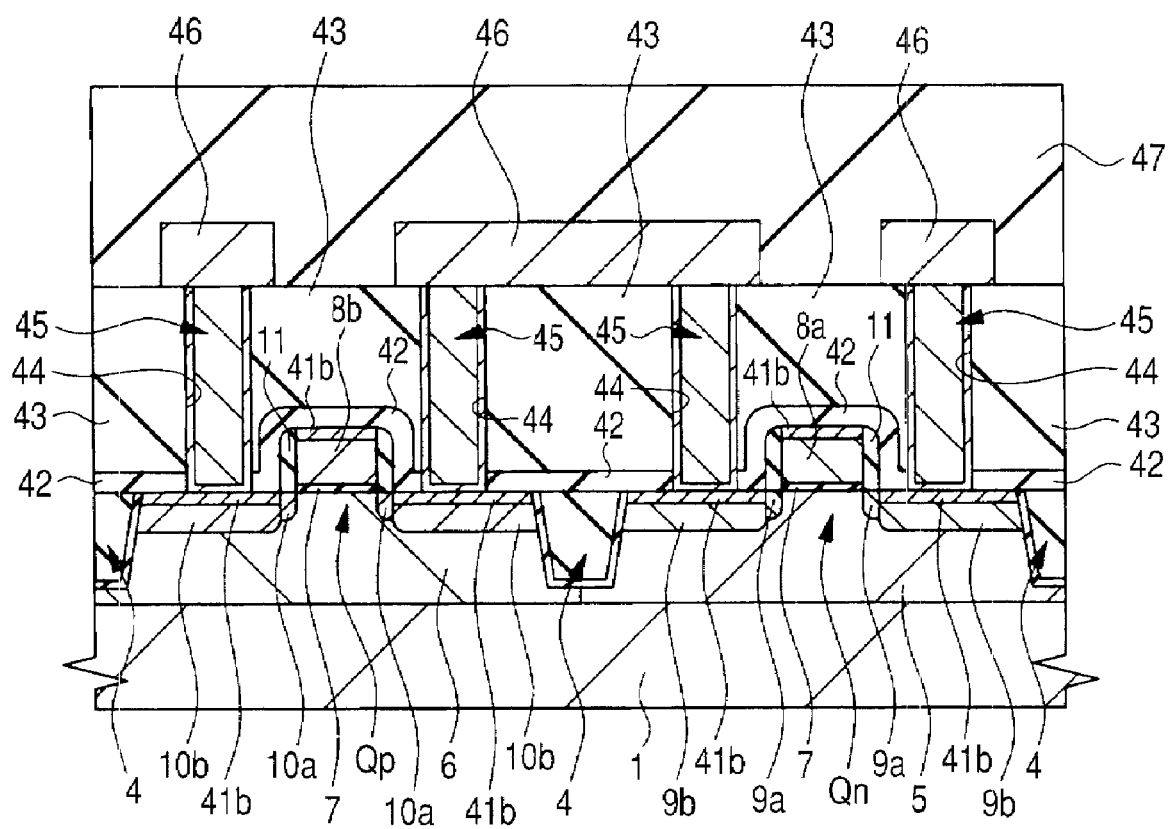
FIG. 34 is a principal part cross-sectional view in the manufacturing process of the semiconductor device following FIG. 33.

The step after it is the same as that of above Embodiment 1 and 2. That is, like above-mentioned Embodiment 1, as shown in FIG. 34, insulation film 42 and insulation film 43 are formed, and contact hole 44 is formed in insulation films 43 and 42. Plug 45 is formed in contact hole 44, and wiring 46 and insulation film 47 are formed on insulation film 43 where plug 45 was embedded.

At this embodiment, where barrier film 13 which is a film which makes semiconductor substrate 1 generate tensile stress is formed on metallic film 12, first heat treatment of step S3a is performed. Metallic film 12 and a silicon region (gate electrodes 8a and 8b, n⁺ type semiconductor region 9b, and p⁺ type semiconductor region 10b) are made to react, and metal silicide layer 41a of a M2Si phase is formed. Barrier film 13 which makes semiconductor substrate 1 generate tensile stress offsets the compressive stress (compressive stress which element isolation region 4 is making act on the active region which forms MISFET) resulting from element isolation region 4. The first cause of having explained by above-mentioned Embodiment 1 is suppressed or prevented. It can be suppressed or prevented that the abnormal growth of MSi₂ generates from metal silicide layer 41a to a channel section at the time of the first heat treatment of step S3a.

In this embodiment, since barrier film 13 prevents the penetration of oxygen (O), when forming metal silicide layer 41a which consists of MSi₂ by first heat treatment of step S3a, it can be prevented that oxygen (O) is supplied to metal silicide layer 41a. For this reason, the second cause of having explained by above-mentioned Embodiment 1 is suppressed or prevented. It can be suppressed or prevented that the abnormal growth of MSi₂ from metal silicide layer 41a to a channel section generates at the time of the first heat treatment of step S3a.

In this embodiment, by second heat treatment of step S5a, the reaction of M₂Si+Si→2MSi is produced and let metal silicide layer 41a of an M₂Si phase be metal silicide layer 41b of a MSi phase. For this reason, the diffusion (movement) to the silicon region (gate electrodes 8a and 8b, n⁺ type semiconductor region 9b, and p⁺ type semiconductor region 10b) of metallic element M in metal silicide layer 41a is large at the time of the second heat treatment of step S5a.

However, in this embodiment, barrier film 13a which is a film which makes semiconductor substrate 1 generate tensile stress is formed on the (whole surface of the) main surface of semiconductor substrate 1 comprising metal silicide layer 41a upper part. Second heat treatment of step S5a is performed, and metal silicide layer 41a and a silicon region (gate electrodes 8a and 8b, n⁺ type semiconductor region 9b, and p⁺ type semiconductor region 10b) are made to react in the state. And metal silicide layer 41b of a MSi phase is formed. For this reason, barrier film 13a which makes semiconductor substrate 1 generate tensile stress offsets the compressive stress (compressive stress which element isolation region 4 is making act on the active region which forms MISFET) resulting from element isolation region 4. The first cause of having explained by above-mentioned Embodiment 1 is suppressed or prevented. It can be suppressed or prevented that the abnormal growth of MSi₂ generates from metal silicide layer 41b to a channel section at the time of the second heat treatment of step S5a.

In the foregoing, the present invention accomplished by the present inventors is concretely explained based on above embodiments, but the present invention is not limited by the above embodiments, but variations and modifications may be made, of course, in various ways in the limit that does not deviate from the gist of the invention.

The present invention is effective in the application to the manufacturing technology of the semiconductor device provided with the semiconductor element which has a metal silicide layer.

What is claimed is:

1. A manufacturing method of a semiconductor device, comprising the steps of:
    (a) preparing a semiconductor substrate;
    (b) forming a trench for element isolation in the semiconductor substrate;
    (c) forming an element isolation region which includes an insulator embedded in the trench for element isolation;
    (d) forming a gate insulating film over the semiconductor substrate;
    (e) forming a gate electrode over the gate insulating film;
    (f) forming a semiconductor region for a source or a drain in the semiconductor substrate;
    (g) forming a metallic film over the gate electrode, and the semiconductor substrate including the semiconductor region upper part;
    (h) forming a first barrier film over the metallic film;
    (i) forming a metal silicide layer by making the metallic film, and the gate electrode or the semiconductor region react by performing first heat treatment; and
    (j) after the step (i), removing the first barrier film and the metallic film, and leaving the metal silicide layer over the gate electrode or the semiconductor region;
    wherein
    the first barrier film is a film which makes the semiconductor substrate generate tensile stress;
    at the step (i) the metal silicide layer which includes monosilicide of metallic element which forms the metallic film is formed,
    the metallic film is a Ni film, and
    the first heat treatment of the step (i) is performed at between 400° C. and less than 500° C.

2. A manufacturing method of a semiconductor device according to claim 1, wherein
the first barrier film is a film which does not react with the metallic film even if the first heat treatment is performed.

3. A manufacturing method of a semiconductor device according to claim 1, wherein
the first barrier film is a titanium film or a titanium nitride film.

4. A manufacturing method of a semiconductor device according to claim 3, wherein
at the step (h), when the first barrier film is a titanium film, the titanium film is formed with plasma CVD method, and when the first barrier film is a titanium nitride film, the titanium nitride film is formed by a sputtering method.

5. A manufacturing method of a semiconductor device according to claim 4, wherein
at the step (h), when the first barrier film is a titanium film, the titanium film is formed with plasma CVD method at substrate temperature 450° C. or below, and when the first barrier film is a titanium nitride film, the titanium nitride film is formed by a sputtering method at substrate temperature 300° C. or below.

6. A manufacturing method of a semiconductor device according to claim 1, wherein
a thickness of the metallic film formed at the step (g) is 10 nm or less.

7. A manufacturing method of a semiconductor device according to claim 1, before the step
(g), further comprising a step of:
(g1) doing dry cleaning of the gate electrode of a main surface of the semiconductor substrate, or a front surface of the semiconductor region;
wherein the step (g) and the step (h) are performed without exposing the semiconductor substrate in an atmosphere after the step (g1).

8. A manufacturing method of a semiconductor device according to claim 1, after the step (j), further comprising the steps of:
(k) performing second heat treatment whose heat treatment temperature is higher than the first heat treatment; and
(l) after the step (k), forming an insulation film over the semiconductor substrate including the metal silicide layer upper part.

9. A manufacturing method of a semiconductor device according to claim 8, after the step (j) and before the step (k), further comprising a step of:
(j1) forming a second barrier film over the semiconductor substrate including the metal silicide layer upper part; and
after the step (k) and before the step (l), further comprising a step of:
(k1) removing the second barrier film;
wherein the second barrier film is a film which makes the semiconductor substrate generate tensile stress.

10. A manufacturing method of a semiconductor device according to claim 9, wherein
the second barrier film is a film which does not react with the metal silicide layer even if the second heat treatment is performed.

11. A manufacturing method of a semiconductor device according to claim 8, wherein
a side of a mono-silicide phase of the metallic element which forms the metallic film is low resistivity rather than a di-silicide phase of the metallic element which forms the metallic film; and
also even after the second heat treatment of the step (k), the metal silicide layer is still a mono-silicide phase of the metallic element.

12. A manufacturing method of a semiconductor device according to claim 1, wherein
the element isolation region formed at the step (c) acts so that the semiconductor substrate may be made to generate compressive stress.

13. A manufacturing method of a semiconductor device according to claim 1, wherein
the insulator embedded in the trench for element isolation at the step (c) mainly includes an insulation film formed with plasma CVD method.

14. A manufacturing method of a semiconductor device, comprising the steps of:
(a) preparing a semiconductor substrate;
(b) forming a trench for element isolation in the semiconductor substrate;
(c) forming an element isolation region which includes an insulator embedded in the trench for element isolation;
(d) forming a gate insulating film over the semiconductor substrate;
(e) forming a gate electrode over the gate insulating film;
(f) forming a semiconductor region for a source or a drain in the semiconductor substrate;
(g) forming a metallic film over the gate electrode, and the semiconductor substrate including the semiconductor region upper part;
(h) forming a first barrier film over the metallic film;
(i) forming a metal silicide layer by making the metallic film, and the gate electrode or the semiconductor region react by performing first heat treatment;
(j) after the step (i), removing the first barrier film and the metallic film, and leaving the metal silicide layer over the gate electrode or the semiconductor region;
(k) after the step (j), forming a second barrier film over the semiconductor substrate including the metal silicide layer upper part;
(l) after the step (k), performing second heat treatment whose heat treatment temperature is higher than the first heat treatment;
(m) after the step (l), removing the second barrier film; and
(n) after the step (m), forming an insulation film over the semiconductor substrate including the metal silicide layer upper part;
wherein
the first barrier film and the second barrier film are films which make the semiconductor substrate generate tensile stress; and
the metal silicide layer includes mono-silicide of metallic element which forms the metallic film after the second heat treatment.

15. A manufacturing method of a semiconductor device according to claim 14, wherein
the first barrier film is a film which does not react with the metallic film even if the first heat treatment is performed; and the second barrier film is a film which does not react with the metal silicide layer even if the second heat treatment is performed.

16. A manufacturing method of a semiconductor device according to claim 14, wherein
the element isolation region formed at the step (c) acts so that the semiconductor substrate may be made to generate compressive stress.

17. A manufacturing method of a semiconductor device according to claim 14, wherein
the metallic film is a Ni film, a Ni—Pt alloy film, a Ni—Pd alloy film, a Ni—Yb alloy film, or a Ni—Er alloy film.

* * * * *